(12) United States Patent
Ishizu

(10) Patent No.: US 10,096,631 B2
(45) Date of Patent: Oct. 9, 2018

(54) SIGNAL PROCESSING CIRCUIT AND SEMICONDUCTOR DEVICE INCLUDING THE SIGNAL PROCESSING CIRCUIT

(71) Applicant: SEMICONDUCTOR ENERGY LABORATORY CO., LTD., Atsugi-shi, Kanagawa-ken (JP)

(72) Inventor: Takahiko Ishizu, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/363,148

(22) Filed: Nov. 29, 2016

(65) Prior Publication Data

US 2017/0154909 A1   Jun. 1, 2017

(30) Foreign Application Priority Data

Nov. 30, 2015   (JP) ................................. 2015-233147

(51) Int. Cl.
*H01L 27/146*   (2006.01)
*H01L 29/786*   (2006.01)
(Continued)

(52) U.S. Cl.
CPC ..... *H01L 27/14612* (2013.01); *G09G 3/3225* (2013.01); *G09G 3/3648* (2013.01);
(Continued)

(58) Field of Classification Search
CPC ........... H01L 27/14612; H01L 27/1225; H01L 27/124; H01L 29/24; H01L 29/78648; H01L 29/7869; G09G 3/3225; G09G 3/3648; G09G 2300/0809; G11C 8/10; H03K 17/302; H03K 2017/6878; H04N 5/378
(Continued)

(56) References Cited

U.S. PATENT DOCUMENTS

| | | | | |
|---|---|---|---|---|
| 7,230,601 | B2 * | 6/2007 | Yamazaki | ............ G09G 3/3266 345/100 |
| 9,685,500 | B2 * | 6/2017 | Yamazaki | ............. H01L 29/045 |

(Continued)

FOREIGN PATENT DOCUMENTS

JP          2011-187950 A       9/2011

*Primary Examiner* — Pritham Prabhakher
(74) *Attorney, Agent, or Firm* — Nixon Peabody LLP; Jeffrey L. Costellia

(57) ABSTRACT

Provided is a semiconductor device that can operate stably. All transistors included in the semiconductor device are transistors each of which contains an oxide semiconductor in a channel formation region. The transistor includes a front gate and a back gate. The threshold voltage of the transistor can be shifted in the positive direction or the negative direction depending on a potential applied to the back gate. To make the transistor in a conducting state, the threshold voltage is shifted in the negative direction to increase the amount of current flowing in the transistor, and to make the transistor in a non-conducting state, the threshold voltage is shifted in the positive direction to decrease the amount of current flowing in the transistor. A circuit of the semiconductor device that utilizes this effect and includes transistors all having the same polarity is formed.

22 Claims, 50 Drawing Sheets

(51) Int. Cl.
- *H01L 27/12* (2006.01)
- *H01L 29/24* (2006.01)
- *G11C 8/10* (2006.01)
- *H03K 17/30* (2006.01)
- *G09G 3/36* (2006.01)
- *G09G 3/32* (2016.01)
- *H04N 5/378* (2011.01)
- *G09G 3/3225* (2016.01)
- *H03K 17/687* (2006.01)

(52) U.S. Cl.
CPC .............. *G11C 8/10* (2013.01); *H01L 27/124* (2013.01); *H01L 27/1225* (2013.01); *H01L 29/24* (2013.01); *H01L 29/7869* (2013.01); *H01L 29/78648* (2013.01); *H03K 17/302* (2013.01); *H04N 5/378* (2013.01); *G09G 2300/0809* (2013.01); *H03K 2017/6878* (2013.01)

(58) Field of Classification Search
USPC .......................................................... 348/302
See application file for complete search history.

(56) References Cited

U.S. PATENT DOCUMENTS

| | | | |
|---|---|---|---|
| 9,721,959 B2 * | 8/2017 | Takahashi | H01L 27/1156 |
| 9,847,406 B2 * | 12/2017 | Miyairi | H01L 29/66969 |
| 9,905,311 B2 * | 2/2018 | Ogawa | G11C 19/28 |
| 9,905,598 B2 * | 2/2018 | Yamazaki | H01L 27/14629 |
| 9,972,644 B2 * | 5/2018 | Hsu | H01L 27/1237 |
| 2002/0158829 A1 | 10/2002 | Yamazaki et al. | |
| 2004/0240305 A1 | 12/2004 | Kato | |
| 2005/0007330 A1 | 1/2005 | Miyata et al. | |
| 2005/0035981 A1 | 2/2005 | Ozaki | |
| 2005/0047266 A1 * | 3/2005 | Shionoiri | G11C 7/1078 365/104 |
| 2005/0128112 A1 | 6/2005 | Miyata et al. | |
| 2005/0135181 A1 | 6/2005 | Shionoiri et al. | |
| 2005/0140015 A1 | 6/2005 | Shionoiri et al. | |
| 2008/0016367 A1 | 1/2008 | Tanada et al. | |
| 2008/0151660 A1 | 6/2008 | Inoue et al. | |
| 2010/0163631 A1 | 7/2010 | Ishii et al. | |
| 2011/0063262 A1 | 3/2011 | Umezaki et al. | |
| 2011/0128461 A1 | 6/2011 | Koyama et al. | |
| 2011/0199807 A1 | 8/2011 | Saito et al. | |
| 2012/0063205 A1 | 3/2012 | Matsuzaki et al. | |
| 2012/0155150 A1 | 6/2012 | Nagatsuka et al. | |
| 2014/0292741 A1 | 10/2014 | Yamazaki et al. | |
| 2015/0060847 A1 * | 3/2015 | Miyake | H01L 29/788 257/43 |
| 2015/0340076 A1 | 11/2015 | Yakubo et al. | |
| 2016/0006433 A1 | 1/2016 | Ishizu et al. | |
| 2016/0099258 A1 * | 4/2016 | Yoneda | H01L 27/124 257/43 |
| 2016/0117020 A1 | 4/2016 | Takemura | |
| 2016/0232956 A1 | 8/2016 | Ishizu et al. | |
| 2016/0295152 A1 | 10/2016 | Kurokawa | |
| 2016/0301932 A1 | 10/2016 | Kurokawa | |
| 2016/0379564 A1 | 12/2016 | Inoue et al. | |

* cited by examiner

100

301

302

303

304

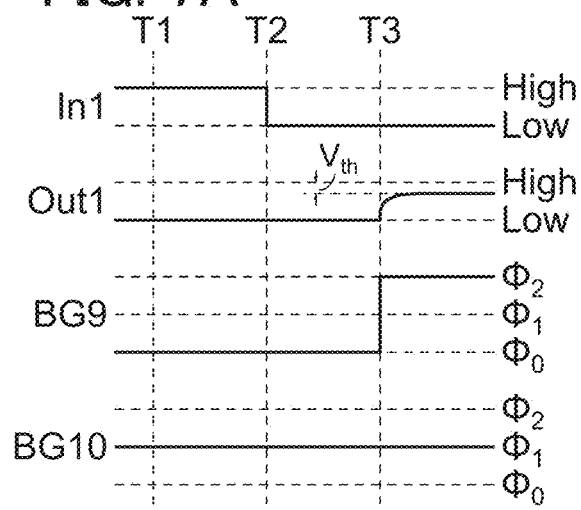
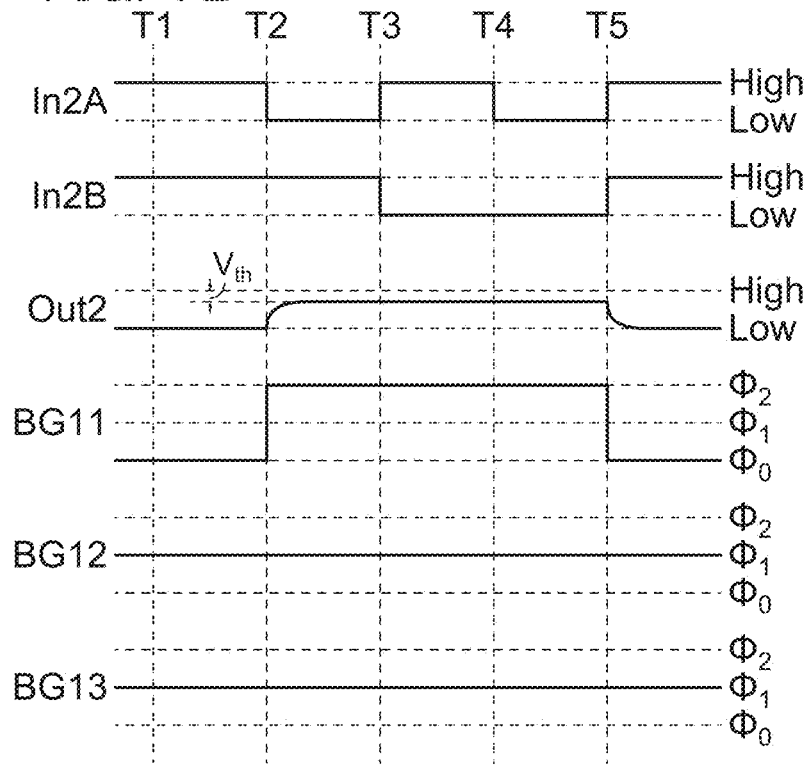

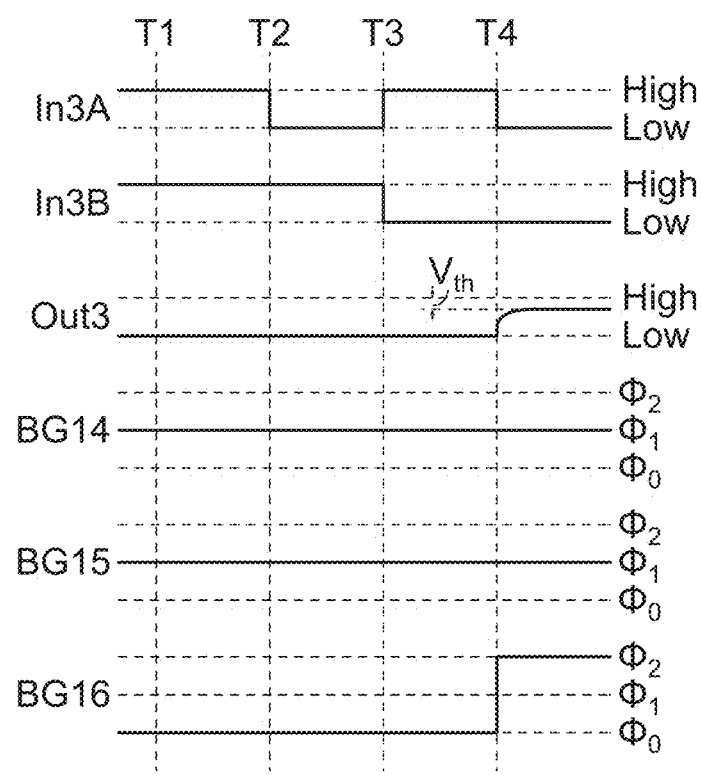

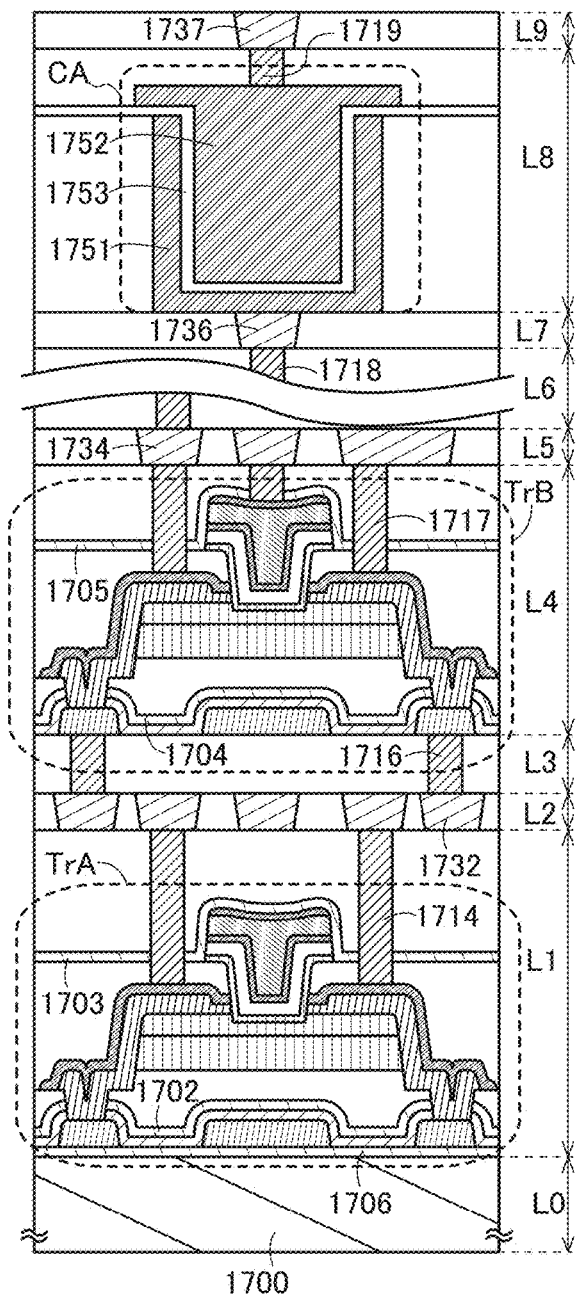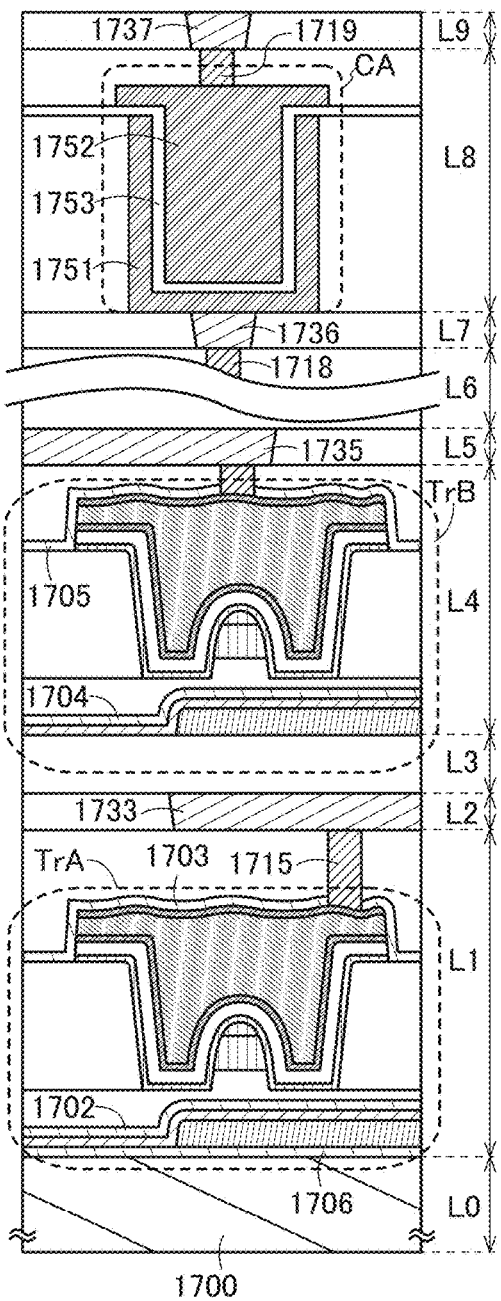

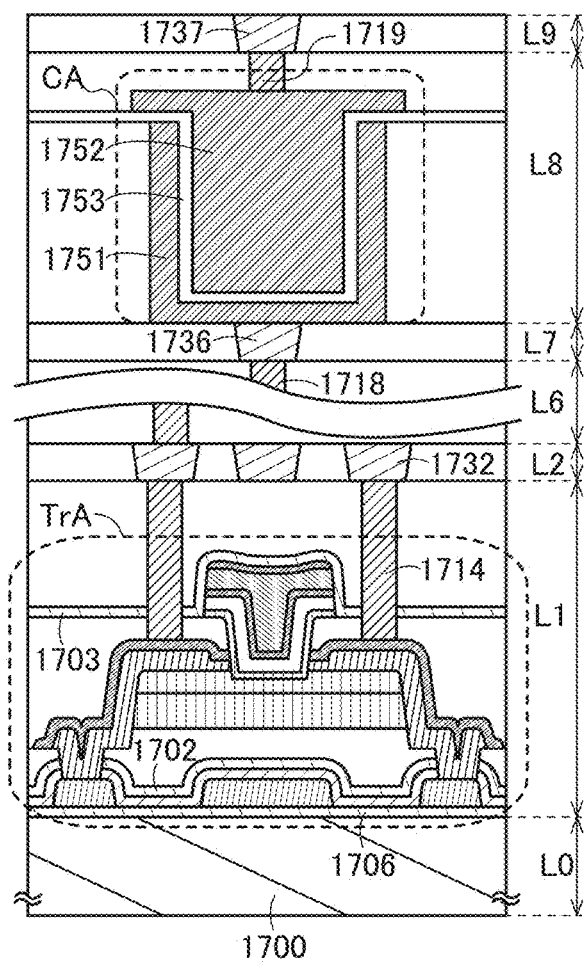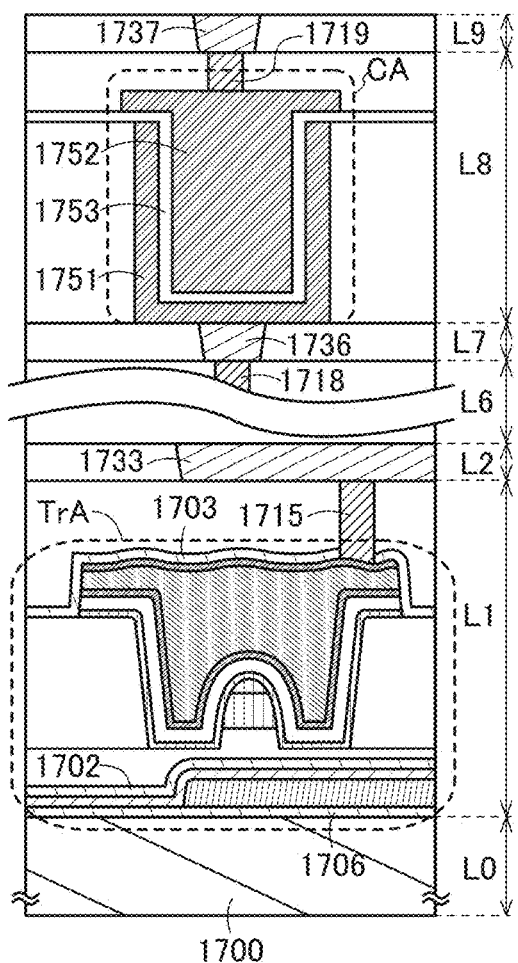

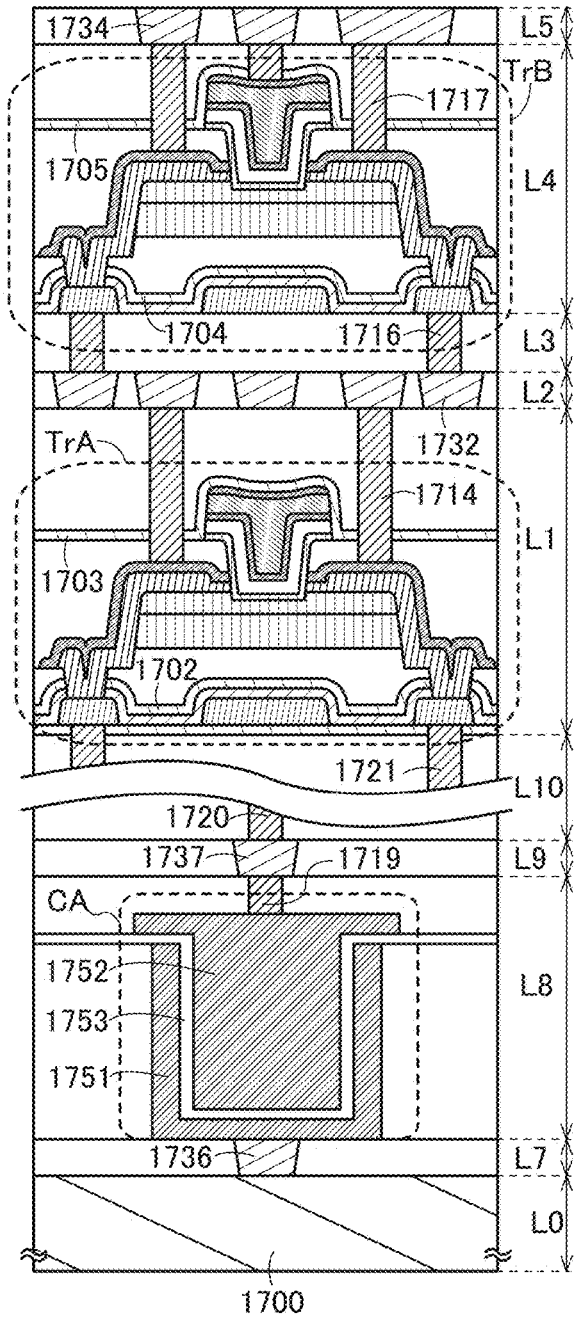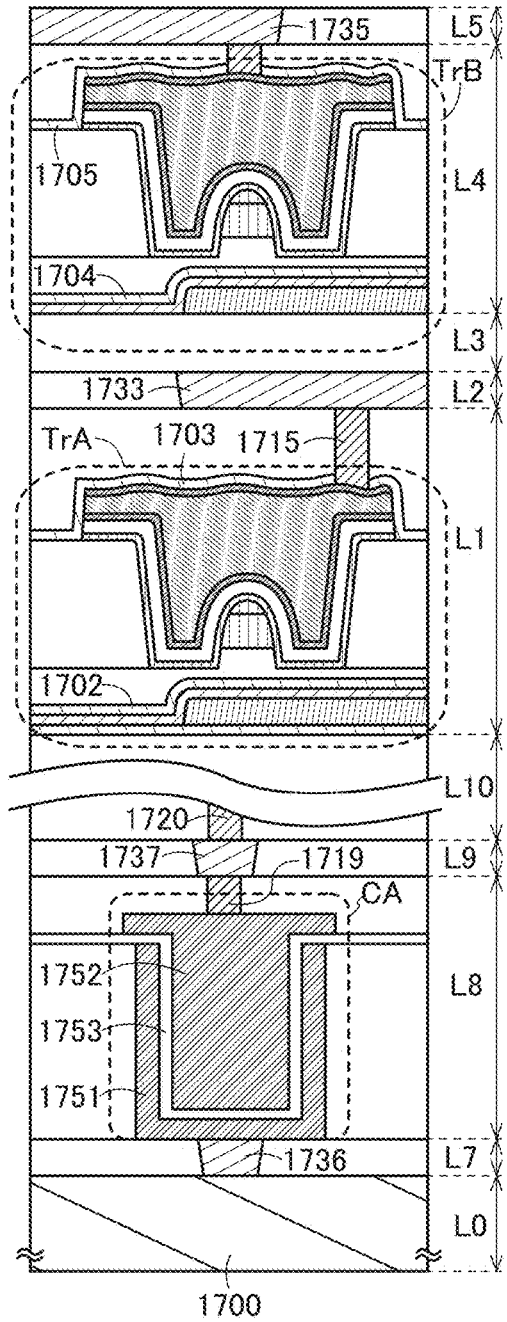

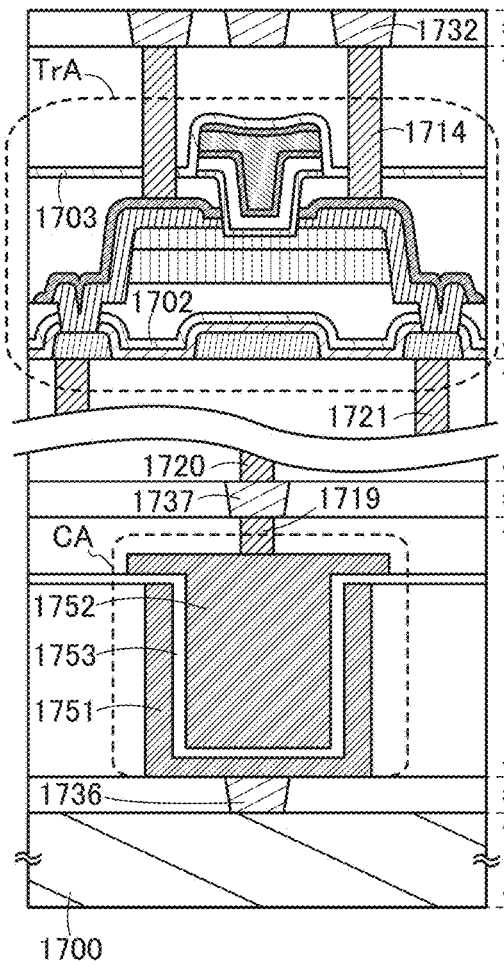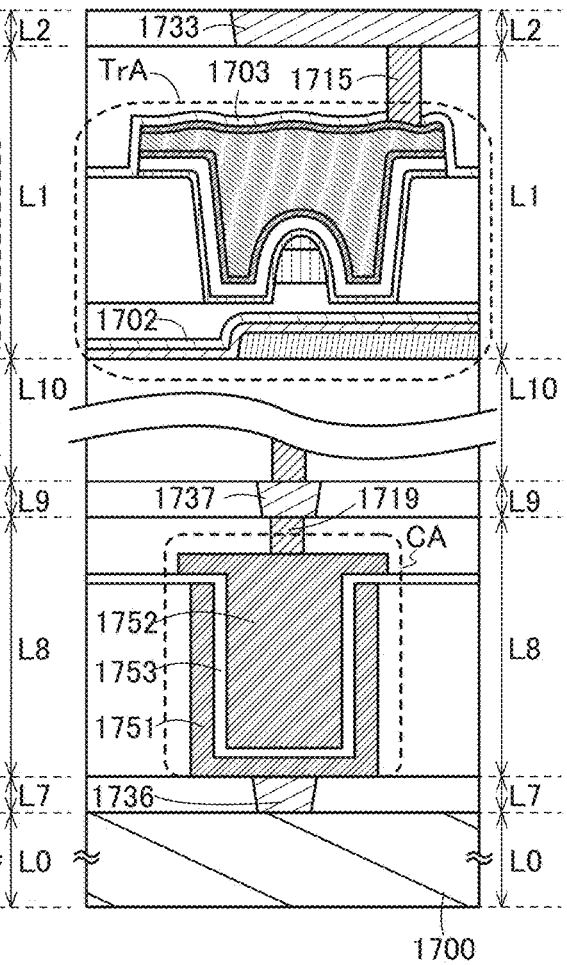

SIGNAL PROCESSING CIRCUIT AND SEMICONDUCTOR DEVICE INCLUDING THE SIGNAL PROCESSING CIRCUIT

BACKGROUND OF THE INVENTION

1. Field of the Invention

One embodiment of the present invention relates to a signal processing circuit and a semiconductor device including the signal processing circuit.

One embodiment of the present invention is not limited to the above technical field. The technical field of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

2. Description of the Related Art

In recent years, semiconductor devices such as central processing units (CPUs), memories, or display devices have been used in various electronic devices such as mobile phones, personal computers, vehicle-mounted devices, and digital cameras.

It has been especially proposed to use a transistor whose channel formation region is formed using an oxide semiconductor (hereinafter, also referred to as an "oxide semiconductor transistor" or an "OS transistor") for circuits included in the semiconductor devices. For example, Patent Document 1 discloses a memory including a memory cell that can retain data without power supply owing to the use of an OS transistor as a write transistor. This means that a memory including an OS transistor can be used as a nonvolatile memory.

REFERENCE

Patent Document

[Patent Document 1] Japanese Published Patent Application No. 2011-187950

SUMMARY OF THE INVENTION

It is difficult to operate a transistor whose channel formation region is formed using silicon (hereinafter, also referred to as a "silicon transistor" or a "Si transistor") stably in high-temperature environments. For example, electronic devices installed in automobiles, electronic devices used in summer, and the like might be especially affected by high-temperature environments continuously, which might lead to malfunctions of the electronic devices.

Thus, semiconductor devices that can operate stably even in high-temperature environments are required.

An object of one embodiment of the present invention is to provide a novel semiconductor device. Another object of one embodiment of the present invention is to provide a memory device or a module including the novel semiconductor device. Another object of one embodiment of the present invention is to provide an electronic device using the memory device or the module including the novel semiconductor device. Another object of one embodiment of the present invention is to provide a system using the memory device or the module including the novel semiconductor device.

Another object of one embodiment of the present invention is to provide a semiconductor device that can operate stably even in high-temperature environments, a memory device including the semiconductor device, or a module including the semiconductor device. Another object of one embodiment of the present invention is to provide an electronic device including the memory device or the module. Another object of one embodiment of the present invention is to provide a memory device or a module with low power consumption.

Note that the objects of one embodiment of the present invention are not limited to the above objects. The objects described above do not preclude the existence of other objects. The other objects are the ones that are not described above and will be described below. The other objects will be apparent from and can be derived from the description of the specification, the drawings, and the like by those skilled in the art. One embodiment of the present invention solves at least one of the above objects and the other objects. One embodiment of the present invention does not necessarily solve all the above objects and the other objects.

(1) One embodiment of the present invention is a signal processing circuit including first to $(2^n-1)$-th functional circuits (n is an integer greater than or equal to 1), first to n-th wirings A, and first to n-th wirings B. Each of the first to $(2^n-1)$-th functional circuits includes a first terminal, a second terminal, a third terminal, a fourth terminal, and a fifth terminal. The first terminal of the h-th functional circuit (h is an integer greater than or equal to 1 and less than or equal to $(2^{n-1}-1)$) is electrically connected to the third terminal of the 2h-th functional circuit. The second terminal of the h-th functional circuit is electrically connected to the third terminal of the (2h+1)-th functional circuit. The fourth terminal of each of the $2^{i-1}$-th to $(2^i-1)$-th functional circuits (i is an integer greater than or equal to 1 and less than or equal to n) is electrically connected to the i-th wiring A. The fifth terminal of each of the $2^{i-1}$-th to $(2^i-1)$-th functional circuits is electrically connected to the i-th wiring B. One of a high-level potential and a low-level potential is input to each of the first to n-th wirings A and the other of the high-level potential and the low-level potential is input to each of the first to n-th wirings B. The first to $(2^n-1)$-th functional circuits are each configured to electrically connect the third terminal to the first terminal and not to electrically connect the third terminal and the second terminal when the high-level potential is input to the fourth terminal. The first to $(2^n-1)$-th functional circuits are each configured to electrically connect the third terminal to the second terminal and not to electrically connect the third terminal and the first terminal when the low-level potential is input to the fourth terminal. The first to $(2^n-1)$-th functional circuits are each configured not to cause a voltage drop between the first terminal and the third terminal or between the second terminal and the third terminal.

(2) One embodiment of the present invention is the signal processing circuit according to (1), in which the first to $(2^n-1)$-th functional circuits each include a first transistor and a second transistor. The first transistors and the second transistors each include a first gate and a second gate. In each of the first to $(2^n-1)$-th functional circuits, the third terminal is electrically connected to a first terminal of the first transistor and a first terminal of the second transistor, the first terminal is electrically connected to a second terminal of the first transistor, the second terminal is electrically connected to a second terminal of the second transistor, the fourth terminal is electrically connected to the first gate of the first transistor, the fifth terminal is electrically connected to the first gate of the second transistor, the second gate of the first transistor is electrically connected to the first gate of the first transistor, and the second gate of the second transistor is electrically connected to the first gate of the second transistor.

(3) One embodiment of the present invention is the signal processing circuit according to (2), in which the first transistors and the second transistors have the same polarity.

(4) One embodiment of the present invention is the signal processing circuit according to any one of (1) to (3) from which r functional circuits (r is an integer greater than or equal to 1 and less than or equal to $(2^n-2^{n-1}-1)$) are removed. The r functional circuits are directly and/or indirectly connected to the second terminal of the first functional circuit. At least one of the r functional circuits is one of the $(2^n-2^{n-2})$-th to $(2^n-1)$-th functional circuits. A node electrically connected to the third terminal of any of the r functional circuits is electrically connected to one of a node electrically connected to the first terminal of the any of the r functional circuits and a node electrically connected to the second terminal of the any of the r functional circuits. A functional circuit electrically connected to the other of the node electrically connected to the first terminal of the any of the r functional circuits and the node electrically connected to the second terminal of the any of the r functional circuits directly and/or indirectly is removed as part of the r functional circuits.

(5) One embodiment of the present invention is a signal processing circuit including first to $(2^m-1)$-th functional circuits A (m is an integer greater than or equal to 1), first to $(2^n-2^m)$-th functional circuits B (n is an integer greater than m), first to n-th wirings A, and first to n-th wirings B. Each of the first to $(2^m-1)$-th functional circuits A includes a first terminal, a second terminal, a third terminal, a fourth terminal, and a fifth terminal. Each of the first to $(2^n-2^m)$-th functional circuits B includes a sixth terminal, a seventh terminal, an eighth terminal, a ninth terminal, and a tenth terminal. The first terminal of the f-th functional circuit A (f is an integer greater than or equal to 1 and less than or equal to $(2^{m-1}-1)$) is electrically connected to the third terminal of the 2f-th functional circuit A. The second terminal of the f-th functional circuit A is electrically connected to the third terminal of the (2f+1)-th functional circuit A. The first terminal of the g-th functional circuit A (g is an integer greater than or equal to $2^{m-1}$ and less than or equal to $(2^m-1)$) is electrically connected to the eighth terminal of the $(2g-2^m+1)$-th functional circuit B. The second terminal of the g-th functional circuit A is electrically connected to the eighth terminal of the $(2g-2^m+2)$-th functional circuit B. The sixth terminal of the $\{h-(2^m-1)\}$-th functional circuit B (h is an integer greater than or equal to $2^{k-1}$ and less than or equal to $(2^k-1)$, where k is an integer greater than m and less than or equal to (n−1)) is electrically connected to the eighth terminal of the $(2h-2^m+1)$-th functional circuit B. The seventh terminal of the $\{h-(2^m-1)\}$-th functional circuit B is electrically connected to the eighth terminal of the $(2h-2^m+2)$-th functional circuit B. The fourth terminal of each of the $2^{i-1}$-th to $(2^i-1)$-th functional circuits A (i is an integer greater than or equal to 1 and less than or equal to m) is electrically connected to the i-th wiring A. The fifth terminal of each of the $2^{i-1}$-th to $(2^i-1)$-th functional circuits A is electrically connected to the i-th wiring B. The ninth terminal of each of the $(2^{j-1}-2^m+1)$-th to $(2^j-2^m)$-th functional circuits B (j is an integer greater than m and less than or equal to n) is electrically connected to the j-th wiring A. The tenth terminal of each of the $(2^{j-1}-2^m+1)$-th to $(2^j-2^m)$-th functional circuits B is electrically connected to the j-th wiring B. One of a high-level potential and a low-level potential is input to each of the first to n-th wirings A and the other of the high-level potential and the low-level potential is input to each of the first to n-th wirings B. The first to $(2^m-1)$-th functional circuits A are each configured to electrically connect the third terminal to the first terminal and not to electrically connect the third terminal to the second terminal when the high-level potential is input to the fourth terminal. The first to $(2^m-1)$-th functional circuits A are each configured to electrically connect the third terminal to the second terminal and not to electrically connect the third terminal to the first terminal when the low-level potential is input to the fourth terminal. The first to $(2^n-2^m)$-th functional circuits B are each configured to electrically connect the eighth terminal to the sixth terminal and not to electrically connect the eighth terminal to the seventh terminal when the high-level potential is input to the ninth terminal. The first to $(2^n-2^m)$-th functional circuits B are each configured to electrically connect the eighth terminal to the seventh terminal and not to electrically connect the eighth terminal to the sixth terminal when the low-level potential is input to the ninth terminal. The first to $(2^m-1)$-th functional circuits A are each configured not to cause a voltage drop between the first terminal and the third terminal or between the second terminal and the third terminal. The first to $(2^n-2^m)$-th functional circuits B are each configured not to cause a voltage drop between the sixth terminal and the eighth terminal or between the seventh terminal and the eighth terminal.

(6) One embodiment of the present invention is the signal processing circuit according to (5), in which the first to $(2^m-1)$-th functional circuits A each include a first transistor and a second transistor and the first to $(2^n-2^m)$-th functional circuits B each include a third transistor and a fourth transistor. The first transistors, the second transistors, the third transistors, and the fourth transistors each include a first gate and a second gate. In each of the first to $(2^m-1)$-th functional circuits A, the third terminal is electrically connected to a first terminal of the first transistor and a first terminal of the second transistor, the first terminal is electrically connected to a second terminal of the first transistor, the second terminal is electrically connected to a second terminal of the second transistor, the fourth terminal is electrically connected to the first gate of the first transistor, and the fifth terminal is electrically connected to the first gate of the second transistor. In each of the first to $(2^n-2^m)$-th functional circuits B, the eighth terminal is electrically connected to a first terminal of the third transistor and a first terminal of the fourth transistor, the sixth terminal is electrically connected to a second terminal of the third transistor, the seventh terminal is electrically connected to a second terminal of the fourth transistor, the ninth terminal is electrically connected to the first gate of the third transistor, the tenth terminal is electrically connected to the first gate of the fourth transistor, the second gate of the third transistor is electrically connected to the first gate of the third transistor, and the second gate of the fourth transistor is electrically connected to the first gate of the fourth transistor.

(7) One embodiment of the present invention is the signal processing circuit according to (6), in which the first transistors, the second transistors, the third transistors, and the fourth transistors included in the functional circuits have the same polarity.

(8) One embodiment of the present invention is the signal processing circuit according to any one of (5) to (7) from which p functional circuits A (p is an integer greater than or equal to 0) and q functional circuits B (q is an integer that satisfies r=p+q, where r is an integer greater than or equal to 1 and less than or equal to $(2^n-2^{n-1}-1)$) are removed. The p functional circuits A and the q functional circuits B are directly and/or indirectly connected to the second terminal of the first functional circuit A. At least one of the q functional circuits B is one of the $(2^n-2^{n-2}-2^m+1)$-th to $(2^n-2^m)$-th functional circuits B. A node electrically connected to the third terminal of any of the p functional circuits A is electrically connected to one of a node electrically connected to the first terminal of the any of the p functional circuits A and a node electrically connected to the second terminal. A functional circuit electrically connected to the other of the node electrically connected to the first terminal of the any of the r functional circuits and the node electrically connected to the second terminal of the any of the p functional circuits A directly and/or indirectly is removed as part of the p functional circuits A and/or part of the q functional circuits B. A node electrically connected to the eighth terminal of any of the q functional circuits B is electrically connected to one of a node electrically connected to the sixth terminal of the any of the q functional circuits B and a node electrically connected to the seventh terminal of the any of the q functional circuits B. A functional circuit electrically connected to the other of the node electrically connected to the sixth terminal of the any of the q functional circuits B and the node electrically connected to the seventh terminal of the any of the q functional circuits B directly and/or indirectly is removed as part of the q functional circuits B.

(9) One embodiment of the present invention is a signal processing circuit including a first functional circuit, a second functional circuit, a first wiring, a second wiring, a third wiring, a fourth wiring, a fifth wiring, and a sixth wiring. The functional circuit includes a first terminal, a second terminal, a third terminal, a first transistor, and a second transistor. The second functional circuit includes a fourth terminal, a fifth terminal, a sixth terminal, a third transistor, and a fourth transistor. Each of the first transistor, the second transistor, the third transistor, and the fourth transistor has a dual-gate structure and includes a first gate and a second gate. The first transistor, the second transistor, the third transistor, and the fourth transistor have the same polarity. One of a source and a drain of the first transistor is electrically connected to the first terminal. One of a source and a drain of the second transistor is electrically connected to the second terminal. The other of the source and the drain of the first transistor is electrically connected to the third terminal. The other of the source and the drain of the second transistor is electrically connected to the third terminal. The first gate of the first transistor is electrically connected to the first wiring. The first gate of the second transistor is electrically connected to the second wiring. The second gate of the first transistor is electrically connected to the third wiring. The second gate of the second transistor is electrically connected to the fourth wiring. One of a source and a drain of the third transistor is electrically connected to the fourth terminal. One of a source and a drain of the fourth transistor is electrically connected to the fifth terminal. The other of the source and the drain of the third transistor is electrically connected to the sixth terminal. The other of the source and the drain of the fourth transistor is electrically connected to the sixth terminal. The first gate of the third transistor is electrically connected to the fifth wiring. The first gate of the fourth transistor is electrically connected to the sixth wiring. The second gate of the third transistor is electrically connected to the fifth wiring. The second gate of the fourth transistor is electrically connected to the sixth wiring. The sixth terminal is electrically connected to one of the first terminal and the second terminal. An inverted signal of a signal input to the second wiring is input to the first wiring. An inverted signal of a signal input to the sixth wiring is input to the fifth wiring. A potential for changing a threshold voltage of the first transistor is applied to the third wiring. A potential for changing a threshold voltage of the second transistor is applied to the fourth wiring.

(10) One embodiment of the present invention is a signal processing circuit including a functional circuit, a first wiring, a second wiring, a third wiring, and a fourth wiring. The functional circuit includes a first terminal, a second terminal, a third terminal, a first transistor, and a second transistor. Each of the first transistor and the second transistor has a dual-gate structure and includes a first gate and a second gate. The first transistor and the second transistor have the same polarity. One of a source and a drain of the first transistor is electrically connected to the first terminal. One of a source and a drain of the second transistor is electrically connected to the second terminal. The other of the source and the drain of the first transistor is electrically connected to the third terminal. The other of the source and the drain of the second transistor is electrically connected to the third terminal. The first gate of the first transistor is electrically connected to the first wiring. The first gate of the second transistor is electrically connected to the second wiring. The second gate of the first transistor is electrically connected to the third wiring. The second gate of the second transistor is electrically connected to the fourth wiring. An inverted signal of a signal input to the second wiring is input to the first wiring. A potential for changing a threshold voltage of the first transistor is applied to the third wiring. A potential for changing a threshold voltage of the second transistor is applied to the fourth wiring.

(11) One embodiment of the present invention is a signal processing circuit including a functional circuit, a first wiring, and a second wiring. The functional circuit includes a first terminal, a second terminal, a third terminal, a first transistor, and a second transistor. Each of the first transistor and the second transistor has a dual-gate structure and includes a first gate and a second gate. The first transistor and the second transistor have the same polarity. One of a source and a drain of the first transistor is electrically connected to the first terminal. One of a source and a drain of the second transistor is electrically connected to the second terminal. The other of the source and the drain of the first transistor is electrically connected to the third terminal. The other of the source and the drain of the second transistor is electrically connected to the third terminal. The first gate of the first transistor is electrically connected to the first wiring. The first gate of the second transistor is electrically connected to the second wiring. The second gate of the first transistor is electrically connected to the first wiring. The second gate of the second transistor is electrically connected to the second wiring. An inverted signal of a signal input to the second wiring is input to the first wiring.

(12) One embodiment of the present invention is a semiconductor device including the signal processing circuit according to any one of (1) to (11), a display element, and a driver circuit.

(13) One embodiment of the present invention is a semiconductor device including the signal processing circuit according to any one of (1) to (11), a photoelectric conversion element, and a driver circuit.

(14) One embodiment of the present invention is a semiconductor device including the signal processing circuit according to any one of (1) to (11), a memory cell, and a driver circuit.

(15) One embodiment of the present invention is the semiconductor device according to (14) in which a transistor included in the driver circuit and the first transistor have the same polarity.

(16) One embodiment of the present invention is the semiconductor device according to (15) in which a channel formation region of the transistor included in the driver circuit contains an oxide semiconductor.

One embodiment of the present invention can provide a novel semiconductor device. Another embodiment of the present invention can provide a memory device or a module including the novel semiconductor device. Another embodiment of the present invention can provide an electronic device using the memory device or the module including the novel semiconductor device. Another embodiment of the present invention can provide a system using the memory device or the module including the novel semiconductor device.

Another embodiment of the present invention can provide a semiconductor device that can operate stably even in high-temperature environments, a memory device including the semiconductor device, or a module including the semiconductor device. Another embodiment of the present invention can provide an electronic device including the memory device or the module. Another embodiment of the present invention can provide a memory device or a module with low power consumption.

Note that the effects of one embodiment of the present invention are not limited to the above effects. The effects described above do not preclude the existence of other effects. The other effects are the ones that are not described above and will be described below. The other effects will be apparent from and can be derived from the description of the specification, the drawings, and the like by those skilled in the art.

One embodiment of the present invention has at least one of the above effects and the other effects. Therefore, one embodiment of the present invention does not have the effects described above in some cases.

BRIEF DESCRIPTION OF THE DRAWINGS

FIG. 7A is a timing chart showing an operation example for the circuit diagram in FIG. 6A, and FIG. 7B is a timing chart showing an operation example for the circuit diagram in FIG. 6C.

FIG. 8 is a timing chart showing an operation example for the circuit diagram in FIG. 6D.

FIGS. 38A and 38B are cross-sectional views illustrating a structure example of a memory cell.

FIGS. 39A and 39B are cross-sectional views illustrating a structure example of a memory cell.

FIGS. 40A and 40B are cross-sectional views illustrating a structure example of a memory cell.

FIGS. 41A and 41B are cross-sectional views illustrating a structure example of a memory cell.

DETAILED DESCRIPTION OF THE INVENTION

Figure 1:
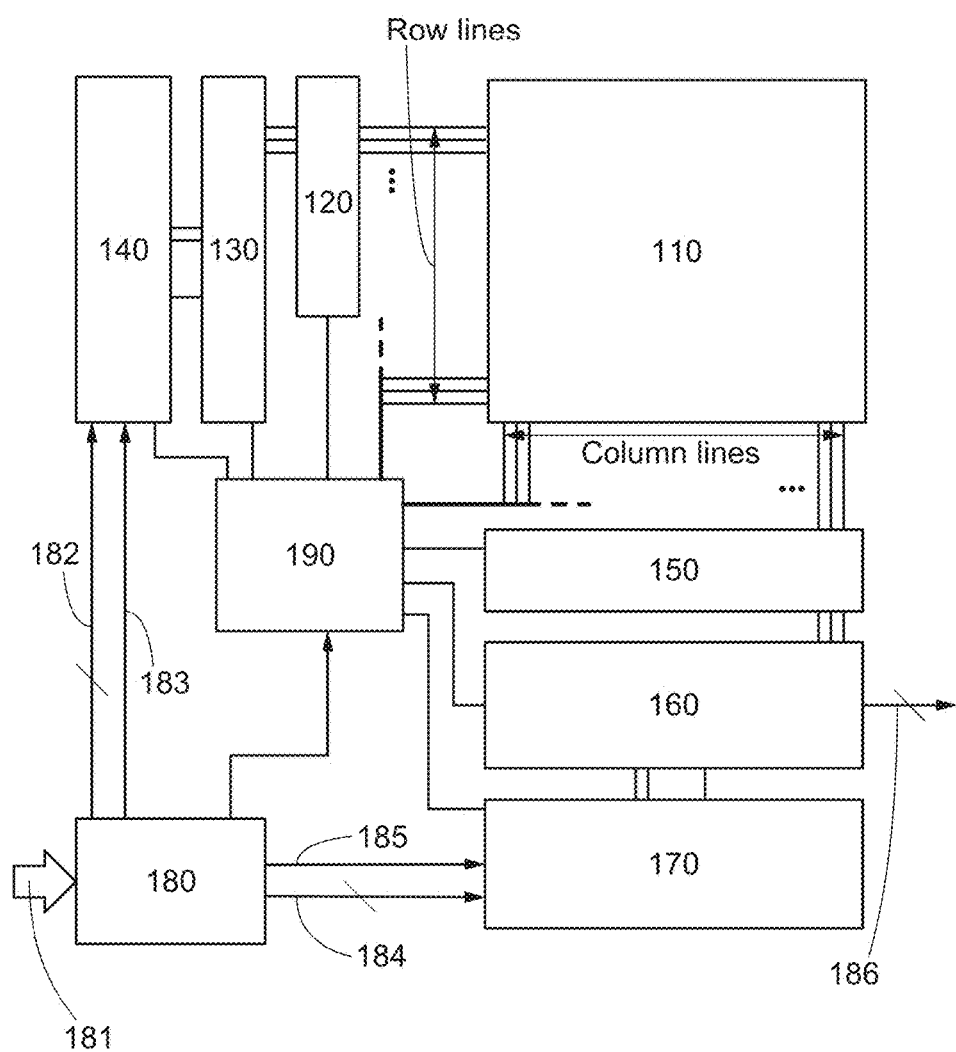
FIG. 1 is a block diagram illustrating a configuration example of a memory device.

An "electronic device," an "electronic component," a "module," and a "semiconductor device" are described. In general, an "electronic device" may include a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may include a processor, a memory device, a sensor, a battery, a display device, a light-emitting device, an interface device, a radio frequency (RF) tag, a receiver, a transmitter, or the like included in an electronic device. A "semiconductor device" may include a device including a semiconductor element or a driver circuit, a control circuit, a logic circuit, a signal generation circuit, a signal converter circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

Note that the above categorization is one example, and an "electronic device," an "electronic component," a "module," and a "semiconductor device" in this specification and the like are not limited by the above categorization. An "electronic device," an "electronic component," a "module," and a "semiconductor device" cannot be strictly distinguished from one another in some cases because distinctions between them are vague depending on roles, functions, components, use states, definitions, and the like thereof. For example, although a display device is defined above as an "electronic component" or a "module," the display device may be defined as an "electronic device" in the case where the display device is an electronic appliance such as a television receiver. Although a memory circuit is defined above as a "semiconductor device," the memory circuit may be defined as an "electronic component" or a "module" in the case where the memory circuit is regarded as one kind of memory devices. In the case where a "semiconductor device" is defined as a device including a semiconductor element, for example, an "electronic device," an "electronic component," and a "module" including semiconductor elements can each be regarded as a "semiconductor device."

Accordingly, an "electronic device" described in this specification can be called an "electronic component," a "module," or a "semiconductor device" in some cases. Similarly, an "electronic component" described in this specification can be called an "electronic device," a "module," or a "semiconductor device" in some cases. A "module" described in this specification can be called an "electronic device," an "electronic component," or a "semiconductor device" in some cases. A "semiconductor device" described in this specification can be called an "electronic device," an "electronic component," or a "module" in some cases.

(Embodiment 1)

In this embodiment, a memory device of one embodiment of the disclosed invention will be described.

<Memory Device>

FIG. 1 illustrates a memory device of one embodiment of the present invention. A memory device 100 includes a memory cell array 110, a row driver 120, a row decoder 130, a row address latch circuit 140, a sense amplifier/precharge circuit 150, a data selector/column decoder 160, a column address latch circuit 170, a control circuit 180, and a back gate voltage control circuit 190.

The control circuit 180 is electrically connected to the row address latch circuit 140 and the column address latch circuit 170. The row address latch circuit 140 is electrically connected to the row decoder 130. The row decoder 130 is electrically connected to the memory cell array 110 through the row driver 120. The column address latch circuit 170 is electrically connected to the data selector/column decoder 160. The data selector/column decoder 160 is electrically connected to the memory cell array 110 through the sense amplifier/precharge circuit 150.

The back gate voltage control circuit 190 is electrically connected to the memory cell array 110, the row driver 120, the row decoder 130, the row address latch circuit 140, the sense amplifier/precharge circuit 150, the data selector/column decoder 160, the column address latch circuit 170, and the control circuit 180. Note that the number of wirings that connect the back gate voltage control circuit 190 to the memory cell array 110 depends on the number of rows and columns of the memory cell array 110 and the configuration of a memory cell. Although a plurality of wirings that connect the back gate voltage control circuit 190 to the memory cell array 110 extend in the row and column directions in FIG. 1, the wirings may extend in one of the row and column directions, depending on the memory cell array 110.

The back gate voltage control circuit 190 has a function of reading a command included in an input signal 181 that is input to the control circuit 180 and applying potentials corresponding to the command to back gates of transistors included in circuits. Note that the command included in the input signal 181 is not necessarily used; the back gate voltage control circuit 190 may have a function of reading output signals of circuits and applying potentials corresponding to the output signals to back gates of transistors included in circuits that are output destinations. Specifically, for example, an output signal of the row address latch circuit 140 that is transmitted to the row decoder 130 can be input to the back gate voltage control circuit 190, so that a potential corresponding to the output signal can be applied to back gates of transistors included in the row decoder 130.

Note that a plurality of wirings extend to the memory cell array 110 in the row direction, and each of the wirings electrically connects the memory cell array 110 to the row driver 120. In addition, a plurality of wirings extend to the memory cell array 110 in the column direction, and each of the wirings electrically connects the memory cell array 110 to the sense amplifier/precharge circuit 150.

Figure 2:
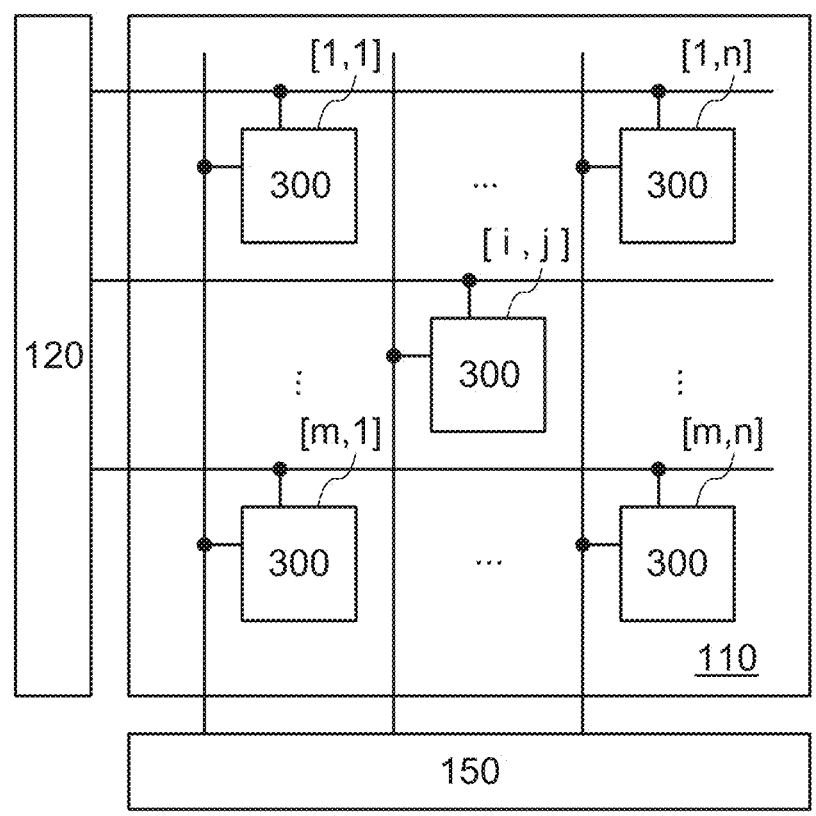
FIG. 2 is a block diagram illustrating a configuration example of a memory cell array.

FIG. 2 illustrates the details of the memory cell array 110. The memory cell array 110 includes m memory cells 300 (m is an integer greater than or equal to 1) in a column and n memory cells 300 (n is an integer greater than or equal to 1) in a raw. That is, m×n memory cells 300 are arranged in a matrix. The addresses of the memory cells 300 are also shown in FIG. 2. FIG. 2 illustrates memory cells at [1, 1], [m, 1], [i, j], [1, n], and [m, n] (i is an integer greater than or equal to 1 and less than or equal to m, and j is an integer greater than or equal to 1 and less than or equal to n). Note that the number of the wirings (row lines) that connect the memory cell array 110 to the row driver 120 depends on the configuration of the memory cell 300, the number of the memory cells 300 in a column, and the like. Furthermore, the number of the wirings (column lines) that connect the memory cell array 110 to the sense amplifier/precharge circuit 150 depends on the configuration of the memory cell 300, the number of the memory cells 300 in a row, and the like.

When data is written to or read from the memory device 100, the input signal 181 is input to the control circuit 180. When data is read from the memory device 100, an output signal 186 is output from the data selector/column decoder 160.

In the case of accessing data retained in the memory device 100, a signal, row address strobe (RAS) 183, is transmitted from the control circuit 180 to the row address latch circuit 140 and then the input signal 181 is transmitted to the row address latch circuit 140, to specify the row address of a memory cell to be accessed. Accordingly, the row address latch circuit 140 can determine a row address 182 included in the input signal 181. Then, a signal, column address strobe (CAS) 185, is transmitted from the control circuit 180 to the column address latch circuit 170 and then the input signal 181 is transmitted to the column address latch circuit 170, to specify the column address of the memory cell to be accessed. Accordingly, the column address latch circuit 170 can determine a column address 184 included in the input signal 181.

<Transistor>

Before the descriptions of the circuits included in the memory device of one embodiment of the present invention, transistors included in the circuits will be described.

The transistors used in the memory device of one embodiment of the present invention are all n-channel transistors. Thus, the memory device of one embodiment of the present invention does not include a CMOS circuit.

For the driving of the memory device of one embodiment of the present invention, n-channel transistors with dual-gate structures are used. To operate the memory device, a potential applied to a back gate of a transistor included in a driver circuit is adjusted as appropriate depending on the driver circuit or a signal input to the driver circuit. Owing to the above principles, a memory device in which all transistors are n-channel transistors can be obtained.

Figure 3:
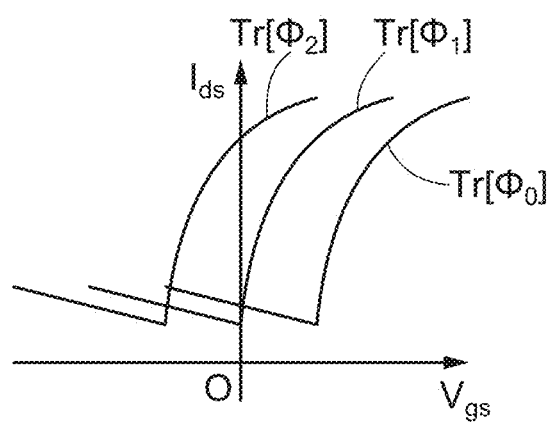
FIG. 3 is a schematic diagram showing the current-voltage characteristics of a transistor.

FIG. 3 is a schematic diagram showing the current-voltage characteristics of a transistor described in this embodiment. FIG. 3 shows current-voltage characteristics (the longitudinal axis represents drain-source current $I_{ds}$ and the lateral axis represents gate-source voltage $V_{gs}$) when a potential $\Phi_0$, $\Phi_1$, or $\Phi_2$ is applied to a back gate of a transistor Tr. In FIG. 3, the transistor Tr whose back gate is supplied with the potential $\Phi_0$ is denoted by Tr[$\Phi_0$], and similarly, the transistor Tr whose back gate is supplied with the potential $\Phi_1$ and the transistor Tr whose back gate is supplied with the potential $\Phi_2$ are denoted by Tr[$\Phi_1$] and Tr[$\Phi_2$], respectively. Note that as for the potentials applied to the back gate, $\Phi_2 > \Phi_1 > \Phi_0$ is satisfied.

In a circuit that requires high on-state current, the potential $\Phi_2$ is applied to the back gate of the transistor Tr so that the current-voltage characteristics shift in the negative direction (hereinafter, a transistor in such a state is also referred to as a depletion transistor). In a circuit that requires low off-state current, the potential $\Phi_0$ is applied to the back gate of the transistor Tr so that the current-voltage characteristics shift in the positive direction (hereinafter, a transistor in such a state is also referred to as an enhancement transistor).

<Memory Cell>

Examples of memory cells included in the memory device of one embodiment of the present invention will be described with reference to FIGS. 4A to 4D.

<<1T1C Memory Cell>>

Figure 4A:
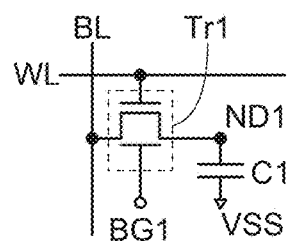
FIGS. 4A to 4D are circuit diagrams each illustrating a configuration example of a semiconductor device.

FIG. 4A illustrates a 1T1C memory cell. A memory cell 301 includes a transistor Tr1 and a capacitor C1.

A first terminal of the transistor Tr1 is electrically connected to a first terminal of the capacitor C1. A second terminal of the transistor Tr1 is electrically connected to a wiring BL. A gate of the transistor Tr1 is electrically connected to a wiring WL. A second terminal of the capacitor C1 is electrically connected to a wiring VSS through which a low power supply potential is applied. A back gate of the transistor Tr1 is electrically connected to a wiring BG1.

A node ND1 that serves as a data retention portion is positioned between the first terminal of the transistor Tr1 and the first terminal of the capacitor C1. The transistor Tr1 functions as a switch that connects the node ND1 to the wiring BL. The wiring BL functions as a bit line to/from which a writing signal and a reading signal are input/output. A memory cell selection signal is input to the wiring WL.

When the memory cell 301 performs writing or reading operation, the transistor Tr1 preferably operates with the current-voltage characteristics of the transistor Tr[$\Phi_2$]. In other words, a potential at which the transistor Tr1 operates with the current-voltage characteristics of the transistor Tr[$\Phi_2$] is preferably applied from the wiring BG1 to the back gate of the transistor Tr1. Furthermore, when the memory cell 301 does not perform writing or reading operation, the transistor Tr1 preferably operates with the current-voltage characteristics of the transistor Tr[$\Phi_0$]. In other words, a potential at which the transistor Tr1 operates with the current-voltage characteristics of the transistor Tr[$\Phi_0$] is preferably applied from the wiring BG1 to the back gate of the transistor Tr1.

As described above, when a predetermined potential is applied to the back gate of the transistor Tr1, the conducting/non-conducting state of the transistor Tr1 or the amount of current flowing in the transistor Tr1 can be determined.

Figure 5A:
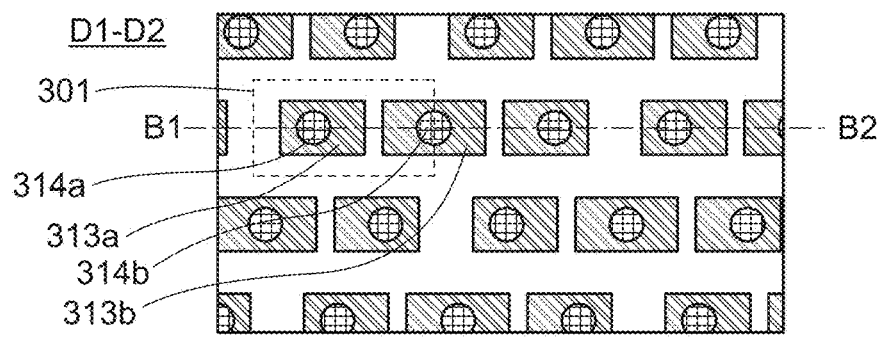
FIGS. 5A to 5D are top views and a cross-sectional view of a memory cell array.
Figure 5B:
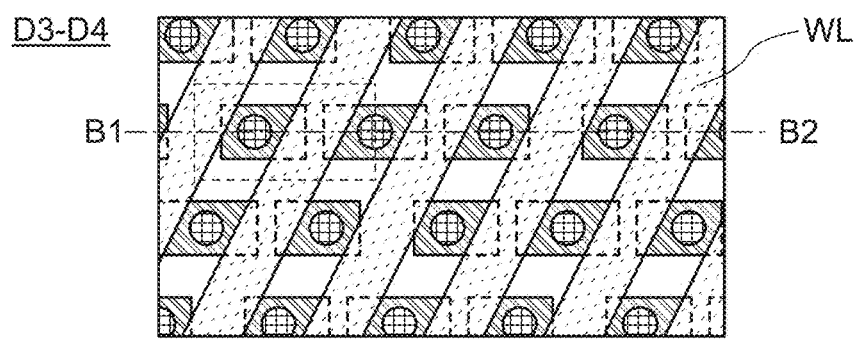
Figure 5C:
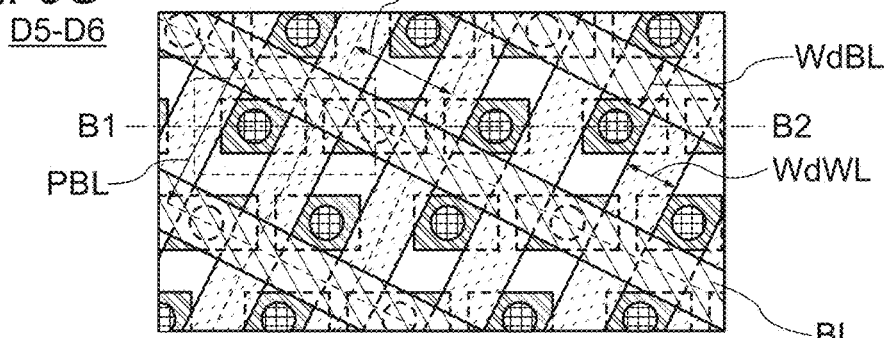
Figure 5D:
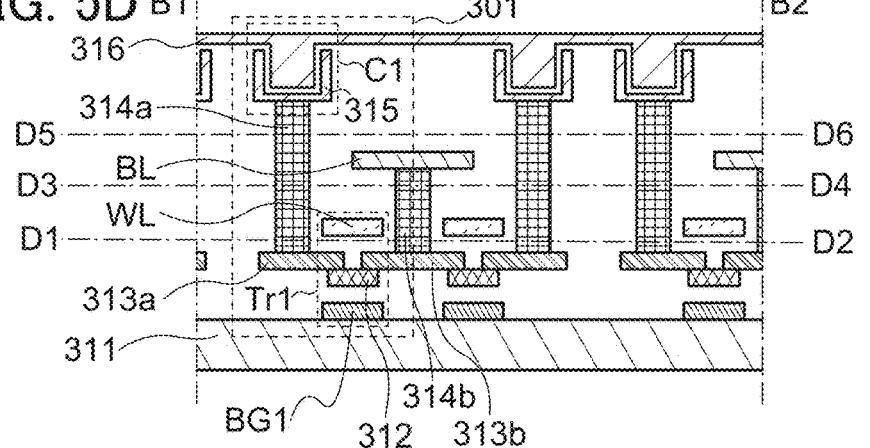

Here, an example of a memory cell array formed using the memory cells 301 is described. FIGS. 5A to 5C are top views of the memory cell array in which the memory cells 301 are laid on a supporting substrate. FIG. 5D is a cross-sectional view taken along a dashed-dotted line B1-B2 in FIGS. 5A to 5C. FIG. 5A is a top view illustrating a structure below a dashed-dotted line D1-D2 in FIG. 5D, FIG. 5B is a top view illustrating a structure below a dashed-dotted line D3-D4 in FIG. 5D, and FIG. 5C is a top view illustrating a structure below a dashed-dotted line D5-D6 in FIG. 5D.

Note that FIGS. 5A to 5C do not illustrate a substrate 311 and a semiconductor 312 described later. In FIG. 5D, a region with a hatching pattern shows any of the substrate 311, the semiconductor 312, and a conductor such as a wiring, and a region with no hatching pattern shows an insulator. Note that the insulator consists of stacked insulating films. Thus, in the description for FIGS. 5A to 5D in this specification, the expression "over an insulating film" means the expression "over any one of the insulating films included in the insulator."

In FIGS. 5A and 5D, the wiring BG1 is over the substrate 311, the semiconductor 312 is in a region overlapping with the wiring BG1 with an insulating film positioned therebetween, a conductor 313a is over an insulating film and in a region in contact with the semiconductor 312, and a conductor 313b is over an insulating film and in a region in contact with the semiconductor 312. Note that the wiring BG1 functions not only as a wiring but also as a bottom gate electrode, the conductor 313a functions as one of a source electrode and a drain electrode of a transistor, and the conductor 313b functions as the other of the source electrode and the drain electrode of the transistor. Thus, the conductor 313a does not include a region in contact with the conductor 313b. A conductor 314a is over the conductor 313a, and a conductor 314b is over the conductor 313b. The conductor 314a and the conductor 314b each function as a contact wiring between layers.

In FIGS. 5B and 5D, the wiring WL is in a region overlapping with the semiconductor 312 with an insulating film positioned therebetween. The wiring WL functions not only as a wiring but also as a top gate electrode. The wiring WL, the conductor 313a, the conductor 313b, the semiconductor 312, and the wiring BG1 can form the transistor Tr1. In FIG. 5B, the wiring WL extends in the direction inclined at an angle greater than 0° and less than 90° toward the dashed-dotted line B1-B2. When the wiring WL is placed in this manner, a large number of the memory cells 301 can be arranged as compared to the case where the wiring WL extends perpendicularly to the dashed-dotted line B1-B2.

In FIGS. 5C and 5D, the wiring BL is over the conductor 313b. In FIG. 5C, the wiring BL extends perpendicularly to the wiring WL. Note that one embodiment of the present invention is not limited to this configuration example; the wiring BL may extend in the direction inclined at an angle greater than 0° and less than 90° toward the wiring WL.

In FIG. 5D, a conductor 315 is over the conductor 314a, and a conductor 316 is in a region overlapping with the conductor 315 with an insulating film positioned therebetween and over a predetermined insulating film. The conductor 315 and the conductor 316 overlapping with the conductor 315 with an insulating film positioned therebetween form the trench capacitor C1. Thus, the conductor 315 functions as one electrode of the capacitor C1, and the conductor 316 in the region overlapping with the conductor 315 with an insulating film positioned therebetween functions as the other electrode of the capacitor C1. The conductor 316 may function as, instead of the electrode of the capacitor C1, a wiring that is connected to another capacitor. In that case, the conductor 316 may function as an electrode of the another capacitor.

Described here is the case where a technology node (design rule) of the memory cell array illustrated in FIGS. 5A to 5D is 30 nm.

Table 1 shows the size of the memory cell, the capacitance and the height of the capacitor C1, and the size of the transistor when the technology node is 30 nm. The channel length (L in Table 1) and the channel width (W in Table 1) of the transistor Tr1 are each 30 nm. The size of the memory cell (corresponding to a rectangle formed of thin dotted lines in FIG. 5A) is 0.064 μm×0.096 μm. Thus, the area of each memory cell is 0.00614 μm². The capacitance of the capacitor C1 is 2.0 fF.

TABLE 1

| Memory Cell | Area | 0.00614 μm² |
| | | (0.064 μm × 0.096 μm) |
| | | $6F^2$ (F = 36.5 nm) |
| Capacitor | Capacitance | 2.0 fF |
| | Height | 1.75 μm |
| | | when 10 nm thick, $\varepsilon_r = 20$ |
| FET | L/W | 30 nm/30 nm |

In the case of fabricating the memory cell array in FIGS. 5A to 5D with the above technology node, it is preferable that a width WdBL of the wiring BL be 32 nm, a width WdWL of the wiring WL be 32 nm, a width PBL between the wirings BL be 96 nm, and a width PWL between the wirings WL be 64 nm. In the case of a technology node less than 30 nm, it is preferable that the width WdBL of the wiring BL be smaller than 32 nm, the width WdWL of the wiring WL be smaller than 32 nm, the width PBL between the wirings BL be smaller than 96 nm, and the width PWL between the wirings WL be smaller than 64 nm.

<<2T1C Memory Cell>>

Figure 4B:
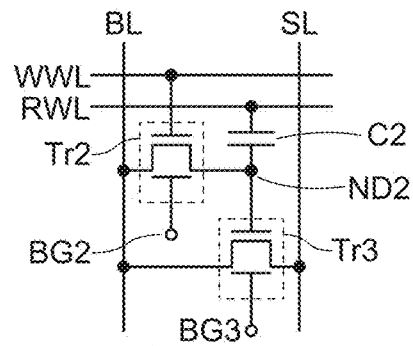

FIG. 4B illustrates a 2T1C memory cell. A memory cell 302 includes a transistor Tr2, a transistor Tr3, and a capacitor C2.

A first terminal of the transistor Tr2 is electrically connected to a gate of the transistor Tr3 and a first terminal of the capacitor C2. A second terminal of the transistor Tr2 is electrically connected to the wiring BL. A gate of the transistor Tr2 is electrically connected to a wiring WWL. A first terminal of the transistor Tr3 is electrically connected to the wiring BL. A second terminal of the transistor Tr3 is electrically connected to a wiring SL. A second terminal of the capacitor C2 is electrically connected to a wiring RWL. A back gate of the transistor Tr2 is electrically connected to a wiring BG2. A back gate of the transistor Tr3 is electrically connected to a wiring BG3.

A node ND2 that serves as a data retention portion is positioned between the first terminal of the transistor Tr2, the gate of the transistor Tr3, and the first terminal of the capacitor C2. The transistor Tr2 functions as a switch that connects the node ND2 to the wiring BL. The wiring WWL functions as a write word line to which a signal for selecting a memory cell is input. The wiring RWL functions as a read word line and is used to supply constant voltage to the second terminal of the capacitor C2 in writing operation and reading operation.

Data writing is performed when the transistor Tr2 is turned on to connect the node ND2 to the wiring BL while the wiring RWL and the wiring SL are being precharged to constant voltage.

In data reading, the wiring BL, the wiring RWL, and the wiring SL are precharged to constant voltage. Since the value of current flowing in the transistor Tr3 changes in accordance with the potential of the node ND2, the wiring BL is charged or discharged. Detection of an increase or decrease in the voltage of the wiring BL enables reading of data retained in the memory cell 302.

When the memory cell 302 performs writing operation, the transistor Tr2 preferably operates with the current-voltage characteristics of the transistor Tr[$\Phi_2$] and the transistor Tr3 preferably operates with the current-voltage characteristics of the transistor Tr[$\Phi_0$]. In other words, a potential at which the transistor Tr2 operates with the current-voltage characteristics of the transistor Tr[$\Phi_2$] is preferably applied from the wiring BG2 to the back gate of the transistor Tr2, and a potential at which the transistor Tr3 operates with the current-voltage characteristics of the transistor Tr[$\Phi_0$] is preferably applied from the wiring BG3 to the back gate of the transistor Tr3. Furthermore, when the memory cell 302 performs reading operation, the transistor Tr2 preferably operates with the current-voltage characteristics of the transistor Tr[$\Phi_0$] and the transistor Tr3 preferably operates with the current-voltage characteristics of the transistor Tr[$\Phi_1$]. In other words, a potential at which the transistor Tr2 operates with the current-voltage characteristics of the transistor Tr[$\Phi_0$] is preferably applied from the wiring BG2 to the back gate of the transistor Tr2, and a potential at which the transistor Tr3 operates with the current-voltage characteristics of the transistor Tr[$\Phi_1$] is preferably applied from the wiring BG3 to the back gate of the transistor Tr3.

As described above, when a predetermined potential is applied to the back gate of each of the transistors Tr2 and Tr3, the conducting/non-conducting states of the transistors Tr2 and Tr3 or the amount of current flowing in the transistor Tr2 and that in the transistor Tr3 can be determined.

<<3T Memory Cell>>

Figure 4C:
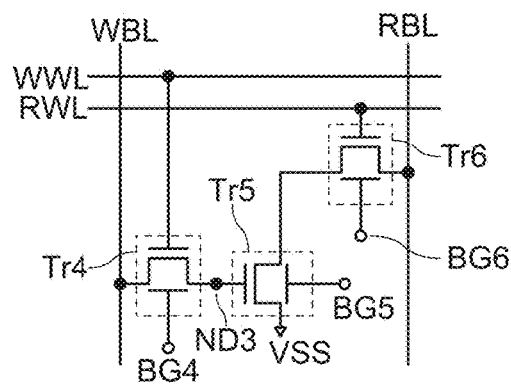

FIG. 4C illustrates a 3T memory cell. A memory cell 303 includes a transistor Tr4, a transistor Tr5, and a transistor Tr6.

A first terminal of the transistor Tr4 is electrically connected to a gate of the transistor Tr5. A second terminal of the transistor Tr4 is electrically connected to a wiring WBL. A gate of the transistor Tr4 is electrically connected to the wiring WWL. A first terminal of the transistor Tr5 is electrically connected to a first terminal of the transistor Tr6. A second terminal of the transistor Tr5 is electrically connected to the wiring VSS. The wiring VSS is a wiring through which a low power supply potential is applied. A second terminal of the transistor Tr6 is electrically connected to a wiring RBL. A gate of the transistor Tr6 is electrically connected to the wiring RWL. A back gate of the transistor Tr4 is electrically connected to a wiring BG4. A back gate of the transistor Tr5 is electrically connected to a wiring BG5. A back gate of the transistor Tr6 is electrically connected to a wiring BG6.

A node ND3 that serves as a data retention portion is positioned between the first terminal of the transistor Tr4 and the gate of the transistor Tr5. The transistor Tr4 functions as a switch that connects the node ND3 to the wiring WBL. The transistor Tr6 functions as a switch that connects the wiring RBL to the transistor Tr5. The wiring WBL functions as a write bit line to which a data write signal is input. The wiring WWL functions as a write word line to which a signal for selecting a memory cell is input.

Data writing is performed when the transistor Tr4 is turned on to connect the node ND3 to the wiring WBL.

In data reading, the transistor Tr6 is turned on while the wiring RBL is being precharged to constant voltage. Since the value of current flowing in the transistor Tr5 changes in accordance with the potential of the node ND3, the wiring RBL is charged or discharged. Detection of an increase or decrease in the voltage of the wiring RBL enables reading of data retained in the memory cell 303.

When the memory cell 303 performs writing operation, the transistor Tr4 preferably operates with the current-voltage characteristics of the transistor Tr[$\Phi_2$] and the transistors Tr5 and Tr6 each preferably operate with the current-voltage characteristics of the transistor Tr[$\Phi_0$]. In other words, a potential at which the transistor Tr4 operates with the current-voltage characteristics of the transistor Tr[$\Phi_2$] is preferably applied from the wiring BG4 to the back gate of the transistor Tr4, and potentials at which the transistors Tr5 and Tr6 operate with the current-voltage characteristics of the transistor Tr[$\Phi_0$] are preferably applied from the wirings BG5 and BG6 to the back gates of the transistors Tr5 and Tr6. Furthermore, when the memory cell 303 performs reading operation, the transistor Tr4 preferably operates with the current-voltage characteristics of the transistor Tr[$\Phi_0$] and the transistors Tr5 and Tr6 each preferably operate with the current-voltage characteristics of the transistor Tr[$\Phi_1$]. In other words, a potential at which the transistor Tr4 operates with the current-voltage characteristics of the transistor Tr[$\Phi_0$] is preferably applied from the wiring BG4 to the back gate of the transistor Tr4, and potentials at which the transistors Tr5 and Tr6 operate with the current-voltage characteristics of the transistor Tr[$\Phi_1$] are preferably applied from the wirings BG5 and BG6 to the back gates of the transistors Tr5 and Tr6.

As described above, when a predetermined potential is applied to the back gate of each of the transistors Tr4 to Tr6, the conducting/non-conducting states of the transistors Tr4 to Tr6 or the amount of current flowing in the transistor Tr4, that in the transistor Tr5, and that in the transistor Tr6 can be determined.

<<SRAM>>

Figure 4D:
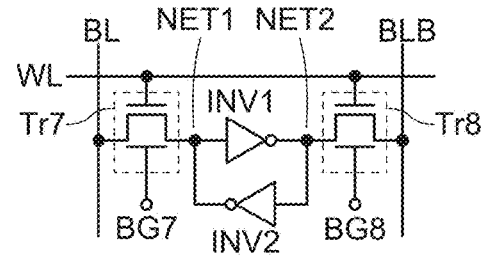

FIG. 4D illustrates a memory cell that is an example of a static random access memory (SRAM). A memory cell 304 includes a transistor Tr7, a transistor Tr8, an inverter circuit INV1, and an inverter circuit INV2.

Since all transistors included in the memory device of one embodiment of the present invention are n-channel transistors, transistors included in the inverter circuits INV1 and INV2 are n-channel transistors. Such an inverter circuit in which all transistors are n-channel transistors will be described later.

A first terminal of the transistor Tr7 is electrically connected to an input terminal of the inverter circuit INV1 and an output terminal of the inverter circuit INV2. A second terminal of the transistor Tr7 is electrically connected to the wiring BL. A gate of the transistor Tr7 is electrically connected to the wiring WL. A first terminal of the transistor Tr8 is electrically connected to an output terminal of the inverter circuit INV1 and an input terminal of the inverter circuit INV2. A second terminal of the transistor Tr8 is electrically connected to a wiring BLB. A gate of the transistor Tr8 is electrically connected to the wiring WL. A back gate of the transistor Tr7 is electrically connected to a wiring BG7. A back gate of the transistor Tr8 is electrically connected to a wiring BG8.

A node NET1 that serves as a data retention portion is positioned between the first terminal of the transistor Tr7, the input terminal of the inverter circuit INV1, and the output terminal of the inverter circuit INV2. A node NET2 that serves as a data retention portion is positioned between the first terminal of the transistor Tr8, the output terminal of the inverter circuit INV1, and the input terminal of the inverter circuit INV2. The wiring WL functions as a write/read word line to which a signal for selecting a memory cell is input. A write signal and a read signal are transmitted to the wiring BL and the wiring BLB.

When the memory cell 304 performs writing operation or reading operation, the transistors Tr7 and Tr8 each preferably operate with the current-voltage characteristics of the transistor Tr[$\Phi_1$]. In other words, potentials at which the transistors Tr7 and Tr8 operate with the current-voltage characteristics of the transistor Tr[$\Phi_1$] are preferably applied from the wirings BG7 and BG8 to the back gates of the transistors Tr7 and Tr8. Furthermore, when the memory cell 304 does not perform writing or reading operation, the transistors Tr7 and Tr8 each preferably operate with the current-voltage characteristics of the transistor Tr[$\Phi_0$]. In other words, potentials at which the transistors Tr7 and Tr8 operate with the current-voltage characteristics of the transistor Tr[$\Phi_0$] are preferably applied from the wirings BG7 and BG8 to the back gates of the transistors Tr7 and Tr8.

As described above, when a predetermined potential is applied to the back gate of each of the transistors Tr7 and Tr8, the conducting/non-conducting states of the transistors Tr7 and Tr8 or the amount of current flowing in the transistor Tr7 and that in the transistor Tr8 can be determined.

<Peripheral Circuit>

Peripheral circuits included in the memory device of one embodiment of the present invention will be described with reference to FIGS. 6A to 6E, FIGS. 7A and 7B, FIG. 8, FIG. 9, FIGS. 10A and 10B, FIG. 11, FIG. 12, FIG. 13, FIG. 14, FIG. 15, FIG. 16, FIG. 17, and FIG. 18.

<<Logic Circuit>>

First, configuration examples of logic circuits of embodiments of the present invention will be described with reference to FIGS. 6A to 6E.

[NOT Circuit]

Figure 6A:
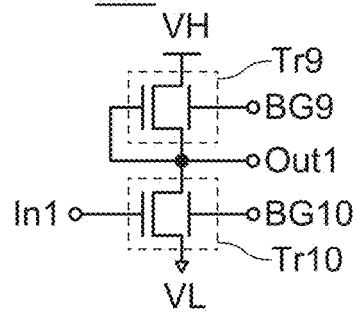
FIGS. 6A to 6E are circuit diagrams each illustrating a configuration example of a semiconductor device.

FIG. 6A illustrates a configuration example of a NOT circuit. In this specification, a NOT circuit may be described as an inverter, an inverter circuit, or the like, depending on circumstances or conditions.

A NOT circuit 201 includes a transistor Tr9 and a transistor Tr10. The channel width of the transistor Tr9 is smaller than the channel width of the transistor Tr10.

A gate of the transistor Tr10 is electrically connected to an input terminal In1 of the NOT circuit 201. A first terminal of the transistor Tr10 is electrically connected to a first terminal of the transistor Tr9, a gate of the transistor Tr9, and an output terminal Out1 of the NOT circuit 201. A second terminal of the transistor Tr9 is electrically connected to a wiring VH through which a high-level potential is applied. A second terminal of the transistor Tr10 is electrically connected to a wiring VL through which a low-level potential is applied.

Next, an operation example of the NOT circuit 201 will be described.

FIG. 7A is a timing chart showing the operation example of the NOT circuit 201. From Time T1 to Time T2, the NOT circuit 201 is in a standby state and a potential $\Phi_0$ is applied to a wiring BG9 and a wiring BG10. That is, the transistor Tr9 and the transistor Tr10 each operate with the current-voltage characteristics of the transistor Tr[$\Phi_0$] shown in FIG. 3. Even when a high-level potential is input to the input terminal In1 in this state, current does not flow between a source and a drain of each of the transistors Tr9 and Tr10 because the transistors Tr9 and Tr10 are in non-conducting states (hereinafter, also referred to as normally-off states). Thus, an undefined potential is output to the output terminal Out1. FIG. 7A shows this undefined potential of the output terminal Out1 with hatching.

After Time T2, the NOT circuit 201 is in operation. At Time T2, a potential $\Phi_2$ is applied to the wiring BG9 and a potential $\Phi_1$ is applied to the wiring BG10. At this time, the current-voltage characteristics of the transistor Tr9 are the current-voltage characteristics of the transistor Tr[$\Phi_2$] shown in FIG. 3, and the current-voltage characteristics of the transistor Tr10 are the current-voltage characteristics of the transistor Tr[$\Phi_1$] shown in FIG. 3. A high-level potential remains being input to the input terminal In1. Thus, the transistor Tr10 is turned on and current flows between the source and the drain of the transistor Tr10. The gate and first terminal of the transistor Tr9 have the same potential and the current-voltage characteristics of the transistor Tr9 are the current-voltage characteristics of the transistor Tr[$\Phi_2$]; accordingly, the transistor Tr9 is in a conducting state (hereinafter, also referred to as a normally-on state). Since the channel width of the transistor Tr9 is smaller than the channel width of the transistor Tr10, the larger amount of current flows in the transistor Tr10 than in the transistor Tr9. Thus, the potential of the output terminal Out1 is affected by the potential of the wiring VL that is connected to the second terminal of the transistor Tr10; as a result, a low-level potential is output to the output terminal Out1.

At Time T3, a low-level potential is applied to the input terminal In1. The transistor Tr10 is in a non-conducting state because its current-voltage characteristics are the current-voltage characteristics of the transistor Tr[$\Phi_1$] shown in FIG. 3. Furthermore, the gate and first terminal of the transistor Tr9 have the same potential and the current-voltage characteristics of the transistor Tr9 are the current-voltage characteristics of the transistor Tr[$\Phi_2$]; accordingly, the transistor Tr9 is in a conducting state as it is before Time T3. Thus, the potential of the output terminal Out1 is affected by the potential of the wiring VH that is connected to the second terminal of the transistor Tr9; as a result, a potential output to the output terminal Out1 becomes a potential lower than a high-level potential by a threshold voltage $V_{th}$ of the transistor Tr9.

Note that when the potential $\Phi_2$ is set to be a potential that makes the threshold voltage of the transistor Tr 0 V, a potential output to the output terminal Out1 can be increased to a high-level potential between Time T3 and Time T4. This means that when the potential $\Phi_2$ is set to be a potential that makes the threshold voltage of the transistor Tr 0 V, a potential output to the output terminal Out1 can be a high-level potential without decreasing by the threshold voltage.

Described below is the reason why the output voltage of the transistor Tr9 becomes a potential lower than a high-level potential by the threshold voltage $V_{th}$ of the transistor Tr9.

First, assume that the potential $\Phi_0$ is applied from the wiring BG9 to the back gate of the transistor Tr9. In this case, the current-voltage characteristics of the transistor Tr9 are the current-voltage characteristics of the transistor Tr[$\Phi_0$] shown in FIG. 3.

Here, a high-level potential is a potential $V_{high}$ and the potential of the output terminal Out1 is a potential $V_x$. Note that for the configuration of the NOT circuit 201, $V_x$ is lower than $V_{high}$. At this time, the source of the transistor Tr9 serves as the first terminal and the first terminal of the transistor Tr9 and the gate of the transistor Tr9 have the same potential; thus, gate-source voltage $V_{gs}$ becomes 0 V. Consequently, the transistor Tr9 with the current-voltage characteristics of the transistor Tr[$\Phi_0$] is brought into a non-conducting state.

When the potential $\Phi_2$ is applied from the wiring BG9 to the back gate of the transistor Tr9, the current-voltage characteristics of the transistor Tr9 become the current-voltage characteristics of the transistor Tr[$\Phi_2$] shown in FIG. 3. Since the gate-source voltage $V_{gs}$ of the transistor Tr9 is 0 V, the transistor Tr9 is brought into a conducting state.

Thus, current flows between the first terminal and second terminal of the transistor Tr9. Note that the drain-source voltage $V_{ds}$ of the transistor Tr9 at this time can be expressed by the formula below.

$$V_{ds}=V_{high}-V_x>0 \quad \text{[Formula 1]}$$

As the relationship between the threshold voltage $V_{th}$ and gate-source voltage $V_{gs}$ of the transistor Tr9, $V_{gs}-V_{th}>0$ is satisfied because the transistor Tr9 is in a conducting state. In the case where the transistor Tr9 operates in a saturation region, $V_{ds}>V_{gs}-V_{th}$ is satisfied; thus, the formula below can be obtained from $V_{ds}=V_{high}-V_x>0$ and $V_{gs}=0$.

$$V_{high}-V_x>-V_{th}>0 \quad \text{[Formula 2]}$$

In the case where a wiring through which a high-level potential or a low-level potential is supplied is not connected to the output destination of the output terminal Out1, the potential $V_x$ of the output terminal Out1 is increased over time because of the high-level potential $V_{high}$ applied through the wiring VH. When the potential $V_x$ is high, since $V_{ds}=V_{high}-V_x$ is satisfied, the drain-source voltage $V_{ds}$ of the transistor Tr9 is low. The drain-source voltage $V_{ds}$ is eventually decreased to pinch-off voltage over time. Note that $V_{ds}=V_{gs}-V_{th}$ is satisfied at pinch-off voltage; thus, the formula below can be obtained from $V_{ds}=V_{high}-V_x$ and $V_{gs}=0$.

$$V_x=V_{high}+V_{th} \quad \text{[Formula 3]}$$

Since $V_{th}$ is less than or equal to 0, $V_{high} \geq V_{high}+V_{th}$ is satisfied. This indicates that the potential of the output terminal Out1 is lower than a high-level potential by the threshold voltage of the transistor Tr9. When the threshold voltage is 0 V, the potential of the output terminal Out1 is $V_{high}$.

As described above, a NOT circuit can be obtained without employing a CMOS structure by changing the potential of the back gate of the transistor Tr9 in accordance with a potential input to the input terminal In1.

A method for determining the amount of current flowing in the transistors Tr9 and Tr10 included in the NOT circuit 201 is not limited to the above. For example, a potential applied to the wiring BG9 after Time T2 may be, instead of $\Phi_2$, a potential higher than $\Phi_1$ and lower than $\Phi_2$. This is effective when the NOT circuit 201 does not need to be driven at high speed. In other words, when the NOT circuit 201 does not need to be driven at high speed, application of a potential higher than $\Phi_1$ and lower than $\Phi_2$ to the wiring BG9 can lead to a reduction in power consumption.

[NAND Circuit]

Figure 6B:
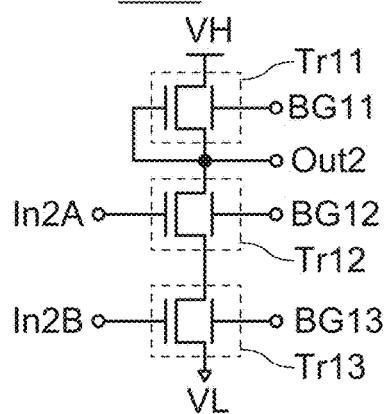

FIG. 6B illustrates a configuration example of a NAND circuit.

A NAND circuit 202A includes a transistor Tr11, a transistor Tr12, and a transistor Tr13. The channel width of the transistor Tr11 is smaller than the channel width of each of the transistors Tr12 and Tr13.

A gate of the transistor Tr13 is electrically connected to an input terminal In2B. A first terminal of the transistor Tr13 is electrically connected to a first terminal of the transistor Tr12. A second terminal of the transistor Tr13 is electrically connected to the wiring VL through which a low-level potential is applied. A gate of the transistor Tr12 is electrically connected to an input terminal In2A. A second terminal of the transistor Tr12 is electrically connected to a first terminal of the transistor Tr11, a gate of the transistor Tr11, and an output terminal Out2. A second terminal of the transistor Tr11 is electrically connected to the wiring VH through which a high-level potential is applied.

Next, an operation example of the NAND circuit 202A will be described.

FIG. 7B is a timing chart showing the operation example of the NAND circuit 202A. From Time T1 to Time T2, the NAND circuit 202A is in a standby state and the potential $\Phi_0$ is applied to wirings BG11 to BG13. That is, the transistors Tr11 to Tr13 each operate with the current-voltage characteristics of the transistor Tr[$\Phi_0$] shown in FIG. 3. Even when a high-level potential is input to the input terminal In2A and the input terminal In2B in this state, current does not flow between a source and a drain of each of the transistors Tr11 to Tr13 because the transistors Tr11 to Tr13 are in normally-off states. Thus, an undefined potential is output to the output terminal Out2. FIG. 7B shows this undefined potential of the output terminal Out2 with hatching.

After Time T2, the NAND circuit 202A is in operation. At Time T2, the potential $\Phi_2$ is applied to the wiring BG11 and the potential t is applied to the wiring BG12 and the wiring BG13. Thus, the transistor Tr11 operates with the current-voltage characteristics of the transistor Tr[$\Phi_2$] and the transistor Tr12 and the transistor Tr13 each operate with the current-voltage characteristics of the transistor Tr[$\Phi_1$] shown in FIG. 3. A high-level potential remains being input to the input terminal In2A and the input terminal In2B. Accordingly, current flows between the source and the drain of each of the transistors Tr12 and Tr13. The gate and first terminal of the transistor Tr11 have the same potential and the current-voltage characteristics of the transistor Tr11 are the current-voltage characteristics of the transistor Tr[$\Phi_2$] shown in FIG. 3; thus, the transistor Tr11 is in a conducting state. Since the channel width of the transistor Tr11 is smaller than the channel width of each of the transistor Tr12 and the transistor Tr13, the larger amount of current flows in the transistors Tr12 and Tr13 than in the transistor Tr11. Thus, the potential of the output terminal Out2 is affected by the potential of the wiring VL that is connected to the second terminal of the transistor Tr13; as a result, a low-level potential is output to the output terminal Out2.

At Time T3, a low-level potential is applied to the input terminal In2A and a high-level potential remains being applied to the input terminal In2B from before Time T3. The transistor Tr12 is in a non-conducting state because its current-voltage characteristics are the current-voltage characteristics of the transistor Tr[$\Phi_1$] shown in FIG. 3. Furthermore, the gate and first terminal of the transistor Tr11 have the same potential and the current-voltage characteristics of the transistor Tr11 are the current-voltage characteristics of the transistor Tr[$\Phi_2$]; accordingly, the transistor Tr11 is in a conducting state as it is before Time T3. Thus, the potential of the output terminal Out2 is affected by the potential of the wiring VH that is connected to the second terminal of the transistor Tr11; as a result, a potential output to the output terminal Out2 becomes a potential lower than a high-level potential by a threshold voltage $V_{th}$ of the transistor Tr11.

At Time T4, a high-level potential is applied to the input terminal In2A and a low-level potential is input to the input terminal In2B. The transistor Tr13 is in a non-conducting state because its current-voltage characteristics are the current-voltage characteristics of the transistor Tr[$\Phi_1$] shown in FIG. 3. Thus, a potential lower than a high-level potential by the threshold voltage $V_{th}$ of the transistor Tr11 remains being output to the output terminal Out2 from before Time T4.

At Time T5, a low-level potential is applied to the input terminal In2A, and a low-level potential remains being input to the input terminal In2B from before Time T5. Thus, the transistor Tr12 and the transistor Tr13 are each in a non-conducting state. Accordingly, a potential lower than a high-level potential by the threshold voltage $V_{th}$ of the transistor Tr11 remains being output to the output terminal Out2 from before Time T5.

At Time T6, a high-level potential is applied again to the input terminal In2A and the input terminal In2B. This state is the same as that from Time T2 to Time T3; thus, operation from Time T6 to Time T7 is the same as that from Time T2 to Time T3. This means that a low-level potential is output from the output terminal Out2 similarly to the case from Time T2 to Time T3.

Note that when the potential $\Phi_2$ is set to be a potential that makes the threshold voltage of the transistor Tr 0 V, a potential output to the output terminal Out2 can be increased to a high-level potential between Time T3 and Time T6. This means that when the potential $\Phi_2$ is set to be a potential that makes the threshold voltage of the transistor Tr 0 V, a potential output to the output terminal Out2 can be a high-level potential without decreasing by the threshold voltage.

As described above, a NAND circuit can be obtained without employing a CMOS structure by changing the potential of the back gate of the transistor Tr11 in accordance with potentials input to the input terminal In2A and the input terminal In2B.

A method for determining the amount of current flowing in the transistors Tr11 to Tr13 included in the NAND circuit 202A is not limited to the above. For example, a potential applied to the wiring BG11 after Time T2 may be, instead of $\Phi_2$, a potential higher than $\Phi_1$ and lower than $\Phi_2$. This is effective when the NAND circuit 202A does not need to be driven at high speed. In other words, when the NAND circuit 202A does not need to be driven at high speed, application of a potential higher than $\Phi_1$ and lower than $\Phi_2$ to the wiring BG11 can lead to a reduction in power consumption.

Figure 6C:
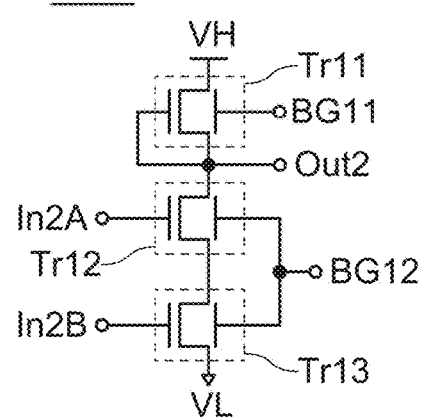

To apply the same potential to the wiring BG12 and the wiring BG13, a NAND circuit 202B illustrated in FIG. 6C may be employed. In the NAND circuit 202B, the back gate of the transistor Tr12 and the back gate of the transistor Tr13 are electrically connected to the wiring BG12. Accordingly, the threshold voltages of the transistor Tr12 and the transistor Tr13 can be adjusted at the same time by application of a potential through the wiring BG12.

[NOR Circuit]

Figure 6D:
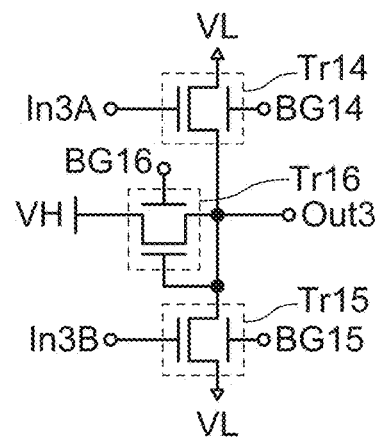

FIG. 6D illustrates a configuration example of a NOR circuit.

A NOR circuit 203A includes a transistor Tr14, a transistor Tr15, and a transistor Tr16. The channel width of the transistor Tr16 is smaller than the channel width of each of the transistors Tr14 and Tr15.

A gate of the transistor Tr14 is electrically connected to an input terminal In3A. A first terminal of the transistor Tr14 is electrically connected to a first terminal of the transistor Tr15, a first terminal of the transistor Tr16, a gate of the transistor Tr16, and an output terminal Out3. A second terminal of the transistor Tr14 is electrically connected to the wiring VL through which a low-level potential is applied. A gate of the transistor Tr15 is electrically connected to an input terminal In3B. A second terminal of the transistor Tr15 is electrically connected to the wiring VL through which a low-level potential is applied. A second terminal of the transistor Tr16 is electrically connected to the wiring VH through which a high-level potential is applied.

Next, an operation example of the NOR circuit 203A will be described.

FIG. 8 is a timing chart showing the operation example of the NOR circuit 203A. From Time T1 to Time T2, the NOR circuit 203A is in a standby state and the potential $\Phi_0$ is applied to wirings BG14 to BG16. That is, the transistors Tr14 to Tr16 each operate with the current-voltage characteristics of the transistor Tr[$\Phi_0$] shown in FIG. 3. Even when a high-level potential is input to both of the input terminals In3A and In3B in this state, current does not flow between a source and a drain of each of the transistors Tr14 to Tr16. Thus, an undefined potential is output to the output terminal Out3. FIG. 8 shows this undefined potential of the output terminal Out3 with hatching.

After Time T2, the NOR circuit 203A is in operation. At Time T2, the potential $\Phi_1$ is applied to the wiring BG14 and the wiring BG15 and the potential $\Phi_2$ is applied to the wiring BG16. Thus, the transistor Tr14 and the transistor Tr15 each operate with the current-voltage characteristics of the transistor Tr[$\Phi_1$] shown in FIG. 3. A high-level potential remains being input to the input terminal In3A and the input terminal In3B. Accordingly, current flows between the source and the drain of each of the transistors Tr14 and Tr15. The gate and first terminal of the transistor Tr16 have the same potential and the current-voltage characteristics of the transistor Tr16 are the current-voltage characteristics of the transistor Tr[$\Phi_2$] shown in FIG. 3; thus, the transistor Tr16 is in a conducting state. Since the channel width of the transistor Tr16 is smaller than the channel width of each of the transistors Tr14 and Tr15, the larger amount of current flows in the transistors Tr14 and Tr15 than in the transistor Tr16. Thus, the potential of the output terminal Out3 is affected by the potential of the wiring VL connected to the transistors Tr14 and Tr15; as a result, a low-level potential is output to the output terminal Out3.

At Time T3, a low-level potential is applied to the input terminal In3A and a high-level potential remains being applied to the input terminal In3B from before Time T3. The transistor Tr14 is brought into a non-conducting state because its current-voltage characteristics are the current-voltage characteristics of the transistor Tr[$\Phi_1$] shown in FIG. 3, and the transistor Tr15 is in a conducting state because its current-voltage characteristics are the current-voltage characteristics of the transistor Tr[$\Phi_1$] shown in FIG. 3. Furthermore, the transistor Tr16 is in a conducting state as it is before Time T3; thus, the potential of the output terminal Out3 from Time T3 to Time T4 is a low-level potential, which is the same as that from Time T2 to Time T3.

At Time T4, a high-level potential is applied to the input terminal In3A and a low-level potential is applied to the input terminal In3B. The transistor Tr14 is brought into a conducting state because its current-voltage characteristics are the current-voltage characteristics of the transistor Tr[$\Phi_1$] shown in FIG. 3, and the transistor Tr15 is brought into a non-conducting state because its current-voltage characteristics are the current-voltage characteristics of the transistor Tr[$\Phi_1$] shown in FIG. 3. Furthermore, the transistor Tr16 is in a conducting state as it is before Time T3; thus, the potential of the output terminal Out3 from Time T4 to Time T5 is a low-level potential, which is the same as that from Time T2 to Time T3 or that from Time T3 to Time T4.

At Time T5, a low-level potential is applied to the input terminal In3A and a low-level potential remains being applied to the input terminal In3B from before Time T3. The transistors Tr14 and Tr15 are each brought into a non-conducting state because their current-voltage characteristics are the current-voltage characteristics of the transistor Tr[$\Phi_1$] shown in FIG. 3. Furthermore, the gate and first terminal of the transistor Tr16 have the same potential and the current-voltage characteristics of the transistor Tr16 are the current-voltage characteristics of the transistor Tr[$\Phi_2$]; accordingly, the transistor Tr16 is in a conducting state as it is before Time T3. Thus, the potential of the output terminal Out3 is affected by the potential of the wiring VH that is connected to the second terminal of the transistor Tr16; as a result, a potential output to the output terminal Out3 becomes a potential lower than a high-level potential by a threshold voltage $V_{th}$ of the transistor Tr16.

At Time T6, a high-level potential is applied again to the input terminal In3A and the input terminal In3B. This state is the same as that from Time T2 to Time T3; thus, operation from Time T6 to Time T7 is the same as that from Time T2 to Time T3. This means that a low-level potential is output from the output terminal Out3 similarly to the case from Time T2 to Time T3.

Note that when the potential $\Phi_2$ is set to be a potential that makes the threshold voltage of the transistor Tr 0 V, a potential output to the output terminal Out3 can be increased to a high-level potential between Time T5 and Time T6. This means that when the potential $\Phi_2$ is set to be a potential that makes the threshold voltage of the transistor Tr 0 V, a potential output to the output terminal Out3 can be a high-level potential without decreasing by the threshold voltage.

As described above, a NOR circuit can be obtained without employing a CMOS structure by changing the potential of the back gate of the transistor Tr16 in accordance with potentials input to the input terminal In3A and the input terminal In3B.

A method for determining the amount of current flowing in the transistors Tr14 to Tr16 included in the NOR circuit 203A is not limited to the above. For example, a potential applied to the wiring BG16 after Time T2 may be, instead of $\Phi_2$, a potential higher than $\Phi_1$ and lower than $\Phi_2$. This is effective when the NOR circuit 203A does not need to be driven at high speed. In other words, when the NOR circuit 203A does not need to be driven at high speed, application of a potential higher than $\Phi_1$ and lower than $\Phi_2$ to the wiring BG16 can lead to a reduction in power consumption.

Figure 6E:
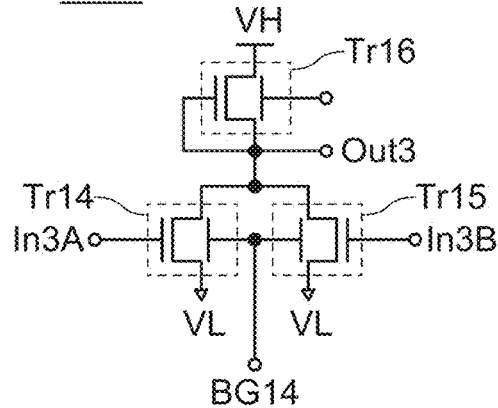

To apply the same potential to the wiring BG14 and the wiring BG15, a NOR circuit 203B illustrated in FIG. 6E may be employed. In the NOR circuit 203B, the back gate of the transistor Tr14 and the back gate of the transistor Tr15 are electrically connected to the wiring BG14. Accordingly, the threshold voltages of the transistor Tr14 and the transistor Tr15 can be adjusted at the same time by application of a potential through the wiring BG14.

<<Decoder Circuit>>

Figure 9:
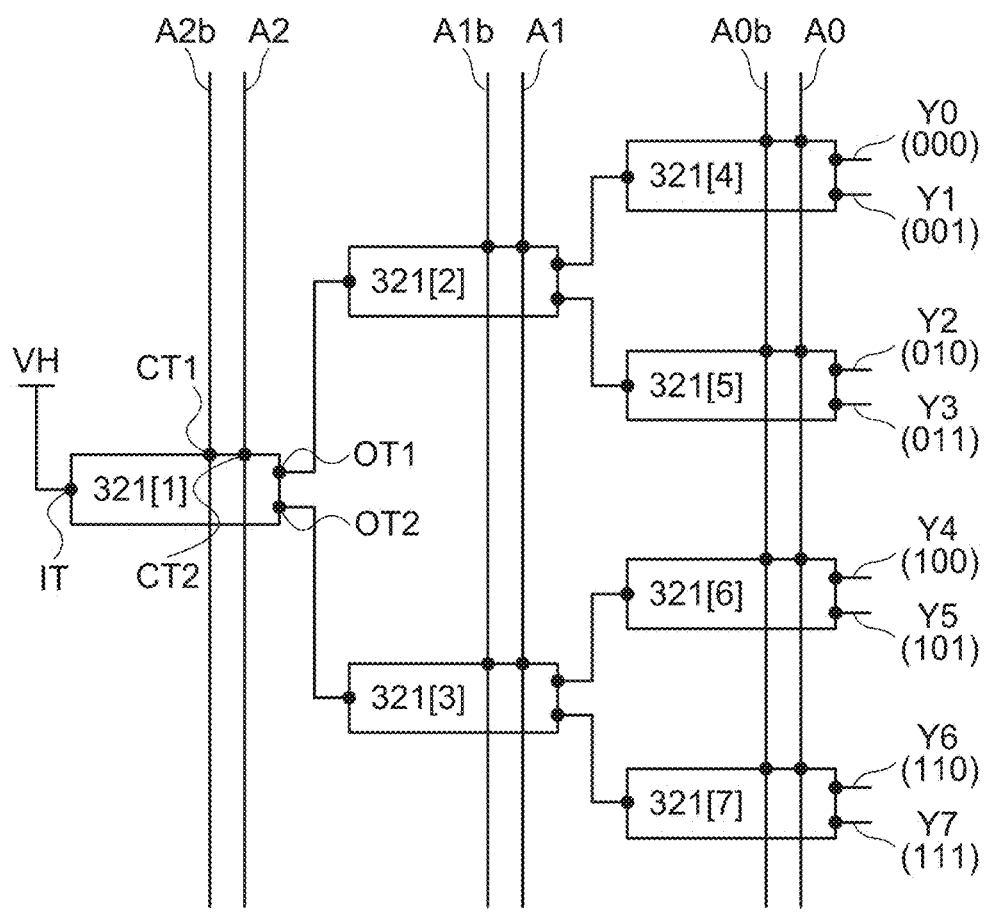
FIG. 9 is a block diagram illustrating a configuration example of a semiconductor device.

FIG. 9 illustrates a configuration example of a decoder circuit. A decoder circuit 401 is a circuit that outputs a signal from one of eight output terminals depending on a 3-bit control signal. The decoder circuit 401 includes selector circuits 321[1] to 321[7], external input terminals A0, A0b, A1, A1b, A2, and A2b, and external output terminals Y0, Y1, Y2, Y3, Y4, Y5, Y6, and Y7.

In this specification, the selector circuits 321[1] to 321[7] and a selector circuit 321[a] (a is an integer greater than or equal to 8) that will be described later are collectively referred to as a selector circuit 321.

In FIG. 9, the external output terminals Y0 to Y7 are provided with the binary numbers 000 to 111 in parentheses.

An inverted signal of a signal input to the external input terminal A0 is input to the external input terminal A0b. For example, when a high-level potential is input to the external input terminal A0, a low-level potential is input to the external input terminal A0b. Similarly, an inverted signal of a signal input to the external input terminal A1 is input to the external input terminal A1b, and an inverted signal of a signal input to the external input terminal A2 is input to the external input terminal A2b. As described above, when an external input terminal through which a signal is supplied and an external input terminal through which an inverted signal of the signal is supplied are regarded as a pair, the decoder circuit 401 includes three pairs of external input terminals.

Each of the selector circuits 321[1] to 321[7] includes an input terminal IT, an output terminal OT1, an output terminal OT2, a control terminal CT1, and a control terminal CT2. Note that symbols for these terminals are provided only in the selector circuit 321[1] in FIG. 9 and are omitted in the selector circuits 321[2] to 321[7].

The selector circuits 321[1] to 321[7] each have a function of outputting a signal input to the input terminal IT to the output terminal OT1 when a high-level potential is applied to the control terminal CT1 (or when a low-level potential is applied to the control terminal CT2). Furthermore, the selector circuits 321[1] to 321[7] each have a function of outputting a signal input to the input terminal IT to the output terminal OT2 when a high-level potential is applied to the control terminal CT2 (or when a low-level potential is applied to the control terminal CT1).

The input terminal IT of the selector circuit 321[1] is electrically connected to the wiring VH through which a high-level potential is applied. The control terminal CT1 of the selector circuit 321[1] is electrically connected to the external input terminal A2b. The control terminal CT2 of the selector circuit 321[1] is electrically connected to the external input terminal A2. The output terminal OT1 of the selector circuit 321[1] is electrically connected to the input terminal IT of the selector circuit 321[2]. The output terminal OT2 of the selector circuit 321[1] is electrically connected to the input terminal IT of the selector circuit 321[3]. Note that depending on circumstances or conditions, the input terminal IT of the selector circuit 321[1] may be electrically connected not to the wiring VH through which a high-level potential is applied but to a wiring through which a low-level potential is applied.

The control terminals CT1 of the selector circuits 321[2] and 321[3] are electrically connected to the external input terminal A1b. The control terminals CT2 of the selector circuits 321[2] and 321[3] are electrically connected to the external input terminal A1. The output terminal OT1 of the selector circuit 321[2] is electrically connected to the input terminal IT of the selector circuit 321[4]. The output terminal OT2 of the selector circuit 321[2] is electrically connected to the input terminal IT of the selector circuit 321[5]. The output terminal OT1 of the selector circuit 321[3] is electrically connected to the input terminal IT of the selector circuit 321[6]. The output terminal OT2 of the selector circuit 321[3] is electrically connected to the input terminal IT of the selector circuit 321[7].

The control terminals CT1 of the selector circuits 321[4] to 321[7] are electrically connected to the external input terminal A0b. The control terminals CT2 of the selector circuits 321[4] to 321[7] are electrically connected to the external input terminal A0. The output terminal OT1 of the selector circuit 321[4] is electrically connected to the external output terminal Y0. The output terminal OT2 of the selector circuit 321[4] is electrically connected to the external output terminal Y1. The output terminal OT1 of the selector circuit 321[5] is electrically connected to the external output terminal Y2. The output terminal OT2 of the selector circuit 321[5] is electrically connected to the external output terminal Y3. The output terminal OT1 of the selector circuit 321[6] is electrically connected to the external output terminal Y4. The output terminal OT2 of the selector circuit 321[6] is electrically connected to the external output terminal Y5. The output terminal OT1 of the selector circuit 321[7] is electrically connected to the external output terminal Y6. The output terminal OT2 of the selector circuit 321[7] is electrically connected to the external output terminal Y7.

Since the decoder circuit 401 includes three pairs of external input terminals as described above, the selector circuits 321[1] to 321[7] are divided into three columns. The decoder circuit 401 includes $2^{n-1}$ selector circuits 321 in the n-th column (here, n is an integer greater than or equal to 1 and less than or equal to 3). The input terminal IT of the selector circuit 321[1] in the first column is electrically connected to the wiring VH through which a high-level potential is applied. The output terminals OT1 and OT2 of the selector circuits 321[4] to 321[7] in the third column are electrically connected to the external output terminals Y0 to Y7.

The decoder circuit 401 has a configuration with which a high-level potential is output from one of the external output terminals Y0 to Y7 when potentials are applied to the external input terminals A0, A0b, A1, A1b, A2, and A2b.

When a high-level potential is input to the external input terminals A0 and A2 and a low-level potential is input to the external input terminal A1, a low-level potential is input to the external input terminals A0b and A2b and a high-level potential is input to the external input terminal A1b, for example. In this case, the selector circuit 321[1] outputs a signal from the output terminal OT2, the selector circuit 321[3] outputs a signal from the output terminal OT1, and the selector circuit 321[6] outputs a signal from the output terminal OT2. In other words, when a high-level potential, a low-level potential, and a high-level potential are input to the external input terminal A0, the external input terminal A1, and the external input terminal A2, respectively, the external output terminal Y5 is selected and a high-level potential is applied from the wiring VH to the external output terminal Y5.

Here, when a high-level potential is expressed by "1" and a low-level potential is expressed by "0," it can be said that potentials "1," "0," and "1" are input to the external input terminals A2, A1, and A0, respectively, in the case of the above example. This means that external input potentials "1," "0," and "1" correspond to the numbers in parentheses for the external output terminal Y5, i.e., (101). When potential levels of the external input terminals A2, A1, and A0 are expressed in this order by "1" or "0" in the above manner, it is possible to determine from the binary number which one of the external output terminals Y0 to Y7 outputs a high-level potential.

As described above, the combination of a high-level potential and a low-level potential input to the external input terminals A2, A1, and A0 can be used to select one of the external output terminals Y0 to Y7 from which a high-level potential is output.

Here, circuit configurations of the selector circuits 321[1] to 321[7] will be described.

Figure 10A:
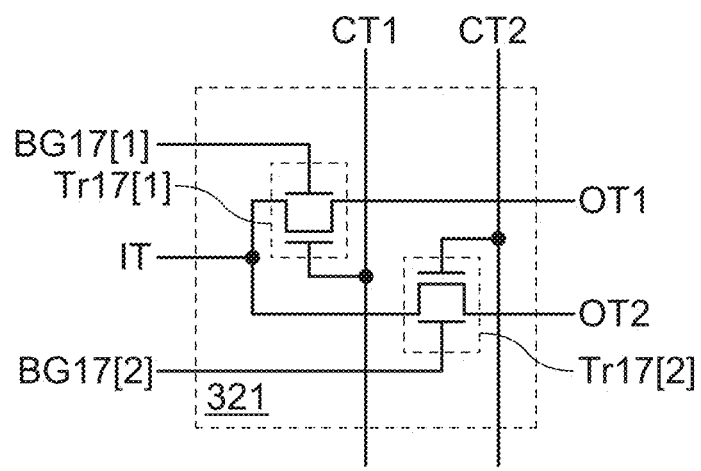
FIGS. 10A and 10B are circuit diagrams each illustrating a configuration example of a semiconductor device.

FIG. 10A illustrates the circuit configuration of the selector circuit 321. The selector circuit 321 includes a transistor Tr17[1] and a transistor Tr17[2].

A first terminal of the transistor Tr17[1] is electrically connected to the input terminal IT and a first terminal of the transistor Tr17[2]. A second terminal of the transistor Tr17[1] is electrically connected to the output terminal OT1. A gate of the transistor Tr17[1] is electrically connected to the control terminal CT1. A second terminal of the transistor Tr17[2] is electrically connected to the output terminal OT2. A gate of the transistor Tr17[2] is electrically connected to the control terminal CT2. A back gate of the transistor Tr17[1] is electrically connected to a wiring BG17[1]. A back gate of the transistor Tr17[2] is electrically connected to a wiring BG17[2].

As described above, an inverted signal of a signal input to the control terminal CT2 is input to the control terminal CT1. As a result, one of the transistor Tr17[1] and the transistor Tr17[2] can be brought into a conducting state and the other can be brought into a non-conducting state. Accordingly, a signal input to the input terminal IT can be output to one of the output terminal OT1 and the output terminal OT2 depending on signals from the control terminal CT1 and the control terminal CT2.

During the operation of the decoder circuit 401, one of the transistor Tr17[1] and the transistor Tr17[2] in the selector circuit 321 is brought into a conducting state and the other of the transistor Tr17[1] and the transistor Tr17[2] is brought into a non-conducting state. The transistor in a conducting state preferably operates with the current-voltage characteristics of the transistor $Tr[\Phi_1]$ and the transistor in a non-conducting state preferably operates with the current-voltage characteristics of the transistor $Tr[\Phi_0]$. In other words, a potential at which one of the transistor Tr17[1] and the transistor Tr17[2] operates with the current-voltage characteristics of the transistor $Tr[\Phi_1]$ is preferably applied from one of the wiring BG17[1] and the wiring BG17[2] to the back gate of one of the transistor Tr17[1] and the transistor Tr17[2], and a potential at which the other of the transistor Tr17[1] and the transistor Tr17[2] operates with the current-voltage characteristics of the transistor $Tr[\Phi_0]$ is preferably applied from the other of the wiring BG17[1] and the wiring BG17[2] to the back gate of the other of the transistor Tr17[1] and the transistor Tr17[2].

As described above, when a predetermined potential is applied to the back gate of each of the transistors Tr17[1] and Tr17[2], the conducting/non-conducting states of the transistors Tr17[1] and Tr17[2] or the amount of current flowing in the transistor Tr17[1] and that in the transistor Tr17[2] can be determined.

Figure 10B:
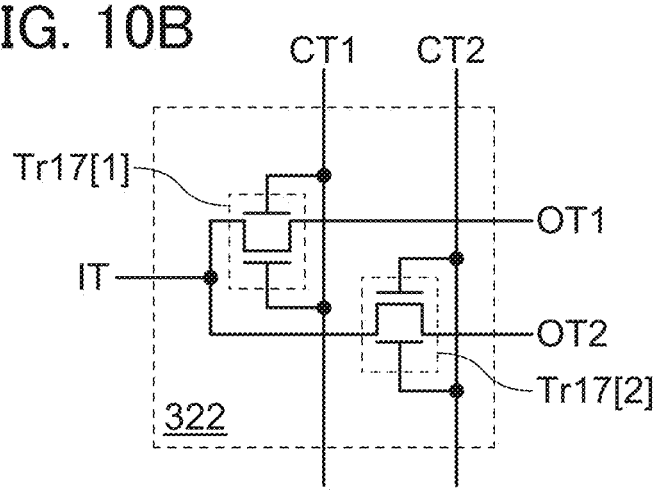

To increase the amount of current flowing in the transistors Tr17[1] and Tr17[2], a selector circuit 322 illustrated in FIG. 10B may be used instead of the selector circuit 321. In the selector circuit 322, the back gate of the transistor Tr17[1] is electrically connected to the control terminal CT1 and the back gate of the transistor Tr17[2] is electrically connected to the control terminal CT2. The other connection structures in the selector circuit 322 are the same as those in the selector circuit 321 except that the back gate of the transistor Tr17[1] and the back gate of the transistor Tr17[2] are not connected to the wiring BG17[1] and the wiring BG17[2]. Such a configuration can increase, when the transistor Tr17[1] or the transistor Tr17[2] is in a conducting state, the source-drain current of the transistor in a conducting state.

Note that the decoder circuit of one embodiment of the present invention is not limited to the decoder circuit 401 illustrated in FIG. 9. Although the number of external output terminals of the decoder circuit 401 illustrated in FIG. 9 is $2^3$, the number of external output terminals may be $2^k$ (k is an integer greater than or equal to 1, where k is not 3). In that case, the number of the selector circuits 321 is $2^k-1$ and the number of external input terminals is 2k; the connection structure has a perfect binary tree structure.

Figure 11:
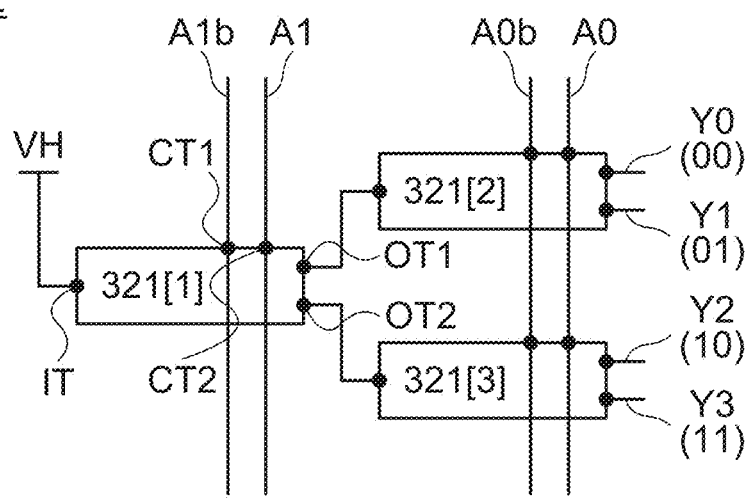
FIG. 11 is a block diagram illustrating a configuration example of a semiconductor device.

When k is 2, for example, a decoder circuit 402 illustrated in FIG. 11 is obtained. The decoder circuit 402 includes the selector circuits 321[1] to 321[3], four external input terminals (external input terminals A0, A0b, A1, and A1b), and four external output terminals (external output terminals Y0, Y1, Y2, and Y3). Note that symbols for the input terminal IT, the output terminal OT1, the output terminal OT2, the control terminal CT1, and the control terminal CT2 are provided only in the selector circuit 321[1] in FIG. 11 and are omitted in the selector circuits 321[2] and 321[3]. Since the decoder circuit 402 includes two pairs of external input terminals, the selector circuits 321[1] to 321[3] are divided into two columns. The decoder circuit 402 includes $2^{n-1}$ selector circuits 321 in the n-th column (here, n is an integer greater than or equal to 1 and less than or equal to 2). The input terminal IT of the selector circuit 321[1] in the first column is electrically connected to the wiring VH through which a high-level potential is applied. The output terminals OT1 and OT2 of the selector circuits 321[2] and 321[3] in the second column are electrically connected to the external output terminals Y0 to Y3. In FIG. 11, the external output terminals Y0 to Y3 are provided with the binary numbers 00 to 11 in parentheses. In a manner similar to that described above, in the binary number, the first number from the left expresses the potential level of the external input terminal A1 and the second number from the left expresses the potential level of the external input terminal A0.

During the operation of the decoder circuit 402, one of the transistor Tr17[1] and the transistor Tr17[2] in the selector circuit 321 is brought into a conducting state and the other of the transistor Tr17[1] and the transistor Tr17[2] is brought into a non-conducting state. The transistor in a conducting state preferably operates with the current-voltage characteristics of the transistor Tr[$\Phi_1$] and the transistor in a non-conducting state preferably operates with the current-voltage characteristics of the transistor Tr[$\Phi_0$]. In other words, a potential at which one of the transistor Tr17[1] and the transistor Tr17[2] operates with the current-voltage characteristics of the transistor Tr[$\Phi_1$] is preferably applied from one of the wiring BG17[1] and the wiring BG17[2] to the back gate of one of the transistor Tr17[1] and the transistor Tr17[2], and a potential at which the other of the transistor Tr17[1] and the transistor Tr17[2] operates with the current-voltage characteristics of the transistor Tr[$\Phi_0$] is preferably applied from the other of the wiring BG17[1] and the wiring BG17[2] to the back gate of the other of the transistor Tr17[1] and the transistor Tr17[2].

As described above, when a predetermined potential is applied to the back gate of each of the transistors Tr17[1] and Tr17[2], the conducting/non-conducting states of the transistors Tr17[1] and Tr17[2] or the amount of current flowing in the transistor Tr17[1] and that in the transistor Tr17[2] can be determined.

Figure 12:
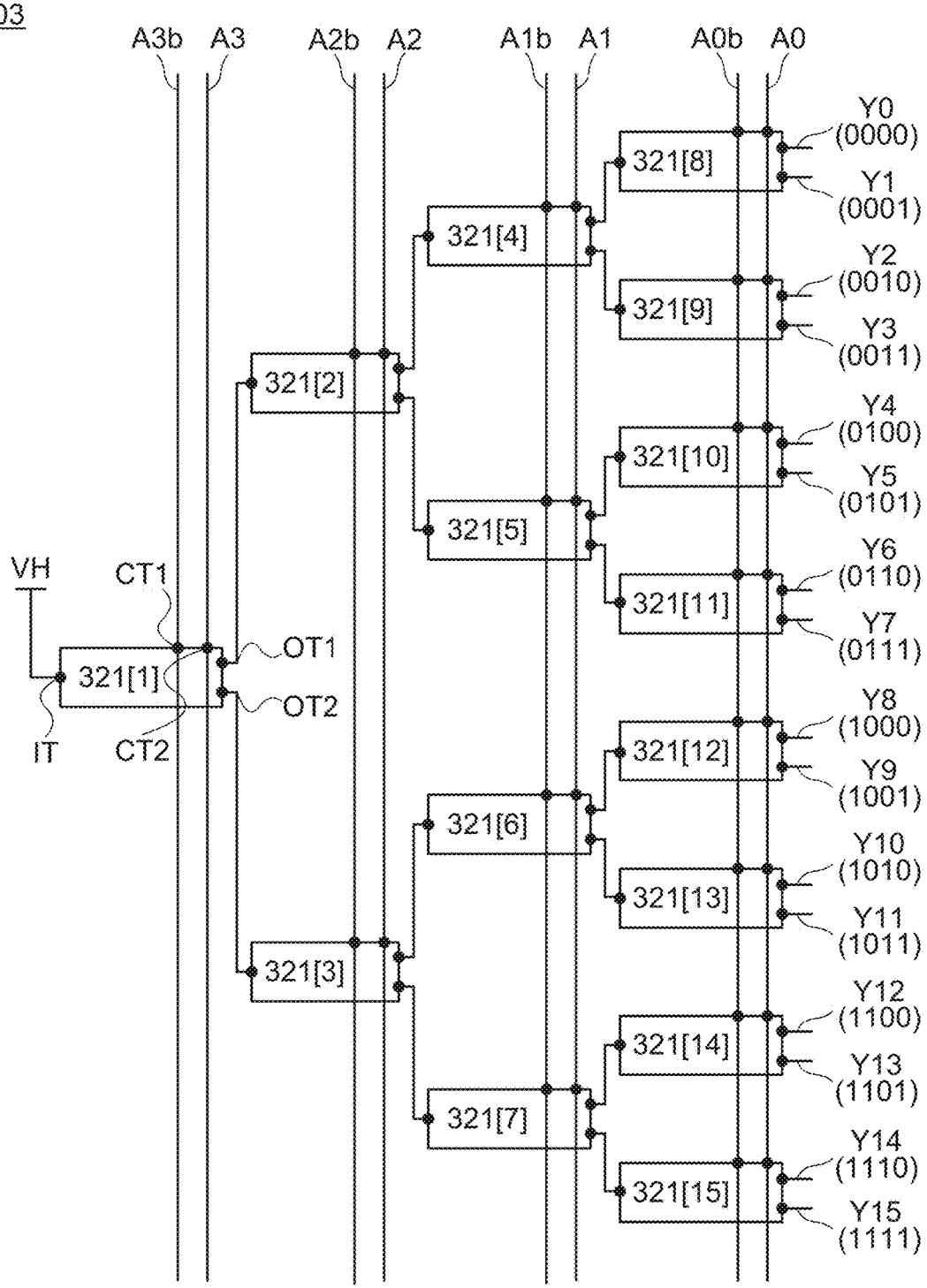
FIG. 12 is a block diagram illustrating a configuration example of a semiconductor device.

When k is 4, for example, a decoder circuit 403 illustrated in FIG. 12 is obtained. The decoder circuit 403 includes selector circuits 321[1] to 321[15], eight external input terminals (external input terminals A0, A0b, A1, A1b, A2, A2b, A3, and A3b), and 16 external output terminals (external output terminals Y0, Y1, Y2, Y3, Y4, Y5, Y6, Y7, Y8, Y9, Y10, Y11, Y12, Y13, Y14, and Y15). Note that symbols for the input terminal IT, the output terminal OT1, the output terminal OT2, the control terminal CT1, and the control terminal CT2 are provided only in the selector circuit 321[1] in FIG. 12 and are omitted in the selector circuits 321[2] to 321[15]. Since the decoder circuit 403 includes four pairs of external input terminals, the selector circuits 321[1] to 321[15] are divided into four columns. The decoder circuit 403 includes $2^{n-1}$ selector circuits 321 in the n-th column (here, n is an integer greater than or equal to 1 and less than or equal to 4). The input terminal IT of the selector circuit 321[1] in the first column is electrically connected to the wiring VH through which a high-level potential is applied. The output terminals OT1 and OT2 of the selector circuits 321[8] to 321[15] in the fourth column are electrically connected to the external output terminals Y0 to Y15. In FIG. 12, the external output terminals Y0 to Y15 are provided with the binary numbers 0000 to 1111 in parentheses. In a manner similar to that described above, in the binary number, the first number from the left expresses the potential level of the external input terminal A3, the second number from the left expresses the potential level of the external input terminal A2, the third number from the left expresses the potential level of the external input terminal A1, and the fourth number from the left expresses the potential level of the external input terminal A0.

During the operation of the decoder circuit 403, one of the transistor Tr17[1] and the transistor Tr17[2] in the selector circuit 321 is brought into a conducting state and the other of the transistor Tr17[1] and the transistor Tr17[2] is brought into a non-conducting state. The transistor in a conducting state preferably operates with the current-voltage characteristics of the transistor Tr[$\Phi_1$] and the transistor in a non-conducting state preferably operates with the current-voltage characteristics of the transistor Tr[$\Phi_0$]. In other words, a potential at which one of the transistor Tr17[1] and the transistor Tr17[2] operates with the current-voltage characteristics of the transistor Tr[$\Phi_1$] is preferably applied from one of the wiring BG17[1] and the wiring BG17[2] to the back gate of one of the transistor Tr17[1] and the transistor Tr17[2], and a potential at which the other of the transistor Tr17[1] and the transistor Tr17[2] operates with the current-voltage characteristics of the transistor Tr[$\Phi_0$] is preferably applied from the other of the wiring BG17[1] and the wiring BG17[2] to the back gate of the other of the transistor Tr17[1] and the transistor Tr17[2].

As described above, when a predetermined potential is applied to the back gate of each of the transistors Tr17[1] and Tr17[2], the conducting/non-conducting states of the transistors Tr17[1] and Tr17[2] or the amount of current flowing in the transistor Tr17[1] and that in the transistor Tr17[2] can be determined.

Figure 13:
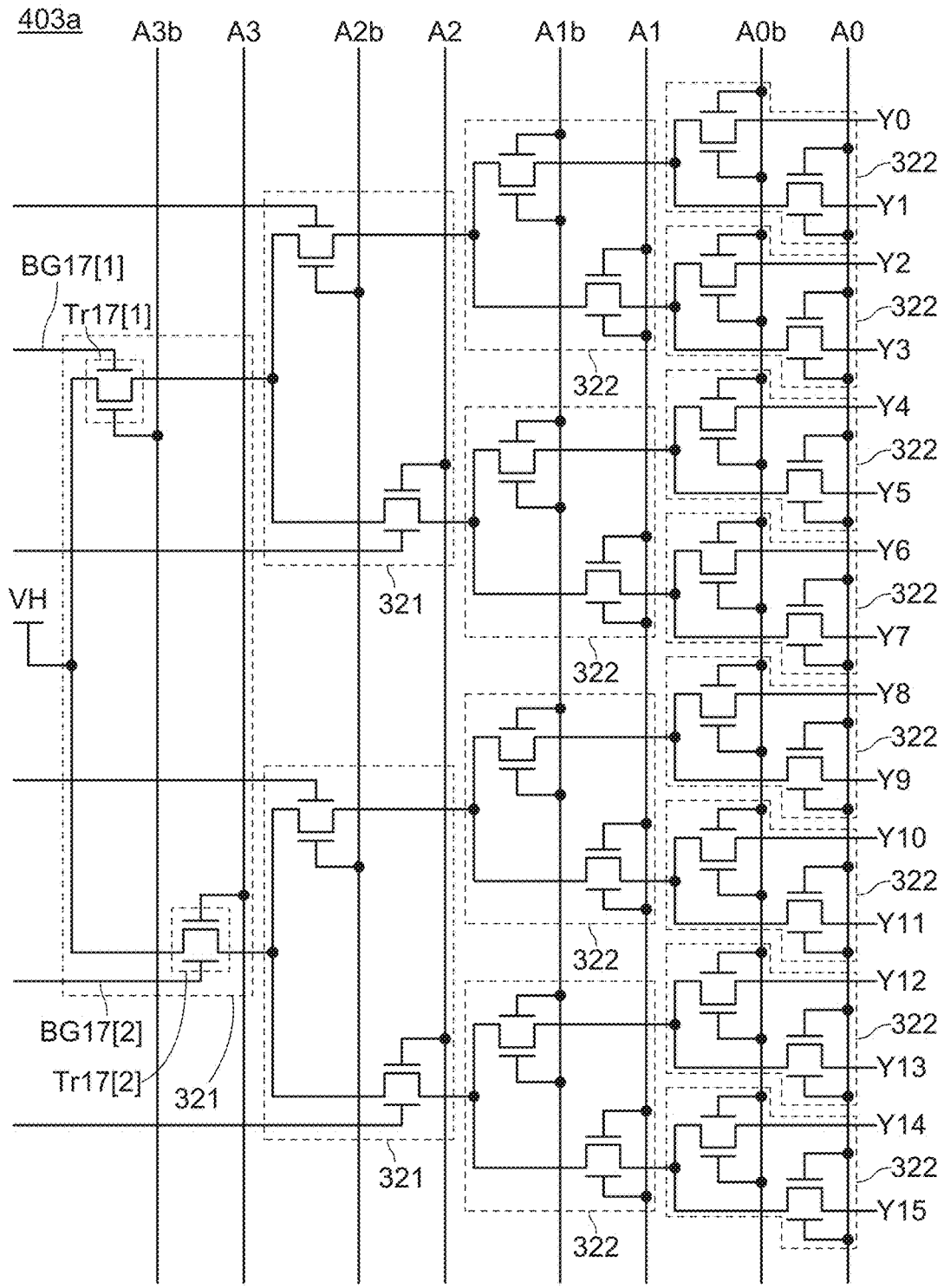
FIG. 13 is a circuit diagram illustrating a configuration example of a semiconductor device.

FIG. 13 illustrates the configuration example of a decoder circuit utilizing the above principles. A decoder circuit 403a is, similarly to the decoder circuit 403, a decoder circuit obtained when k is 4. Note that the binary numbers provided for the external output terminals Y0 to Y15 of the decoder circuit 403 illustrated in FIG. 12 are omitted in the decoder circuit 403a illustrated in FIG. 13. The decoder circuit 403a is different from the decoder circuit 403 in that selector circuits connected to the external input terminals A0, A0b, A1, and A1b are the selector circuits 322. In the decoder circuit 403a, the selector circuits 321 are provided on a side closer to the wiring VH that is electrically connected to a high potential power source, and the selector circuits 322 are provided on a side closer to the external output terminals Y0 to Y15.

In the case of a decoder circuit like the decoder circuits 401 to 403, the larger the number of external output terminals is, the larger the number of the selector circuits 321 for selecting an external output terminal is, inevitably. In that case, when current flows from the high potential power source to one of the external output terminals, voltage output from one of the external output terminals might be lower than the voltage of the wiring VH.

When the selector circuits 322 are provided on the side closer to the external output terminals in the decoder circuit 403a, the reduction in voltage can be prevented. Since the gate and the back gate of the transistor included in the selector circuit 322 are electrically connected to each other, the transistor can have high on-state current when being in a conducting state. In addition, a voltage drop in the transistor can be reduced; thus, a signal from the high potential power source can be supplied to one of the external output terminals Y0 to Y15 without decay.

Note that the number of the selector circuits 321 and the number of the selector circuits 322 are not limited to those for the decoder circuit 403a, and may be changed depending on circumstances or conditions. For example, all of the selector circuits 321[1] to 321[15] included in the decoder circuit 403 may be replaced by the selector circuits 322. In a decoder circuit obtained when k is not 4, a predetermined number of the selector circuits 322 may be provided and the other selector circuits may be the selector circuits 321.

Note that the decoder circuit of one embodiment of the present invention is not limited to the decoder circuit 401 illustrated in FIG. 9, the decoder circuit 402 illustrated in FIG. 11, or the decoder circuit 403 illustrated in FIG. 12. Although the above decoder circuits include $2^k$ external output terminals, the number of external output terminals is not necessarily $2^k$. When the number of external output terminals is p, where p is an integer greater than $2^k$ and less than $2^{k+1}$, a decoder circuit including $2^{k+1}$ external output terminals may be designed first and then the selector circuits 321 may be removed from the decoder circuit until the number of external output terminals becomes p.

Figure 14:
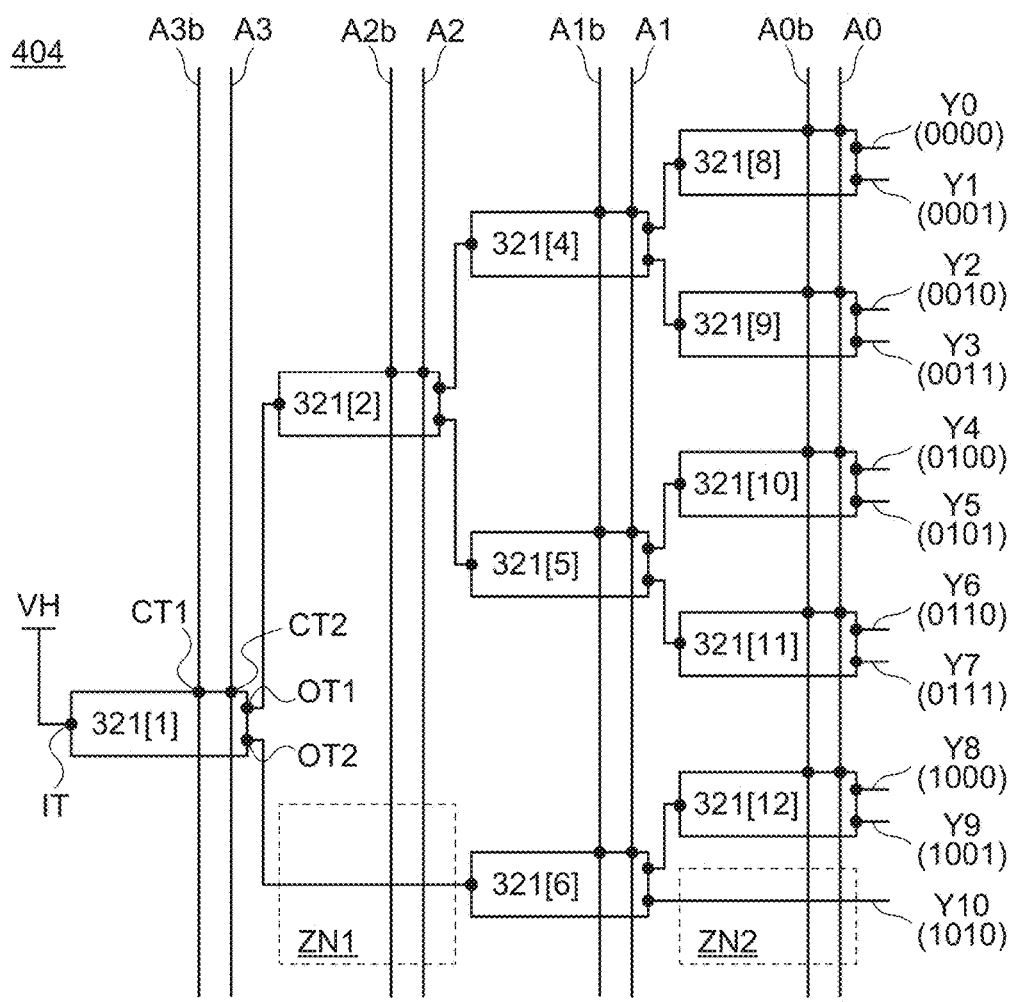
FIG. 14 is a block diagram illustrating a configuration example of a semiconductor device.

FIG. 14 illustrates a decoder circuit including 11 external output terminals, for example. A decoder circuit 404 includes the selector circuit 321[1], the selector circuit 321[2], the selector circuits 321[4] to 321[6], the selector circuits 321[8] to 321[12], eight external input terminals (external input terminals A0, A0b, A1, A1b, A2, A2b, A3, and A3b), and 11 external output terminals (external output terminals Y0, Y1, Y2, Y3, Y4, Y5, Y6, Y7, Y8, Y9, and Y10). Note that symbols for the input terminal IT, the output terminal OT1, the output terminal OT2, the control terminal CT1, and the control terminal CT2 are provided only in the selector circuit 321[1] in FIG. 14 and are omitted in the other selector circuits. The decoder circuit 404 has a configuration in which five selector circuits 321 (i.e., the selector circuits 321[2], 321[7], 321[13], 321[14], and 321[15]) are removed from the above-described decoder circuit 403 including $2^4$ external output terminals. Similarly to the decoder circuit 403, the decoder circuit 404 includes four pairs of external input terminals and the selector circuits are divided into four columns: the selector circuit 321[1], the selector circuit 321[2], the selector circuits 321[4] to 321[6], and the selector circuits 321[8] to 321[12]. The input terminal IT of the selector circuit 321[1] in the first column is electrically connected to the wiring VH through which a high-level potential is applied. The output terminals OT1 and OT2 of the selector circuits 321[8] to 321[12] in the fourth column and the output terminal OT2 of the selector circuit 321[6] in the third column are electrically connected to the external output terminals Y0 to Y10. In FIG. 14, the external output terminals Y0 to Y10 are provided with the binary numbers 0000 to 1010 in parentheses. In a manner similar to that described above, in the binary number, the first number from the left expresses the potential level of the external input terminal A3, the second number from the left expresses the potential level of the external input terminal A2, the third number from the left expresses the potential level of the external input terminal A1, and the fourth number from the left expresses the potential level of the external input terminal A0.

Note that in the case where a signal is transmitted from the wiring VH to an external output terminal through a region (a region ZN1 or a region ZN2 in FIG. 14) which is not provided with the selector circuit 321 and is not electrically connected to the external input terminals, the corresponding digit becomes "0" regardless of the potentials of the external input terminals. For example, since there is no transistor switching by the potentials of the external input terminals A2 and A2b in the region ZN1, the second number from the left of the binary number for an external output terminal from which a signal is output is "0." This means that the second number from the left of each of the binary numbers for the external output terminals Y8, Y9, and Y10 is "0." For another example, since there is no transistor switching by the potentials of the external input terminals A0 and A0b in the region ZN2, the fourth number from the left of the binary number for an external output terminal from which a signal is output is "0." This means that the fourth number from the left of the binary number for the external output terminal Y10 is "0." As described above, in the case where there is a column including a region with no selector circuit 321 and a signal is transmitted through the region, the corresponding external output terminal can be expressed by a binary number in a manner similar to that of the decoder circuit 403 when the corresponding digit for the region is regarded as "0."

During the operation of the decoder circuit 404, one of the transistor Tr17[1] and the transistor Tr17[2] in the selector circuit 321 is brought into a conducting state and the other of the transistor Tr17[1] and the transistor Tr17[2] is brought into a non-conducting state. The transistor in a conducting state preferably operates with the current-voltage characteristics of the transistor Tr[$\Phi_1$] and the transistor in a non-conducting state preferably operates with the current-voltage characteristics of the transistor Tr[$\Phi_0$]. In other words, a potential at which one of the transistor Tr17[1] and the transistor Tr17[2] operates with the current-voltage characteristics of the transistor Tr[$\Phi_1$] is preferably applied from one of the wiring BG17[1] and the wiring BG17[2] to the back gate of one of the transistor Tr17[1] and the transistor Tr17[2], and a potential at which the other of the transistor Tr17[1] and the transistor Tr17[2] operates with the current-voltage characteristics of the transistor Tr[$\Phi_0$] is preferably applied from the other of the wiring BG17[1] and the wiring BG17[2] to the back gate of the other of the transistor Tr17[1] and the transistor Tr17[2].

As described above, when a predetermined potential is applied to the back gate of each of the transistors Tr17[1] and Tr17[2], the conducting/non-conducting states of the transistors Tr17[1] and Tr17[2] or the amount of current flowing in the transistor Tr17[1] and that in the transistor Tr17[2] can be determined.

A method for determining the amount of current flowing in the transistors Tr17[1] and Tr17[2] included in the decoder circuits 401 to 404 is not limited to the above. For example, to increase the potential of a signal to be output, the potential of the back gate of one of the transistor Tr17[1] and the transistor Tr17[2] that is in a conducting state in the selector circuit 321 can be set at a potential higher than the potential $\Phi_1$ so that the amount of current flowing in the transistor is increased. To reduce the potential of a signal to be output, for example, the potential of the back gate of one of the transistor Tr17[1] and the transistor Tr17[2] that is in a conducting state in the selector circuit 321 can be set at a potential lower than the potential $\Phi_1$ so that the amount of current flowing in the transistor is reduced.

In some cases, a signal output from the selector circuit 321 in the n-th column or in a column near the n-th column has a lower potential than a signal output from the selector circuit 321[1] in the first column does. This is because a transistor in a column closer to the external output terminals has a smaller area; thus, in particular, when the channel width of a transistor is small, the amount of current flowing therein is small. It is also because the potential of a signal transmitted from the wiring VH to the external output terminal is decreased by the wiring resistance and the internal resistance of the selector circuit. In contrast, a transistor in the first column or in a column near the first column can have a large area; thus, in particular, when the channel width of a transistor is large, the amount of current flowing therein is large.

As described above, the amount of current flowing in the selector circuits 321 in the first column and a column near the first column might be different from the amount of current flowing in the selector circuits 321 in the n-th column and a column near the n-th column. In that case, the amount of current flowing in the entire decoder circuit can be kept constant in the following manner: in each of the selector circuits 321 in the first column and a column near the first column, the potential of the back gate of one of the transistor Tr17[1] and the transistor Tr17[2] that is in a conducting state is set at a potential lower than the potential $\Phi_1$ to reduce the amount of current flowing in the transistor, and in each of the selector circuits 321 in the n-th column and a column near the n-th column, the potential of the back gate of one of the transistor Tr17[1] and the transistor Tr17[2] that is in a conducting state is set at a potential higher than the potential $\Phi_1$ to increase the amount of current flowing in the transistor. In the above manner, it is also possible to prevent a reduction in the potential of a signal in the selector circuits 321 in the n-th column and a column near the n-th column.

<<Row Driver Circuit>>

Figure 15:
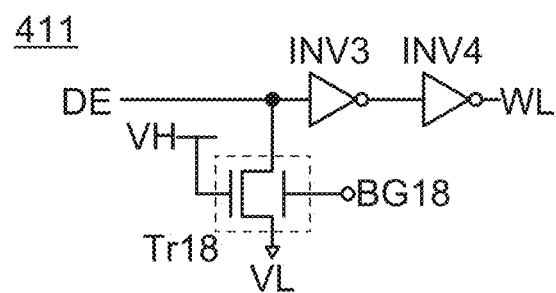
FIG. 15 is a circuit diagram illustrating a configuration example of a semiconductor device.

FIG. 15 illustrates a configuration example of a row driver circuit. A row driver circuit 411 includes a transistor Tr18, an inverter circuit INV3, and an inverter circuit INV4.

Since all transistors included in the memory device of one embodiment of the present invention are n-channel transistors, transistors included in the inverter circuits INV3 and INV4 are n-channel transistors. As an inverter circuit in which all transistors are n-channel transistors, the NOT circuit 201 described above can be used, for example.

A first terminal of the transistor Tr18 is electrically connected to an input terminal of the inverter circuit INV3. An output terminal of the inverter circuit INV3 is electrically connected to an input terminal of the inverter circuit INV4. In particular, when the inverter circuit INV3 and the inverter circuit INV4 are connected in series, the inverter circuit INV3 and the inverter circuit INV4 function as a buffer circuit that restores a decayed signal.

A second terminal of the transistor Tr18 is electrically connected to the wiring VL through which a low-level potential is applied. A gate of the transistor Tr18 is electrically connected to the wiring VH through which a high-level potential is applied. An input terminal of the inverter circuit INV3 is electrically connected to a wiring DE. An output terminal of the inverter circuit INV4 is electrically connected to the wiring WL.

In a memory cell array in which memory cells are arranged in a matrix, one row driver circuit 411 is provided in each row. The wiring DE, which is a wiring for supplying a row address signal, has a function of selecting a word line. Specifically, the wiring DE has a function of transmitting a signal from an output terminal of a row decoder to the row driver. When the transistor Tr18 is in a non-conducting state and the wiring DE is at a high-level potential or a potential close to a high-level potential, a high-level potential is output to the wiring WL through the inverter circuit INV3 and the inverter circuit INV4.

Next, the operation of the row driver circuit 411 will be described.

Figure 16:
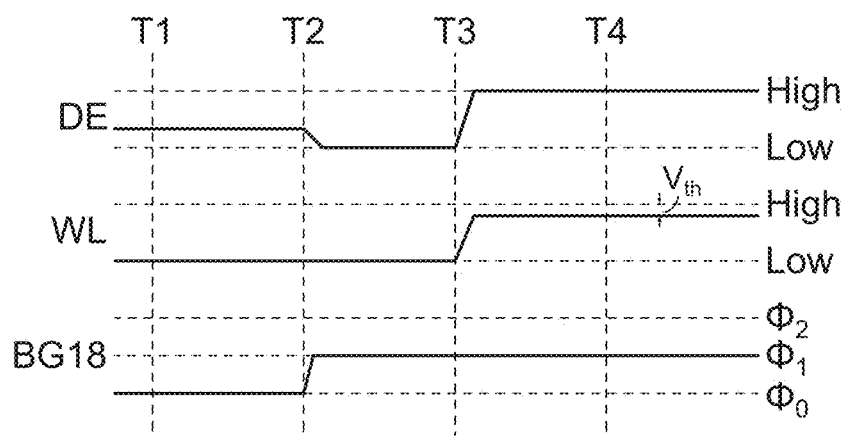
FIG. 16 is a timing chart showing an operation example for the circuit diagram in FIG. 15.

FIG. 16 is a timing chart showing an operation example of the row driver circuit 411. At Time T1, a potential close to a low-level potential is applied to the wiring DE. Since the wiring WL is connected to the wiring DE through the inverter circuit INV3 and the inverter circuit INV4, the potential of the wiring WL becomes a low-level potential. The row driver circuit 411 is in a non-active state at Time T1; thus, the potential $\Phi_0$ is applied to a wiring BG18. This means that the transistor Tr18 is in a non-conducting state. Thus, a low-level potential applied to the second terminal of the transistor Tr18 is not output to the first terminal of the transistor Tr18.

At Time T2, the row driver circuit 411 is in an active state; thus, the potential $\Phi_1$ is applied to the wiring BG18. As a result, the transistor Tr18 is brought into a conducting state and a low-level potential applied to the second terminal of the transistor Tr18 is output to the first terminal of the transistor Tr18. Accordingly, the potential of the wiring DE becomes a low-level potential.

At Time T3, the potential $\Phi_1$ remains being input to the wiring BG18 from Time T2, and a high-level potential is input to the wiring DE. At this time, the transistor Tr18 remains in a conducting state and the source-drain voltage of the transistor Tr18 becomes a potential difference between a high-level potential and a low-level potential. Since a high-level potential from the wiring DE is applied to the input terminal of the inverter circuit INV3, a potential lower than a high-level potential by the threshold voltage of the transistor included in the inverter circuit INV4 is output to the wiring WL.

In the above manner, in the operation of the row driver circuit 411, application of the potential $\Phi_1$ to the wiring BG18 enables the transistor Tr18 to output a potential corresponding to the potential of the input terminal of the inverter circuit INV3 to the wiring WL.

<<Sense Amplifier/Precharge Circuit>>

Figure 17:
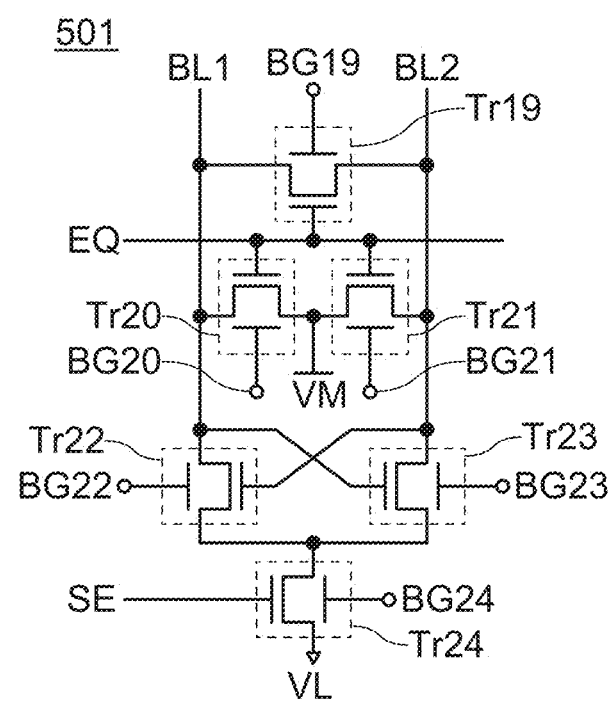
FIG. 17 is a circuit diagram illustrating a configuration example of a semiconductor device.

FIG. 17 illustrates a configuration example of a sense amplifier/precharge circuit. In one embodiment of the present invention, a sense amplifier and a precharge circuit are collectively described as one circuit as in FIG. 17.

A sense amplifier/precharge circuit 501 includes transistors Tr19 to Tr24.

A first terminal of the transistor Tr19 is electrically connected to a first terminal of the transistor Tr20, a first terminal of the transistor Tr22, a gate of the transistor Tr23, and a wiring BL1. A second terminal of the transistor Tr19 is electrically connected to a first terminal of the transistor Tr21, a first terminal of the transistor Tr23, a gate of the transistor Tr22, and a wiring BL2. A gate of the transistor Tr19 is electrically connected to a gate of the transistor Tr20, a gate of the transistor Tr21, and a wiring EQ. A second terminal of the transistor Tr20 is electrically connected to a second terminal of the transistor Tr21 and a wiring VM through which a middle-level potential is applied. A first terminal of the transistor Tr24 is electrically connected to a second terminal of the transistor Tr22 and a second terminal of the transistor Tr23. A second terminal of the transistor Tr24 is electrically connected to the wiring VL through which a low-level potential is applied. A gate of the transistor Tr24 is electrically connected to a wiring SE.

In a memory cell array in which memory cells are arranged in a matrix, one sense amplifier/precharge circuit 501 is provided in each column. The wiring BL1 and the wiring BL2 each function as a bit line and have a function of transmitting a read bit signal to the memory cell array. The wiring SE has a function of applying a low-level potential to one of the wiring BL1 and the wiring BL2. Specifically, when a high-level potential is applied to the wiring SE, a low-level potential is applied to the second terminal of the transistor Tr22 and the second terminal of the transistor Tr23. In that case, when the transistor Tr22 or the transistor Tr23 is in a conducting state, the wiring BL1 or the wiring BL2 is set at a low-level potential. The wiring EQ has a function of equalizing the potentials of the wirings BL1 and BL2; application of a high-level potential to the wiring EQ makes the potentials of the wirings BL1 and BL2 substantially equal to each other.

Then, an operation example of the sense amplifier/precharge circuit 501 is described. In this operation example, a memory cell connected to the sense amplifier/precharge circuit 501 is the memory cell 304 illustrated in FIG. 4D. Thus, the wiring BL is electrically connected to the wiring BL1 and the wiring BLB is electrically connected to the wiring BL2.

Figure 18:
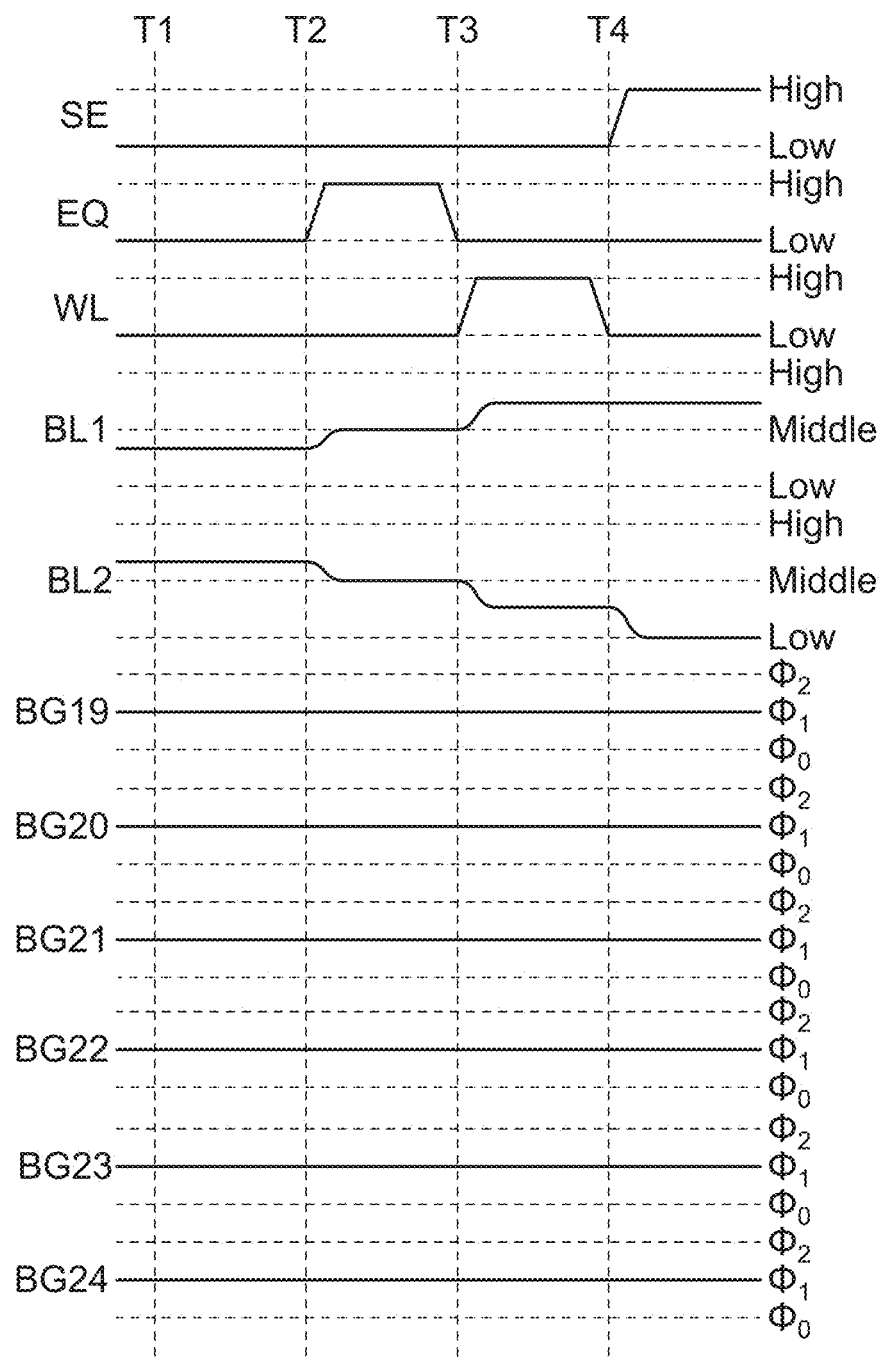
FIG. 18 is a timing chart showing an operation example for the circuit diagram in FIG. 17.

FIG. 18 is a timing chart showing the operation example of the sense amplifier/precharge circuit 501. At Time T1, the potential $\Phi_1$ is applied to wirings BG19 to BG24. Thus, the transistors Tr19 to Tr24 each operate with the current-voltage characteristics of the transistor Tr[$\Phi_1$] shown in FIG. 3. Furthermore, a low-level potential is input to the wiring SE, a low-level potential is input to the wiring EQ, and a low-level potential is input to the wiring WL. In an initial state, a potential higher than or equal to a low-level potential and lower than or equal to a high-level potential is input to the wiring BL1 and the wiring BL2 (in FIG. 18, the potential of the wiring BL1 is a potential between a low-level potential and a middle-level potential, and the potential of the wiring BL2 is a potential between a middle-level potential and a high-level potential). Note that "WL" in FIG. 18 denotes a word line for selecting the memory cell 304 electrically connected to the sense amplifier/precharge circuit 501.

At Time T2, a high-level potential is applied to the wiring EQ. Thus, the transistors Tr19 to Tr21 are brought into conducting states and a middle-level potential is applied to the wirings BL1 and BL2. After the wirings BL1 and BL2 are set at a middle-level potential, a low-level potential is applied to the wiring EQ to make the transistors Tr19 to Tr21 non-conducting states.

At Time T3, data reading of a memory cell selected by the wiring WL that is connected to the wirings BL1 and BL2 and functions as a word line is performed. Thus, a high-level potential is applied to the wiring WL electrically connected to the memory cell. As a result, a potential retained in the memory cell is supplied from the memory cell to the wirings BL1 and BL2. At this time, a potential between a middle-level potential and a high-level potential is supplied to the wiring BL1, and a potential between a low-level potential and a middle-level potential is supplied to the wiring BL2. Note that when potential supply to the wiring BL1 and the wiring BL2 is completed, a low-level potential is applied to the wiring WL to terminate the data reading of the memory cell.

At Time T4, the potential read from the memory cell is amplified. A high-level potential is applied to the wiring SE so that the transistor Tr24 is brought into a conducting state. Since the potential of the wiring BL1 is a potential between a middle-level potential and a high-level potential, the transistor Tr23 can also be brought into a conducting state. Thus, a low-level potential from the wiring VL is applied to the wiring BL2, and the potential of the wiring BL2 is reduced to a low-level potential.

As described above, a sense amplifier/precharge circuit can be obtained without employing a CMOS structure by using the configuration of the sense amplifier/precharge circuit 501.

In Embodiment 1, one embodiment of the present invention has been described. Other embodiments of the present invention are described in Embodiments 2 to 8. Note that one embodiment of the present invention is not limited thereto. In other words, various embodiments of the invention are described in this embodiment and the other embodiments, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

Note that this embodiment can be combined with any of the other embodiments in this specification as appropriate.
(Embodiment 2)

In this embodiment, a semiconductor device of one embodiment of the disclosed invention will be described.
<Semiconductor Device 1>

Figure 19A:
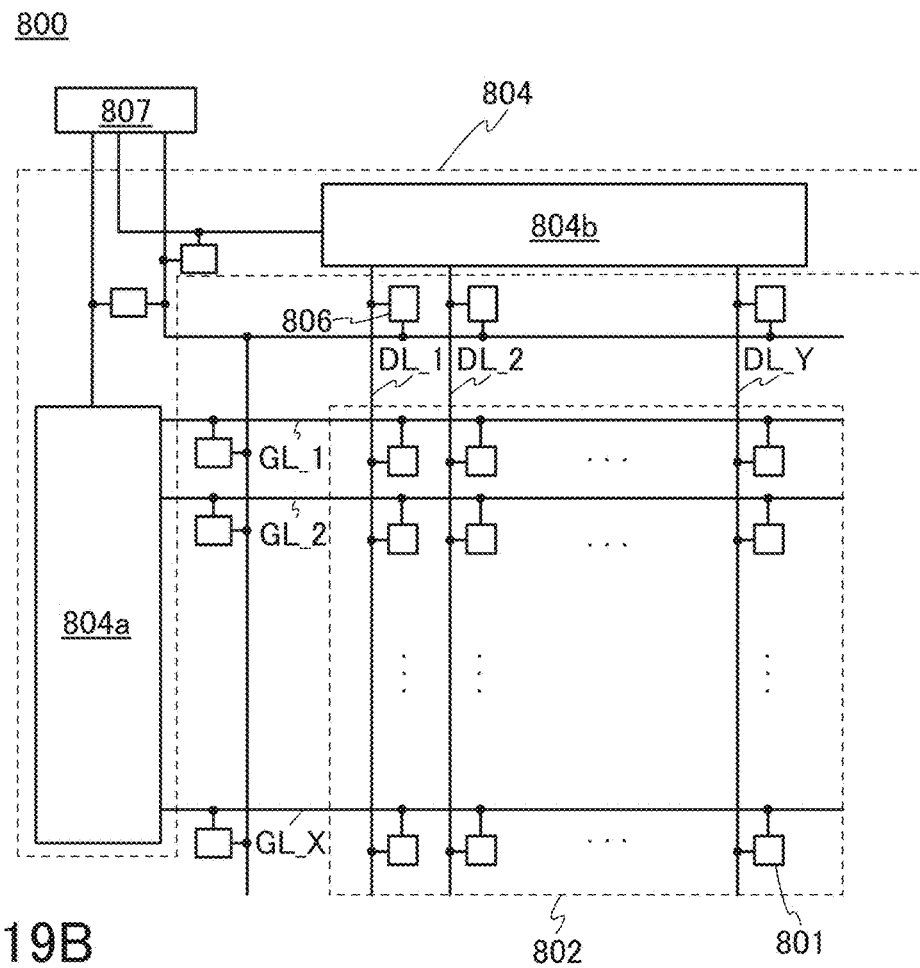
FIGS. 19A and 19B are a block diagram and a circuit diagram illustrating a configuration example of a semiconductor device.
Figure 19B:
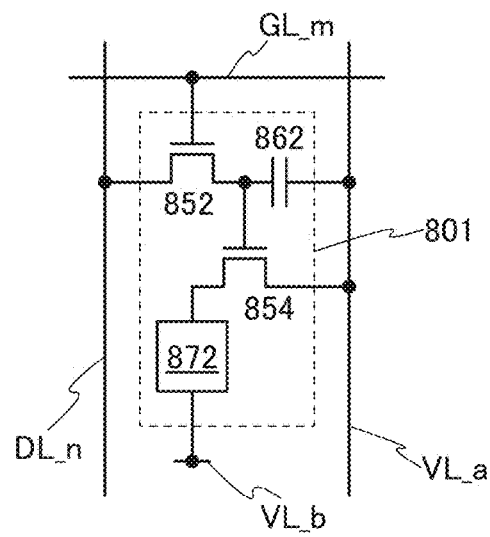

FIG. 19A is a block diagram of a semiconductor device including the circuits described in Embodiment 1. FIG. 19B is a circuit diagram of a pixel included in the semiconductor device. A semiconductor device 800 functions as a display device.

A display device illustrated in FIG. 19A includes a region including pixels of display elements (hereinafter referred to as a pixel portion 802), a circuit portion that is provided outside the pixel portion 802 and includes a circuit for driving the pixels (hereinafter, the circuit portion is referred to as a driver circuit portion 804), circuits having a function of protecting elements (hereinafter, the circuits are referred to as protection circuits 806), and a terminal portion 807. Note that the protection circuits 806 are not necessarily provided.

Part or the whole of the driver circuit portion 804 is preferably formed over a substrate over which the pixel portion 802 is formed. Thus, the number of components and the number of terminals can be reduced. When part or the whole of the driver circuit portion 804 is not formed over the substrate over which the pixel portion 802 is formed, the part or the whole of the driver circuit portion 804 can be mounted by chip on glass (COG) bonding or tape automated bonding (TAB).

The pixel portion 802 includes a plurality of circuits for driving display elements arranged in X (X is a natural number of 2 or more) rows and Y (Y is a natural number of 2 or more) columns (hereinafter, the circuits are referred to as pixel circuits 801). The driver circuit portion 804 includes circuits such as a circuit for supplying a signal (scan signal) to select a pixel (hereinafter, the circuit is referred to as a scan line driver circuit 804*a*) and a circuit for supplying a signal (data signal) to drive a display element in a pixel (hereinafter, the circuit is referred to as a signal line driver circuit 804*b*).

The scan line driver circuit 804*a* includes a shift register or the like. The scan line driver circuit 804*a* receives a signal for driving the shift register through the terminal portion 807 and outputs a signal. For example, the scan line driver circuit 804*a* receives a start pulse signal, a clock signal, or the like and outputs a pulse signal. The scan line driver circuit 804*a* has a function of controlling the potentials of wirings supplied with scan signals (hereinafter referred to as scan lines GL_1 to GL_X). Note that a plurality of scan line driver circuits 804*a* may be provided to control the scan lines GL_1 to GL_X separately. Alternatively, the scan line driver circuit 804*a* has a function of supplying an initialization signal. Without being limited thereto, another signal can be supplied from the scan line driver circuit 804*a*.

The scan line driver circuit 804*a* may include any one of the decoder circuits 401 to 404 described in Embodiment 1. The use of any one of the decoder circuits 401 to 404 enables a pulse signal to be input to any one of the scan lines GL_1 to GL_X When potentials input to the external input terminals included in any one of the decoder circuits 401 to 404 are gradually varied, the scan lines GL_1 to GL_X can be scanned and selected one by one.

The signal line driver circuit 804*b* includes a shift register or the like. The signal line driver circuit 804*b* receives a signal (image signal) from which a data signal is generated, as well as a signal for driving the shift register, through the terminal portion 807. The signal line driver circuit 804*b* has a function of generating a data signal to be written to the pixel circuit 801 from the image signal. In addition, the signal line driver circuit 804*b* has a function of controlling output of a data signal in response to a pulse signal produced by input of a start pulse signal, a clock signal, or the like. Furthermore, the signal line driver circuit 804*b* has a function of controlling the potentials of wirings supplied with data signals (hereinafter referred to as signal lines DL_1 to DL_Y). Without being limited thereto, another signal can be supplied from the signal line driver circuit 804*b*.

The signal line driver circuit 804*b* may include at least one of the decoder circuits 401 to 404 described in Embodiment 1. The use of any one of the decoder circuits 401 to 404 enables a data signal to be input to any one of the signal lines DL_1 to DL_Y. When potentials input to the external input terminals included in any one of the decoder circuits 401 to 404 are gradually varied, the signal lines DL_1 to DL_Y can be scanned and selected one by one.

The signal line driver circuit 804*b* includes a plurality of analog switches, for example. The signal line driver circuit 804*b* can output, as data signals, time-divided image signals obtained by sequentially turning on the plurality of analog switches.

A data signal is input to each of the pixel circuits 801 through one of the scan lines GL to which scan signals are applied. Data writing and data retention of the data signal in each of the plurality of pixel circuits 801 are controlled by the scan line driver circuit 804*a*. For example, to the pixel circuit 801 in the m-th row and the n-th column (m is a natural number of X or less, and n is a natural number of Y or less), a pulse signal is input from the scan line driver circuit 804*a* through the scan line GL_m, and a data signal is input from the signal line driver circuit 804*b* through the signal line DL_n in accordance with the potential of the scan line GL_m.

The protection circuit 806 in FIG. 19A is connected to, for example, the scan line GL between the scan line driver circuit 804*a* and the pixel circuit 801. Alternatively, the protection circuit 806 is connected to the signal line DL between the signal line driver circuit 804*b* and the pixel circuit 801. Alternatively, the protection circuit 806 can be connected to a wiring between the scan line driver circuit 804*a* and the terminal portion 807. Alternatively, the protection circuit 806 can be connected to a wiring between the signal line driver circuit 804*b* and the terminal portion 807. Note that the terminal portion 807 refers to a portion having terminals for inputting power, control signals, and image signals from external circuits to the display device.

The protection circuit 806 electrically connects a wiring connected to the protection circuit to another wiring when a potential out of a certain range is applied to the wiring connected to the protection circuit.

As illustrated in FIG. 19A, the protection circuits 806 provided for the pixel portion 802 and the driver circuit portion 804 can improve the resistance of the display device to overcurrent generated by electrostatic discharge (ESD) or the like. Note that the configuration of the protection circuits 806 is not limited thereto; for example, the protection circuit 806 can be connected to the scan line driver circuit 804*a* or the signal line driver circuit 804*b*. Alternatively, the protection circuit 806 can be connected to the terminal portion 807.

One embodiment of the present invention is not limited to the example in FIG. 19A, in which the driver circuit portion 804 includes the scan line driver circuit 804*a* and the signal line driver circuit 804*b*. For example, only the scan line driver circuit 804*a* may be formed, and a separately prepared substrate over which a signal line driver circuit is formed (e.g., a driver circuit board formed using a single-crystal semiconductor film or a polycrystalline semiconductor film) may be mounted.

Each of the plurality of pixel circuits 801 in FIG. 19A can have the configuration illustrated in FIG. 19B, for example.

The pixel circuit 801 illustrated in FIG. 19B includes a transistor 852, a transistor 854, a capacitor 862, and a light-emitting element 872.

One of a source and a drain of the transistor 852 is electrically connected to the signal line DL_n through which a data signal is applied. A gate of the transistor 852 is electrically connected to the scan line GL_m through which a gate signal is applied.

The transistor 852 has a function of controlling writing of a data signal.

A first terminal of the capacitor 862 is electrically connected to a wiring through which a potential is applied (hereinafter referred to as a potential supply line VL_a), and a second terminal of the capacitor 862 is electrically connected to the other of the source and the drain of the transistor 852.

The capacitor 862 functions as a storage capacitor for retaining written data.

One of a source and a drain of the transistor 854 is electrically connected to the potential supply line VL_a. A gate of the transistor 854 is electrically connected to the other of the source and the drain of the transistor 852.

One of an anode and a cathode of the light-emitting element 872 is electrically connected to a potential supply line VL_b, and the other of the anode and the cathode of the light-emitting element 872 is electrically connected to the other of the source and the drain of the transistor 854.

A high power supply potential VDD is applied to one of the potential supply line VL_a and the potential supply line VL_b, and a low power supply potential VSS is applied to the other of the potential supply line VL_a and the potential supply line VL_b.

For example, in the display device including the pixel circuits 801 in FIG. 19B, the scan line driver circuit 804a in FIG. 19A sequentially selects the pixel circuits 801 row by row to turn on the transistors 852, and data signals are written.

When the transistor 852 is turned off, the pixel circuit 801 to which the data has been written is brought into a holding state. Furthermore, the amount of current flowing between the source and the drain of the transistor 854 is controlled in accordance with the potential of the written data signal. The light-emitting element 872 emits light with a luminance corresponding to the amount of flowing current. This operation is sequentially performed row by row; thus, an image can be displayed.

<Semiconductor Device 2>

Figure 20A:
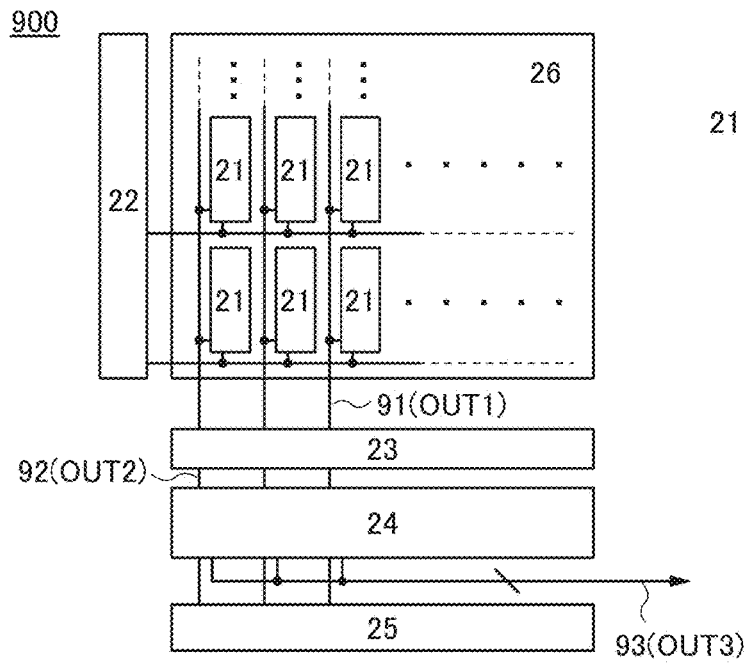
FIGS. 20A to 20C are block diagrams and a circuit diagram illustrating a configuration example of a semiconductor device.
Figure 20B:
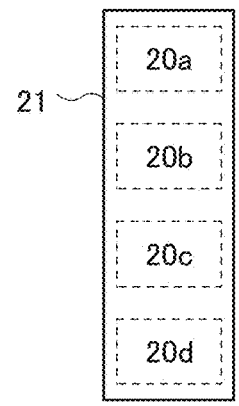
Figure 20C:
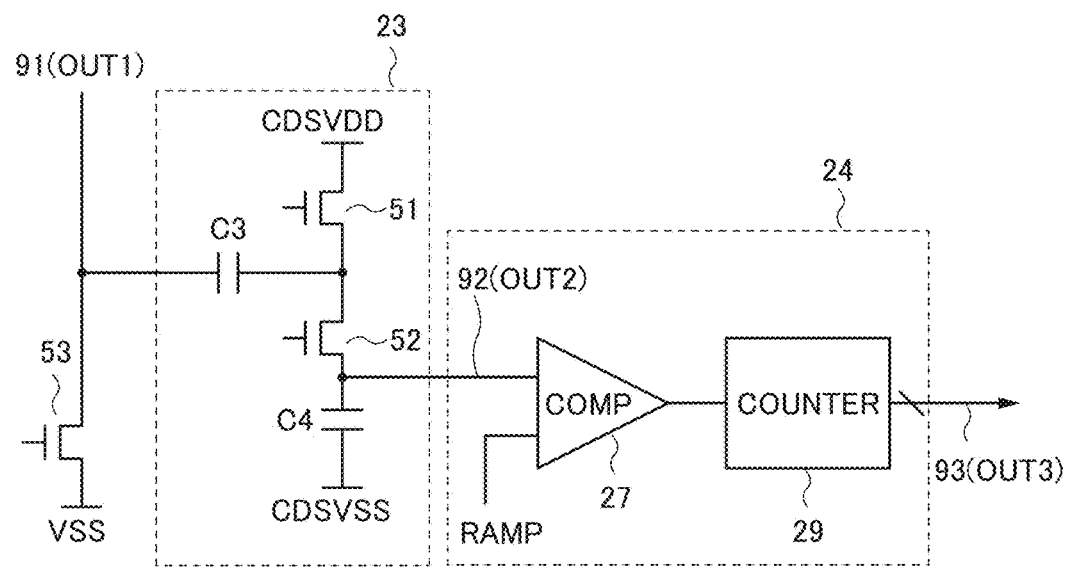

FIGS. 20A to 20C illustrate a semiconductor device including at least one of the decoder circuits 401 to 404 described in Embodiment 1. A semiconductor device 900 functions as an image sensor.

FIG. 20A illustrates an imaging device in one embodiment of the present invention. The imaging device includes a pixel array 26 including pixel blocks 21 arranged in a matrix, a circuit 22 (row driver) having a function of driving the pixel blocks 21, a circuit 23 (CDS circuit) for performing correlated double sampling (CDS) on an output signal of the pixel block 21, a circuit 24 (e.g., an A/D converter) having a function of converting analog data output from the circuit 23 to digital data, and a circuit 25 (column driver) having a function of selecting and reading data converted in the circuit 24. Note that a structure without the circuit 23 can be employed.

As illustrated in FIG. 20B, for example, the pixel block 21 can include a plurality of pixels 20 (pixels 20a, 20b, 20c, and 20d). Although a detailed structure will be described later, in the pixel block 21, some of the transistors are used in common by the plurality of pixels 20.

FIG. 20C illustrates a circuit diagram of the circuit 23 and a block diagram of the circuit 24 that are connected to one column of the pixel block 21. The circuit 23 can include a transistor 51, a transistor 52, a capacitor C3, and a capacitor C4. Furthermore, the circuit 24 can include a comparator circuit 27 and a counter circuit 29.

Note that a transistor 53 functions as a current source circuit. A wiring 91 (OUT1) is electrically connected to one of a source and a drain of the transistor 53, and a power supply line is connected to the other of the source and the drain of the transistor 53. As the power supply line, a low-potential power supply line can be used, for example. Bias voltage is always applied to a gate of the transistor 53.

In the circuit 23, one of a source and a drain of the transistor 51 is electrically connected to one of a source and a drain of the transistor 52 and one electrode of the capacitor C3. The one of the source and the drain of the transistor 52 is electrically connected to one electrode of the capacitor C4 and a wiring 92 (OUT2). The other of the source and the drain of the transistor 51 is electrically connected to a high-potential power supply line (CDSVDD) to which a reference potential is supplied, for example. The other electrode of the capacitor C4 is electrically connected to a low-potential power supply line (CDSVSS), for example.

An operation example of the circuit 23 when the circuit 23 is connected to the pixel 20 is described. First, the transistors 51 and 52 are turned on. Next, the potential of imaging data is output from the pixel 20 to the wiring 91 (OUT1), and a reference potential (CDSVDD) is held in the wiring 92 (OUT2). Then, the transistor 51 is turned off and a reset potential (here, a potential higher than the potential of the imaging data, for example, a VDD potential) is output from the pixel 20 to the wiring 91 (OUT1). At this time, the wiring 92 (OUT2) has a potential obtained by adding the absolute value of a difference between the potential of the imaging data and the reset potential to the reference potential (CDSVDD). Thus, a potential signal with little noise that is obtained by adding the net potential of the imaging data to the reference potential (CDSVDD) can be supplied to the circuit 24.

Note that when the reset potential is lower than the potential of the imaging data (e.g., a GND potential), the wiring 92 (OUT2) has a potential that is obtained by subtracting the absolute value of the difference between the potential of the imaging data and the reset potential from the reference potential (CDSVDD).

In the circuit 24, a signal potential that is input from the circuit 23 to the comparator circuit 27 and a swept reference potential (RAMP) are compared. Then, in accordance with the output of the comparator circuit 27, the counter circuit 29 operates to output a digital signal to a wiring 93 (OUT3).

Figure 21:
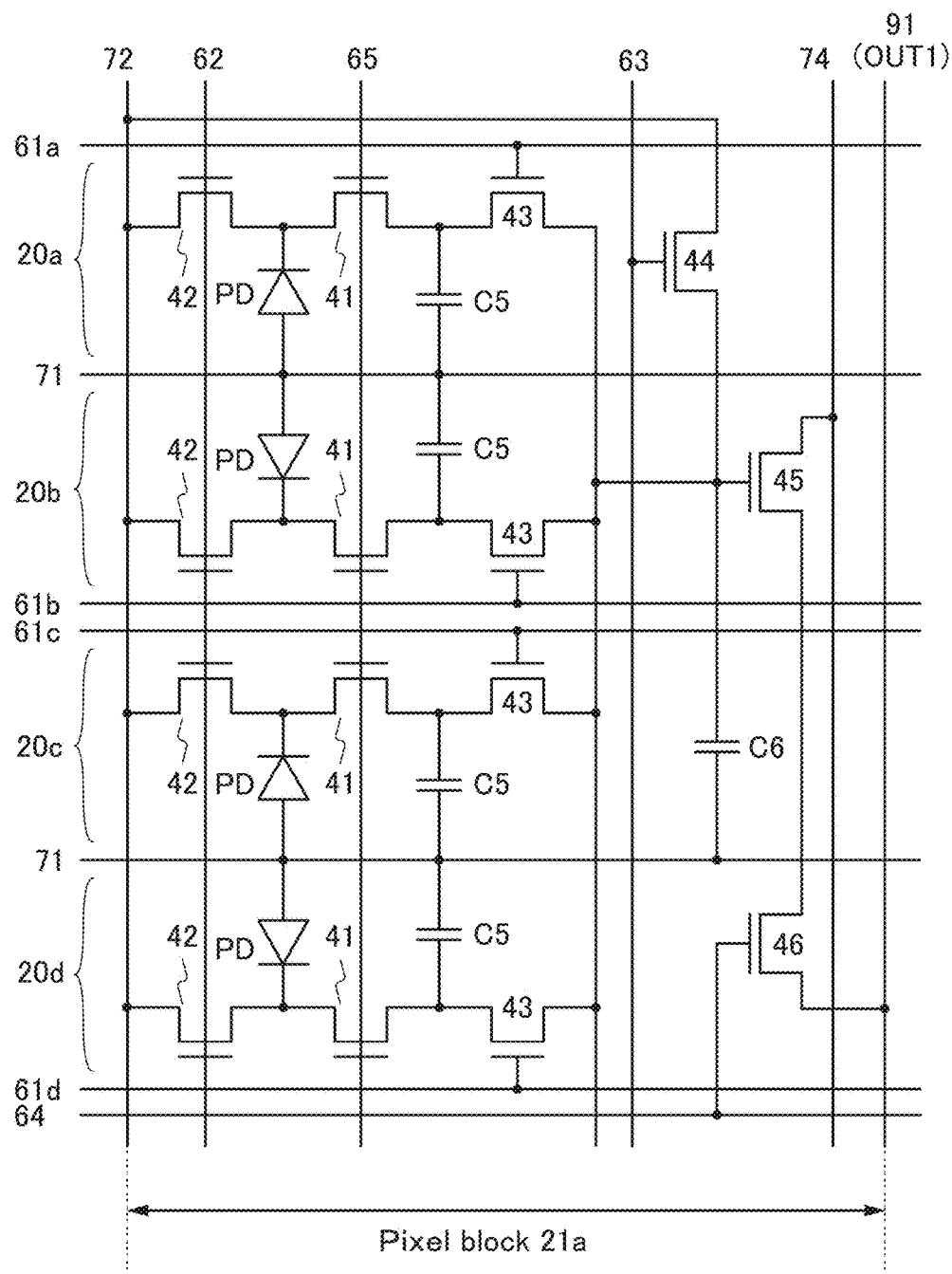
FIG. 21 is a circuit diagram illustrating a configuration example of a semiconductor device.

A pixel block 21a illustrated in FIG. 21 is a specific configuration example of the pixel block 21. In the pixel block 21a, each pixel includes a photoelectric conversion element PD (photodiode), a transistor 41, a transistor 42, a transistor 43, and a capacitor C5. In the pixel block 21a, a transistor 44, a transistor 45, and a transistor 46 are used in common by four pixels (the pixels 20a, 20b, 20c, and 20d) that are arranged in an extending direction of the wiring 91 (OUT1) (hereinafter, this direction is referred to as a Y direction). Although the pixel block 21a in FIG. 21 includes four pixels, the pixel block 21a may include two pixels, three pixels, or five or more pixels.

In each of the pixels (the pixels 20a, 20b, 20c, and 20d), an output terminal of the photoelectric conversion element PD is electrically connected to a first terminal of the transistor 41 and a first terminal of the transistor 42. A second terminal of the transistor 41 is electrically connected to a first terminal of the transistor 43 and a first terminal of the capacitor C5. A wiring 71 is electrically connected to an input terminal of the photoelectric conversion element PD and a second terminal of the capacitor C5. A gate of the transistor 41 is electrically connected to a wiring 65. A gate of the transistor 42 is electrically connected to a wiring 62. In the pixels, gates of the transistors 43 are electrically connected to wirings 61a to 61d. In each pixel, a second terminal of the transistor 43 is electrically connected to a first terminal of the transistor 44 and a gate of the transistor 45, and a second terminal of the transistor 42 is electrically connected to a wiring 72 and a second terminal of the transistor 44. A gate of the transistor 44 is electrically connected to a wiring 63. A first terminal of the transistor 45 is electrically connected to a wiring 74. A second terminal of the transistor 45 is electrically connected to a first terminal of the transistor 46. A second terminal of the transistor 46 is electrically connected to the wiring 91. A gate of the transistor 46 is electrically connected to a wiring 64. A first terminal of a capacitor C6 is electrically connected to the second terminals of the transistors 43 included in the pixels 20a and 20b. A second terminal of the capacitor C6 is electrically connected to the wiring 71.

In the pixel block 21a, the wiring 72, the wiring 74, the wiring 62, the wiring 63, and the wiring 65 can be used in common by four pixels. In addition, these wirings can be used in common by another pixel block 21a provided in the Y direction.

In the pixel block 21a, when the wiring 71 electrically connects the pixel 20a to the pixel 20b and another wiring 71 electrically connects the pixel 20c to the pixel 20d as illustrated in FIG. 21, wirings can be minimized. Furthermore, the wiring 71 can be used in common by another pixel block 21a provided in an extending direction of the wiring 64 (hereinafter, this direction is referred to as an X direction).

The wiring 61a, the wiring 61b, the wiring 61c, and the wiring 61d can be used in common by another pixel block 21a provided in the X direction.

Figure 22:
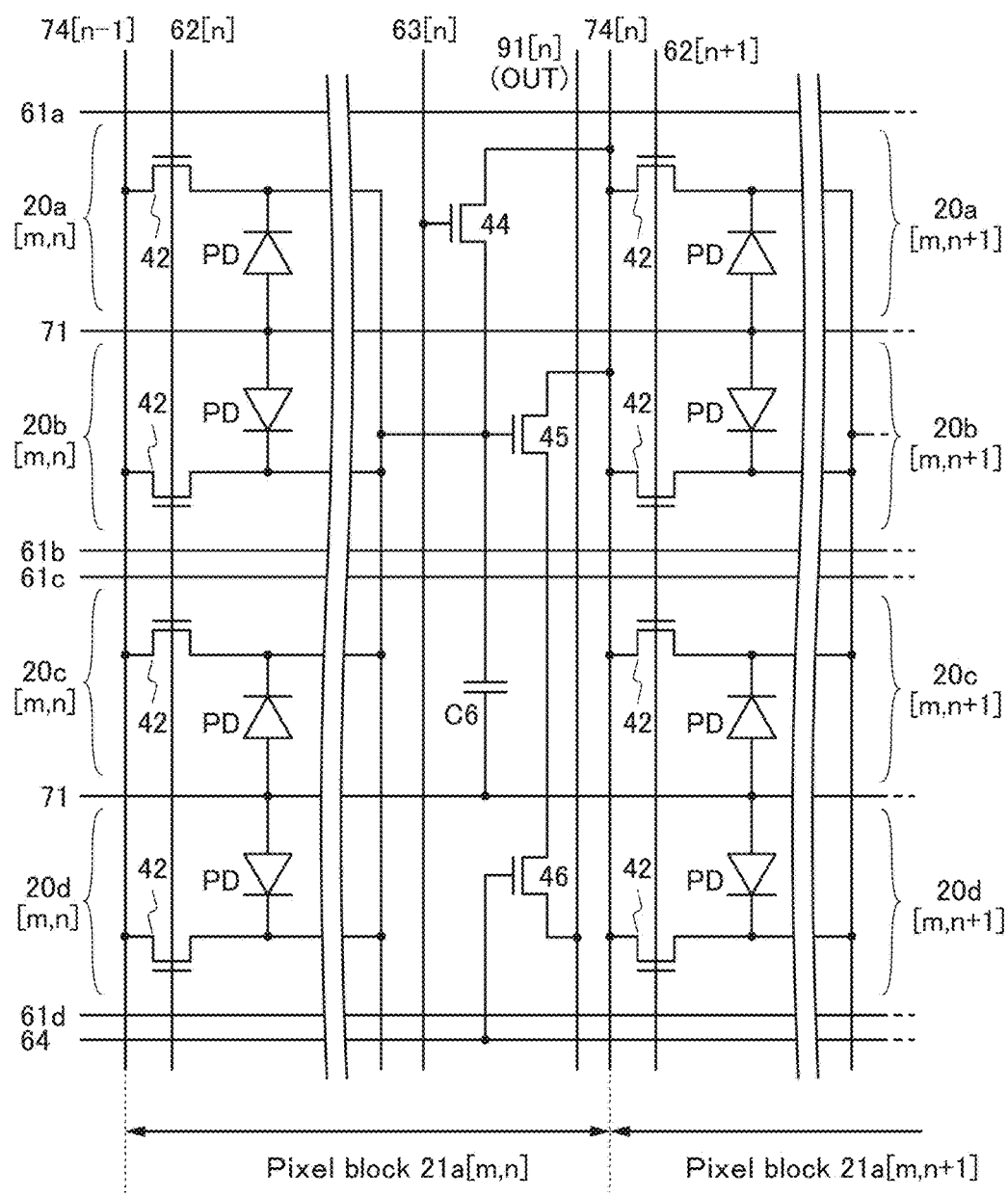
FIG. 22 is a circuit diagram illustrating a configuration example of a semiconductor device.

FIG. 22 illustrates the configurations of a pixel block 21a[m, n] and a pixel block 21a[m, n+1] that is adjacent to the pixel block 21a[m, n] in the horizontal direction. Note that m and n are given natural numbers and denote a row and a column, respectively. The pixel block 21a[m, n] includes a pixel 20a[m, n], a pixel 20b[m, n], a pixel 20c[m, n], and a pixel 20d[m, n]. The pixel block 21a[m, n+1] includes a pixel 20a[m, n+1], a pixel 20b[m, n+1], a pixel 20c[m, n+1], and a pixel 20d[m, n+1]. The pixel block 21a[m, n] is electrically connected to a wiring 74[$n-1$] and a wiring 62[$n$]. The pixel block 21a[m, n+1] is electrically connected to a wiring 74[$n$] and a wiring 62[$n+1$]. The transistors 44 to 46 and the capacitor C6 are shared by the pixel block 21a[m, n] and the pixel block 21a[m, n+1]. Thus, the wiring 63[$n$] electrically connected to the gate of the transistor 44 and a wiring 91 [$n$] electrically connected to the second terminal of the transistor 46 are also shared by the pixel block 21a[m, n] and the pixel block 21a[m, n+1]. When the wiring 72 and the wiring 74 have the same potential in the operating condition of the pixel 20, one of the wiring 72 and the wiring 74 can be eliminated and the other of the wiring 72 and the wiring 74 can be used in common by the pixel block 21a[m, n] and the pixel block 21a[m, n+1], as illustrated in FIG. 22.

Here, the circuit 22 includes at least one of the decoder circuits 401 to 404. The semiconductor device 900 has a function of transmitting imaging data acquired by pixel blocks in each row to the circuit 23 and the circuit 24 by row-by-row scanning. Application of any of the above-described decoder circuits achieves such scanning. That is, similarly to the case of the semiconductor device 800, when potentials input to the external input terminals included in any one of the decoder circuits 401 to 404 are gradually varied, the scan lines included in the semiconductor device 900 can be scanned and selected one by one.

Note that this embodiment can be combined with any of the other embodiments in this specification as appropriate.
(Embodiment 3)

Described in this embodiment are transistors of one embodiment of the disclosed invention.

Transistors of embodiments of the present invention each preferably include an nc-OS or a CAAC-OS, which is described in Embodiment 5.
<Structure Example 1 of Transistor>

Figure 23A:
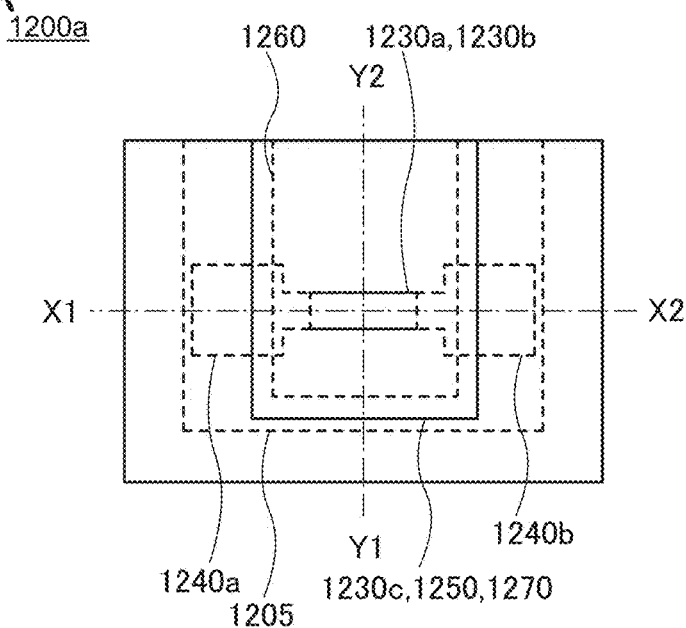
FIGS. 23A to 23C are a top view and cross-sectional views illustrating a structure example of a transistor.
Figure 23B:
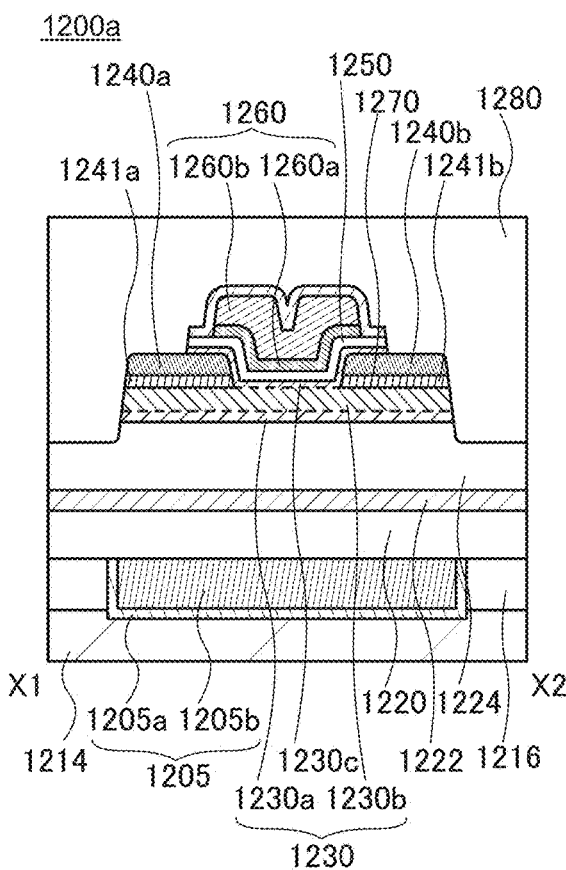
Figure 23C:
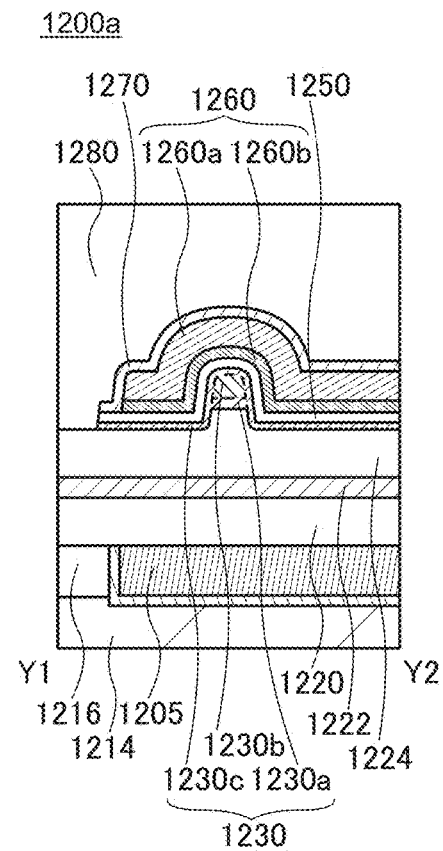

An example of a transistor of one embodiment of the present invention is described below. FIGS. 23A to 23C are a top view and cross-sectional views illustrating a transistor of one embodiment of the present invention. FIG. 23A is a top view. FIG. 23B is a cross-sectional view taken along a dashed-dotted line X1-X2 in FIG. 23A. FIG. 23C is a cross-sectional view taken along a dashed-dotted line Y1-Y2 in FIG. 23A. Note that for simplification of the drawing, some components in the top view in FIG. 23A are not illustrated.

The transistor 1200a includes a conductor 1205 and a conductor 1260 that function as gate electrodes; an insulator 1220, an insulator 1222, an insulator 1224, and an insulator 1250 that function as gate insulating layers; a metal oxide 1230 that includes a region where a channel is formed; a conductor 1240a and a conductor 1241a that function as one of a source and a drain; a conductor 1240b and a conductor 1241b that function as the other of the source and the drain; an insulator 1214; an insulator 1216; the insulator 1270; and an insulator 1280 that contains excess oxygen.

The metal oxide 1230 includes a metal oxide 1230a, a metal oxide 1230b over the metal oxide 1230a, and a metal oxide 1230c over the metal oxide 1230b. When the transistor 1200a is turned on, current flows (a channel is formed) mainly in the metal oxide 1230b. In contrast, although current might flow through a region in the vicinity of the interface (a mixed region in some cases) between the metal oxide 1230b and the metal oxides 1230a and 1230c, the rest of the metal oxides 1230a and 1230c might function as insulators at the other region.

The insulator 1214 preferably contains a material having a barrier property against oxygen and hydrogen. For example, silicon nitride formed by a CVD method, that can be given as an example of a film having a barrier property with respect to hydrogen, can be used for the insulator 1214. For the insulator 1214, a metal oxide such as aluminum oxide, hafnium oxide, or tantalum oxide is preferably used, for example. In particular, aluminum oxide has an excellent blocking effect that prevents permeation of oxygen and impurities such as hydrogen and moisture which cause a change in the electrical characteristics of the transistor. Accordingly, the use of aluminum oxide can prevent entry of impurities such as hydrogen and moisture into the transistor 1200a in and after a manufacturing process of the transistor. In addition, release of oxygen from the metal oxide in the transistor 1200a can be prevented. Therefore, aluminum oxide is suitably used for a protective film for the transistor 1200a.

The insulator 1216 is provided over the insulator 1214. For the insulator 1216, a material such as silicon oxide, silicon oxynitride, silicon nitride oxide, silicon nitride, aluminum oxide, aluminum oxynitride, aluminum nitride oxide, or aluminum nitride can be used.

A two-layer structure of the conductor 1205a and the conductor 1205b is illustrated in FIGS. 23A to 23C, but there is no limitation on the structure, and a single-layer structure or a stacked-layer structure of three or more layers may be used. For example, a conductor having a barrier property with respect to hydrogen, e.g., tantalum nitride, may be used as the conductor 1205a, and tungsten, which has high conductivity, may be stacked thereover as the conductor 1205b. The use of the combination of the materials can prevent diffusion of hydrogen into the metal oxide 1230 while conductivity of a wiring is ensured.

Each of the insulators 1220 and 1224 is preferably an insulator containing oxygen, such as a silicon oxide film or a silicon oxynitride film. In particular, the insulator 1224 is preferably an insulator containing excess oxygen (containing oxygen in excess of that in the stoichiometric composition). In the case where such an insulator containing excess oxygen is provided in contact with the metal oxide in the transistor 1200a, oxygen vacancies in the metal oxide can be compensated. Note that the insulators 1220 and 1224 are not necessarily formed of the same material.

The insulator 1222 preferably has a single-layer structure or a stacked-layer structure formed using an insulator containing silicon oxide, silicon oxynitride, silicon nitride oxide, aluminum oxide, hafnium oxide, tantalum oxide, zirconium oxide, lead zirconate titanate (PZT), strontium titanate ($SrTiO_3$), $(Ba,Sr)TiO_3$ (BST), or the like. Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 1222 may have a stacked-layer structure of two or more layers. In this case, the stacked layers are not necessarily formed of the same material but may be formed of different materials.

In the case where the insulator 1222 including a high-k material is provided between the insulator 1220 and the insulator 1224, electrons can be trapped in the insulator 1222 under specific conditions, and the threshold voltage can be increased. As a result, the insulator 1222 is negatively charged in some cases.

For example, in the case where the insulator 1220 and the insulator 1224 are formed using silicon oxide and the insulator 1222 is formed using a material having a lot of electron trap states such as hafnium oxide, aluminum oxide, or tantalum oxide, the state where the potential of the conductor 1205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the metal oxide in the transistor 1200a to the conductor 1205. At this time, some of the moving electrons are trapped by the electron trap states of the insulator 1222.

In the transistor in which a necessary amount of electrons is trapped by the electron trap states of the insulator 1222, the threshold voltage is shifted in the positive direction. By controlling the voltage of the conductor 1205, the amount of electrons to be trapped can be controlled, and thus the threshold voltage can be controlled. The transistor 1200a having the structure is a normally-off transistor which is in a non-conducting state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging. In either case, it is preferable that the transistor be not exposed to temperatures of 125° C. or higher for one hour or more after the process for trapping electrons.

When the insulators 1220 and 1224 are formed using silicon oxide and the insulator 1222 is formed using hafnium oxide, the insulators 1220 and 1224 may be formed by a chemical vapor deposition method (including a CVD method and an atomic layer deposition (ALD) method) and the insulator 1222 may be formed by a sputtering method. Note that using a sputtering method for the formation of the insulator 1222 might easily crystallize the insulator 1222 at low temperature to generate a large amount of fixed charges.

The threshold voltages can be controlled by appropriate adjustment of the thicknesses of the insulator 1220, the insulator 1222, and the insulator 1224.

The insulator 1222 is preferably formed using a material having a barrier property with respect to oxygen and hydrogen. When such a material is used, release of oxygen from the metal oxide in the transistor 1200a or entry of an impurity such as hydrogen from the outside can be prevented.

The metal oxide 1230a, the metal oxide 1230b, and the metal oxide 1230c are formed using a metal oxide such as an In-M-Zn oxide (M is Al, Ga, Y, or Sn). An In—Ga oxide or an In—Zn oxide may be used as the metal oxide 1230.

The metal oxide 1230 according to the present invention is described below.

A metal oxide used for the metal oxide 1230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where a metal oxide contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M in some cases.

First, preferred ranges of the atomic ratio of indium, the element M, and zinc contained in the metal oxide of the present invention are described with reference to FIGS. 26A to 26C. Note that the proportion of oxygen atoms is not shown in FIGS. 26A to 26C. The terms of the atomic ratio of indium, the element M, and zinc contained in the metal oxide are denoted by [In], [M], and [Zn], respectively.

Figure 26A:
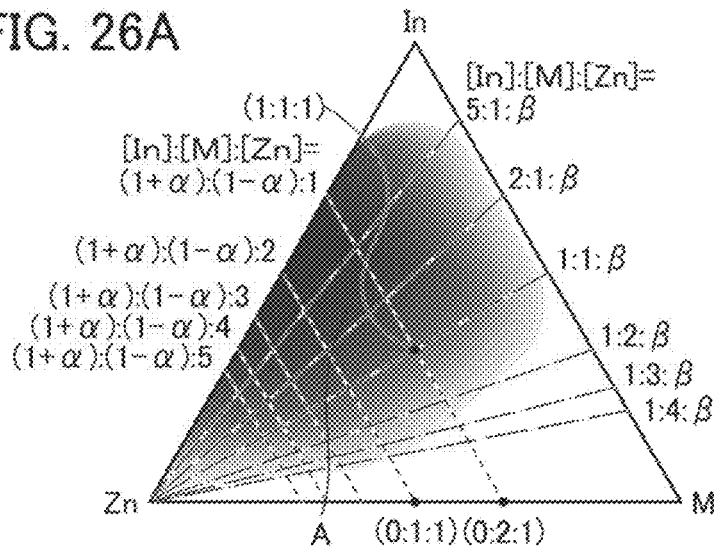
FIGS. 26A to 26C each illustrate an atomic ratio range of an oxide.
Figure 26B:
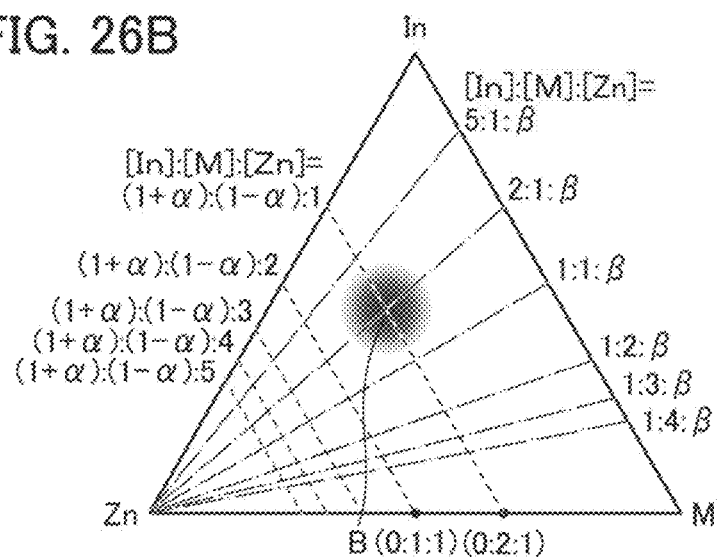
Figure 26C:
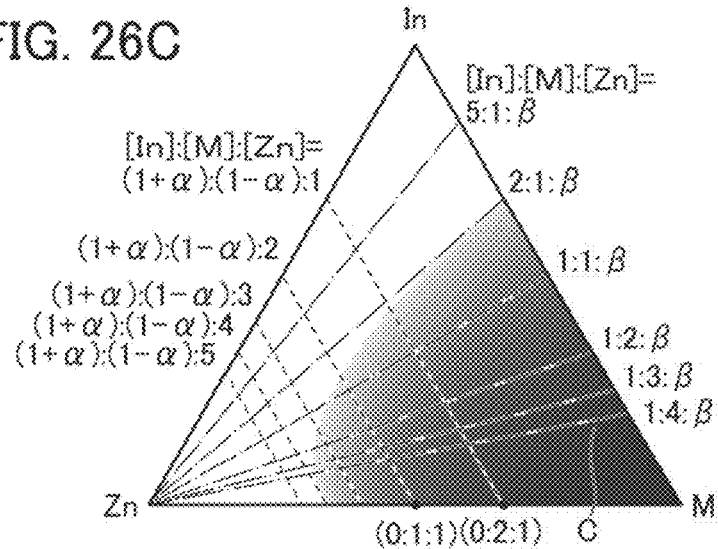

In FIGS. 26A to 26C, broken lines indicate a line where the atomic ratio [In]:[M]:[Zn] is $(1+\alpha):(1-\alpha):1$, where $\alpha$ is a real number greater than or equal to $-1$ and less than or equal to 1, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta$ is a real number greater than or equal to 0, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

The metal oxide in FIGS. 26A to 26C with an atomic ratio of [In]:[M]:[Zn]=0:2:1 or an atomic ratio that is in the neighborhood thereof is likely to have a spinel crystal structure.

FIGS. 26A and 26B illustrate examples of the preferred ranges of the atomic ratio of indium, the element M, and zinc contained in the metal oxide of one embodiment of the present invention.

Figure 27:
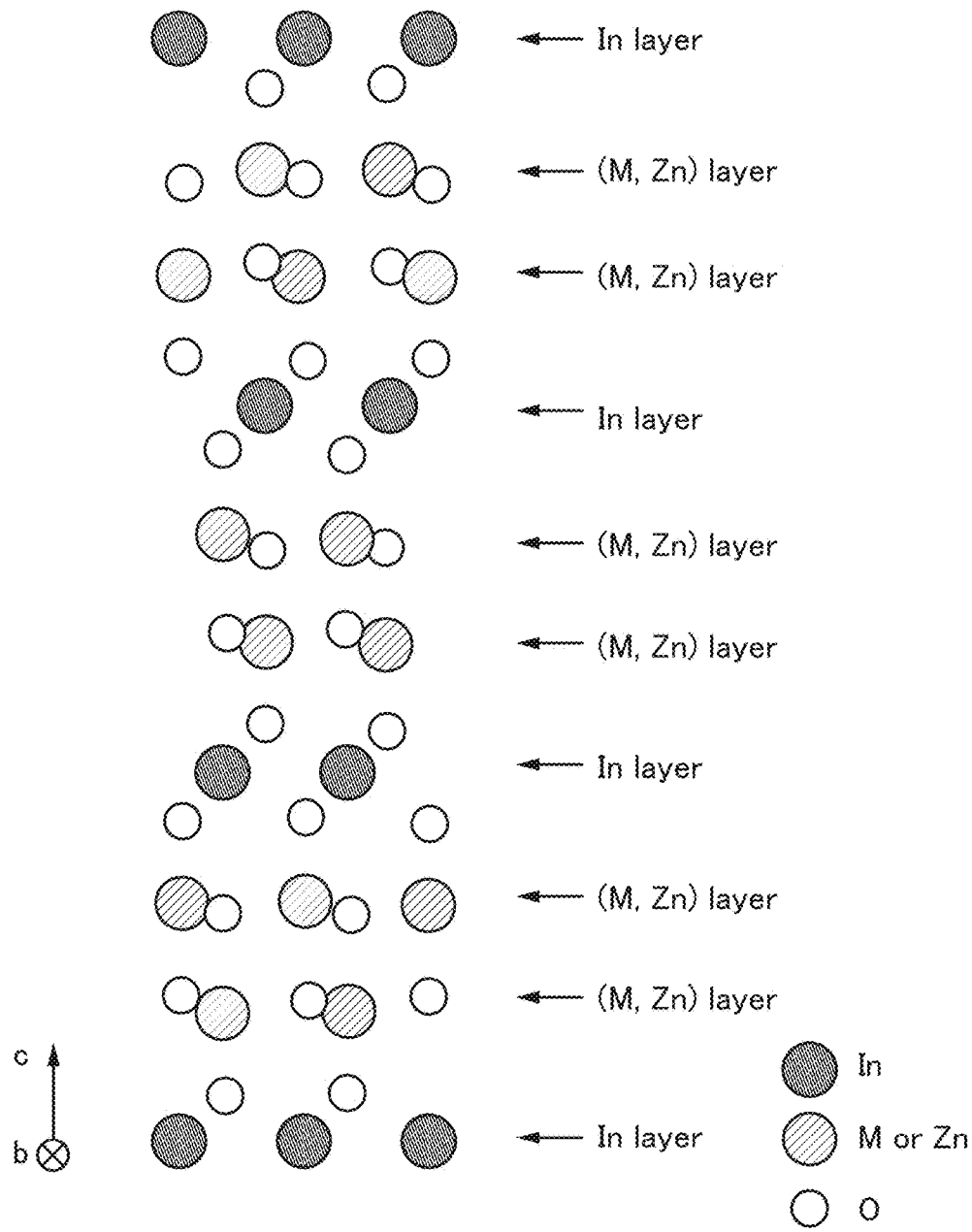
FIG. 27 illustrates an $InMZnO_4$ crystal.

FIG. 27 illustrates an example of the crystal structure of $InMZnO_4$ whose atomic ratio [In]:[M]:[Zn] is 1:1:1. The crystal structure in FIG. 27 is $InMZnO_4$ observed from a direction parallel to a b-axis. Note that a metal element in a layer that contains M, Zn, and oxygen (hereinafter, this layer is referred to as an "(M,Zn) layer") in FIG. 27 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as illustrated in FIG. 27.

Indium and the element M can be replaced with each other. Thus, when the element M in the (M,Zn) layer is replaced with indium, the layer can also be referred to as an (In,M,Zn) layer. In that case, a layered structure that contains one In layer for every two (In,M,Zn) layers is obtained.

A metal oxide whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the metal oxide is crystallized.

Note that in the case where the number of (M,Zn) layers with respect to one In layer is not an integer in the metal oxide, the metal oxide might have a plurality of kinds of layered structures where the number of (M,Zn) layers with respect to one In layer is an integer. For example, in the case of [In]:[M]:[Zn]=1:1:1.5, the metal oxide may have a mix of a layered structure including one In layer for every two (M,Zn) layers and a layered structure including one In layer for every three (M,Zn) layers.

For example, in the case where the metal oxide is formed with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the metal oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the metal oxide, a grain boundary might be formed between different crystal structures.

In addition, the metal oxide containing indium in a higher proportion can have high carrier mobility (electron mobility). This is because in a metal oxide containing indium, the element M, and zinc, the s orbital of heavy metal mainly contributes to carrier transfer, and when the indium content in the metal oxide is increased, overlaps of the s orbitals of indium atoms are increased; therefore, a metal oxide having a high content of indium has a higher carrier mobility than a metal oxide having a low content of indium.

In contrast, when the indium content and the zinc content in a metal oxide become lower, carrier mobility becomes lower. Thus, with atomic ratios of [In]:[M]:[Zn]=0:1:0 and in the vicinity thereof (e.g., a region C in FIG. 26C), insulation performance becomes better.

Accordingly, the metal oxide of one embodiment of the present invention preferably has an atomic ratio represented by a region A in FIG. 26A. With the atomic ratio, a layered structure with high carrier mobility and a few grain boundaries is easily obtained.

A region B in FIG. 26B represents an atomic ratio of [In]:[M]:[Zn]=4:2:3 or 4:2:4.1 and the vicinity thereof. The vicinity includes an atomic ratio of [In]:[M]:[Zn]=5:3:4. A metal oxide with an atomic ratio represented by the region B is an excellent metal oxide that has particularly high crystallinity and high carrier mobility.

Note that a condition where a metal oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which a metal oxide has a layered structure, and boundaries of the regions A to C are not clear.

Next, the case where the metal oxide is used for a transistor will be described.

Note that when the metal oxide semiconductor is used for a transistor, carrier scattering or the like at a grain boundary can be reduced; thus, the transistor can have high field-effect mobility. In addition, the transistor can have high reliability.

A metal oxide with low carrier density is preferably used for the transistor. For example, a metal oxide whose carrier density is lower than $8\times10^{11}$ cm$^{-3}$, preferably lower than $1\times10^{11}$ cm$^{-3}$, further preferably lower than $1\times10^{10}$ cm$^{-3}$, and greater than or equal to $1\times10^{-9}$ cm$^{-3}$ is used.

A highly purified intrinsic or substantially highly purified intrinsic metal oxide has few carrier generation sources and thus can have a low carrier density. The highly purified intrinsic or substantially highly purified intrinsic metal oxide has a low density of defect states and accordingly has a low density of trap states in some cases.

Charge trapped by the trap states in the metal oxide takes a long time to be released and may behave like fixed charge. Thus, a transistor whose channel region is formed in a metal oxide having a high density of trap states has unstable electrical characteristics in some cases.

In order to obtain stable electrical characteristics of the transistor, it is effective to reduce the concentration of impurities in the metal oxide. In addition, in order to reduce the concentration of impurities in the metal oxide, the concentration of impurities in a film that is adjacent to the metal oxide is preferably reduced. Examples of impurities include hydrogen, nitrogen, alkali metal, alkaline earth metal, iron, nickel, and silicon.

Here, the influence of impurities in the metal oxide is described.

When silicon or carbon that is one of Group 14 elements is contained in the metal oxide, defect states are formed. Thus, the concentration of silicon or carbon in the metal oxide and around an interface with the metal oxide (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the metal oxide contains alkali metal or alkaline earth metal, defect states are formed and carriers are generated, in some cases. Thus, a transistor including a metal oxide that contains alkali metal or alkaline earth metal is likely to be normally-on. Therefore, it is preferable to reduce the concentration of alkali metal or alkaline earth metal in the metal oxide. Specifically, the concentration of alkali metal or alkaline earth metal in the metal oxide measured by SIMS is set lower than or equal to $1\times10^{18}$ atoms/cm$^3$, and preferably lower than or equal to $2\times10^{16}$ atoms/cm$^3$.

When the oxide semiconductor contains nitrogen, the metal oxide easily becomes n-type by generation of electrons serving as carriers and an increase of carrier density. Thus, a transistor whose semiconductor includes a metal oxide that contains nitrogen is likely to be normally-on. For this reason, nitrogen in the metal oxide is preferably reduced as much as possible; for example, the concentration of nitrogen in the metal oxide, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including a metal oxide that contains hydrogen is likely to be normally-on. Accordingly, it is preferable that hydrogen in the metal oxide be reduced as much as possible. Specifically, the hydrogen concentration of the metal oxide measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When a metal oxide with sufficiently reduced impurity concentration is used for a channel formation region in a transistor, the transistor can have stable electrical characteristics.

Next, the case where the metal oxide has a two-layer structure or a three-layer structure is described. A band diagram of insulators that are in contact with a stacked structure of a metal oxide S1, a metal oxide S2, and a metal oxide S3, a band diagram of insulators that are in contact with a stacked structure of the metal oxide S1 and the metal oxide S2, and a band diagram of insulators that are in contact with a stacked structure of the metal oxide S2 and the metal oxide S3 are described with reference to FIGS. 28A to 28C.

Figure 28A:
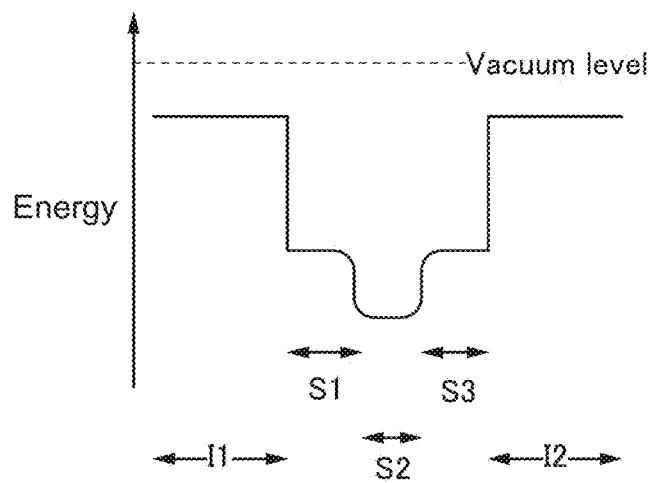
FIGS. 28A to 28C are band diagrams of stacked-layer structures of oxides.
Figure 28B:
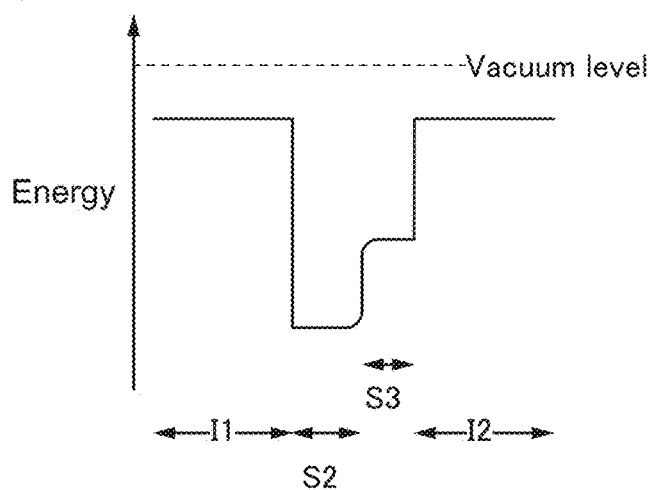
Figure 28C:
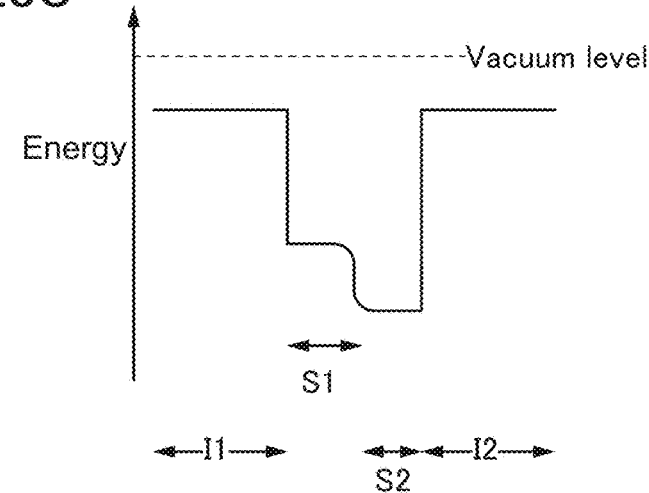

FIG. 28A is an example of a band diagram of a stacked structure including an insulator I1, the metal oxide S1, the metal oxide S2, the metal oxide S3, and an insulator I2 in a film thickness direction. FIG. 28B is an example of a band diagram of a stacked structure including the insulator I1, the metal oxide S2, the metal oxide S3, and the insulator I2 in a film thickness direction. FIG. 28C is an example of a band diagram of a stacked structure including the insulator I1, the metal oxide S1, the metal oxide S2, and the insulator I2 in a thickness direction. Note that for easy understanding, the band diagrams show the conduction band minimum (Ec) of each of the insulator I1, the metal oxide S1, the metal oxide S2, the metal oxide S3, and the insulator I2.

The conduction band minimum of each of the metal oxide S1 and the metal oxide S3 is closer to the vacuum level than the conduction band minimum of the metal oxide S2 is. Typically, the conduction band minimum of the metal oxide S2 is lower than the conduction band minimum of each of the metal oxide S1 and the metal oxide S3. Specifically, a difference in the conduction band minimum between the metal oxide S2 and the metal oxide S1 is preferably greater than or equal to 0.15 eV and less than or equal to 2 eV and further preferably greater than or equal to 0.5 eV and less than or equal to 1 eV. In addition, a difference in the conduction band minimum between the metal oxide S2 and the metal oxide S3 is preferably greater than or equal to 0.15 eV and less than or equal to 2 eV and further preferably greater than or equal to 0.5 eV and less than or equal to 1 eV. This means that the electron affinity of the metal oxide S2 is preferably higher than the electron affinity of each of the metal oxide S1 and the metal oxide S3. Specifically, a difference in the electron affinity between the metal oxide S1 and the metal oxide S2 is preferably greater than or equal to 0.15 eV and less than or equal to 2 eV and further preferably greater than or equal to 0.5 eV and less than or equal to 1 eV, and a difference in the electron affinity between the metal oxide S3 and the metal oxide S2 is preferably greater than or equal to 0.15 eV and less than or equal to 2 eV and further preferably greater than or equal to 0.5 eV and less than or equal to 1 eV.

As shown in FIGS. 28A to 28C, the conduction band minimum of each of the metal oxides Si to S3 is gradually varied. In other words, the conduction band minimum is continuously varied or continuously connected. In order to obtain such a band diagram, the density of defect states in a mixed layer formed at an interface between the metal oxides S1 and S2 or an interface between the metal oxides S2 and S3 is preferably made low.

Specifically, when the metal oxides S1 and S2 or the metal oxides S2 and S3 contain the same element (as a main component) in addition to oxygen, a mixed layer with a low density of defect states can be formed. For example, in the case where the metal oxide S2 is an In—Ga—Zn oxide, it is preferable to use an In—Ga—Zn oxide, a Ga—Zn oxide, gallium oxide, or the like as each of the metal oxides S1 and S3.

At this time, the metal oxide S2 serves as a main carrier path. Since the density of defect states at the interface between the metal oxides S1 and S2 and the interface between the metal oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The metal oxides S1 and S3 can make the trap state apart from the metal oxide S2. This structure can prevent the positive shift of the threshold voltage of the transistor.

A material whose conductivity is sufficiently lower than that of the metal oxide S2 is used for the metal oxides S1 and S3. In that case, the metal oxide S2, the interface between the metal oxides S1 and S2, and the interface between the metal oxides S2 and S3 mainly function as a channel region. For example, a metal oxide with high insulation performance and the atomic ratio represented by the region C in FIG. 26C may be used as each of the metal oxides S1 and S3. Note that the region C in FIG. 26C represents the atomic ratio of [In]:[M]:[Zn]=0:1:0 or the vicinity thereof.

In the case where a metal oxide with the atomic ratio represented by the region A is used as the metal oxide S2, it is particularly preferable to use a metal oxide with [M]/[In] of greater than or equal to 1, preferably greater than or equal to 2 as each of the metal oxides S1 and S3. In addition, it is suitable to use a metal oxide with sufficiently high insulation performance and [M]/([Zn]+[In]) of greater than or equal to 1 as the metal oxide S3.

The insulator 1250 can have a single-layer structure or a stacked-layer structure using, for example, one or more of an insulator containing silicon oxide, silicon oxynitride, silicon nitride oxide, aluminum oxide, hafnium oxide, tantalum oxide, zirconium oxide, lead zirconate titanate (PZT), strontium titanate (SrTiO$_3$), (Ba,Sr)TiO$_3$ (BST), or the like. Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

As the insulator 1250, like the insulator 1224, an oxide insulator that contains oxygen in excess of the stoichiometric composition is preferably used. When such an insulator containing excess oxygen is provided in contact with the metal oxide 1230, oxygen vacancies in the metal oxide 1230 can be reduced.

As the insulator 1250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties with respect to oxygen and hydrogen, can be used. The insulator 1250 formed of such a material each function as a layer that prevents release of oxygen from the metal oxide 1230 and entry of an impurity such as hydrogen from the outside.

Note that the insulator 1250 may have a stacked-layer structure similar to that of the insulator 1220, the insulator 1222, and the insulator 1224. When the insulator 1250 includes an insulator in which a necessary amount of electrons is trapped by electron trap states, the threshold voltage of the transistor 1200a can be shifted in the positive direction. The transistor 1200a having the structure is a normally-off transistor that is in a non-conducting state (also referred to as an off state) even when the gate voltage is 0 V.

In addition to the insulator 1250, a barrier film may be provided between the metal oxide 1230 and the conductor 1260 in the semiconductor device illustrated in FIGS. 23A to 23C. The metal oxide 1230c may have a barrier property.

For example, an insulating film containing excess oxygen is provided in contact with the metal oxide 1230 and covered by a barrier film, whereby the composition of the metal oxide can be almost the same as the stoichiometric composition or can be in a supersaturated state containing more oxygen than that in the stoichiometric composition. It is also possible to prevent entry of impurities such as hydrogen into the metal oxide 1230.

One of a pair of the conductor 1240a and the conductor 1241a and a pair of the conductor 1240b the conductor 1241b functions as a source electrode, and the other pair functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 1240a, 1241a, 1240b, and 1241b. Although a two-layer structure is illustrated in the drawings, a single-layer structure or a stacked-layer structure of three or more layers may be used.

For example, a titanium film is used for each of the conductor 1240a and the conductor 1240b, and an aluminum film is used for each of the conductor 1241a and the conductor 1241b. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

Conductors 1260a and 1260b functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or both of manganese and zirconium may be used. Alternatively, a semiconductor typified by polycrystalline silicon doped with an impurity element such as phosphorus, or a silicide such as nickel silicide may be used.

For example, a two-layer structure where aluminum is used for the conductor 1260a and a titanium film is used for the conductor 1260b is used. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. An alloy film or a nitride film that contains aluminum and one or more metals selected from titanium, tantalum, tungsten, molybdenum, chromium, neodymium, and scandium may be used.

The conductor 1260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 1260 can have a stacked-layer structure of the above light-transmitting conductive material and the above metal.

The insulator 1270 may be provided to cover the conductor 1260. In the case where the insulator 1280 is formed using an oxide material from which oxygen is released, the insulator 1270 is formed using a substance having a barrier property with respect to oxygen to prevent the conductor 1260 from being oxidized by the released oxygen.

For example, the insulator 1270 can be formed using metal oxide such as aluminum oxide. The insulator 1270 is formed to a thickness with which the oxidation of the conductor 1260 is prevented. For example, the thickness of the insulator 1270 is set greater than or equal to 1 nm and less than or equal to 10 nm, preferably greater than or equal to 3 nm and less than or equal to 7 nm.

Thus, the oxidation of the conductor 1260 can be prevented, and oxygen released from the insulator 1280 can be supplied to the metal oxide 1230 efficiently.

In the structure, a region of the metal oxide 1230b where a channel is formed can be electrically surrounded by an electric field of the conductor 1260 that functions as a gate electrode. Because of the s-channel structure, the channel might be formed in the entire metal oxide 1230b, which faces the conductor 1260 with the insulator 1250 interposed therebetween. In the s-channel structure, a large amount of current can flow between a source and a drain of a transistor, so that a high on-state current can be obtained. Furthermore, a voltage is applied from all directions to a region where a channel is formed, and thus, a transistor in which leakage current is suppressed can be provided.

<Structure Example 2 of Transistor>

Figure 24A:
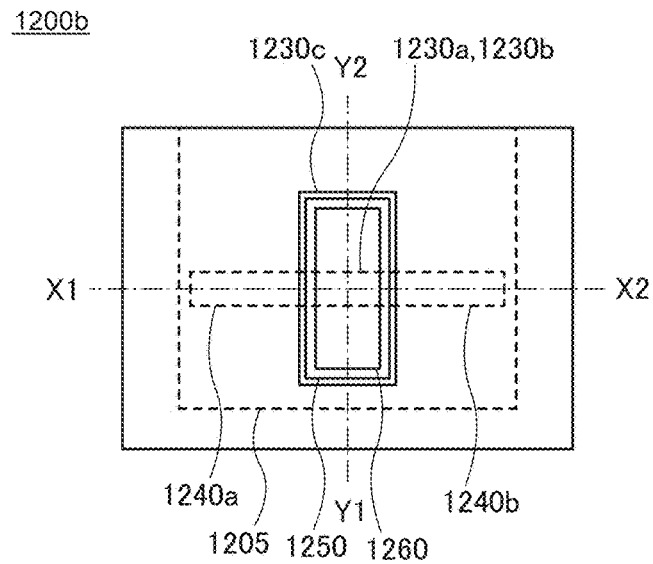
FIGS. 24A to 24C are a top view and cross-sectional views illustrating a structure example of a transistor.
Figure 24B:
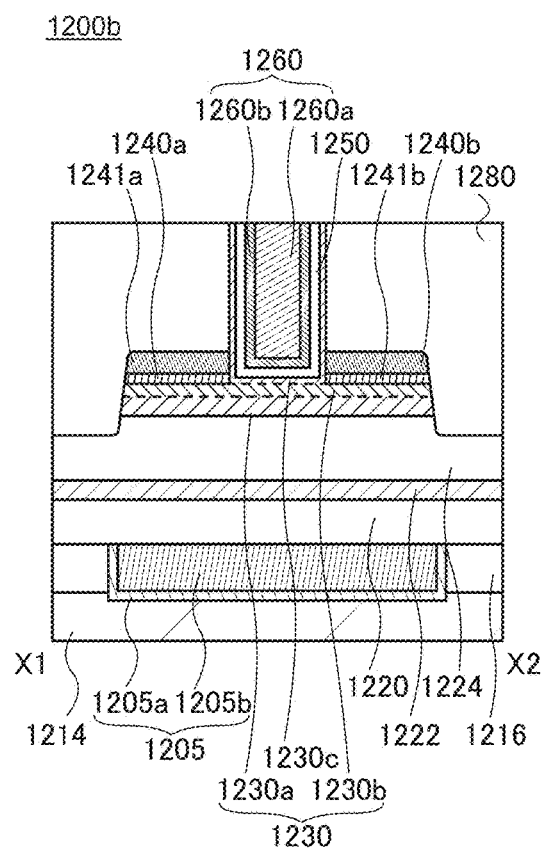
Figure 24C:
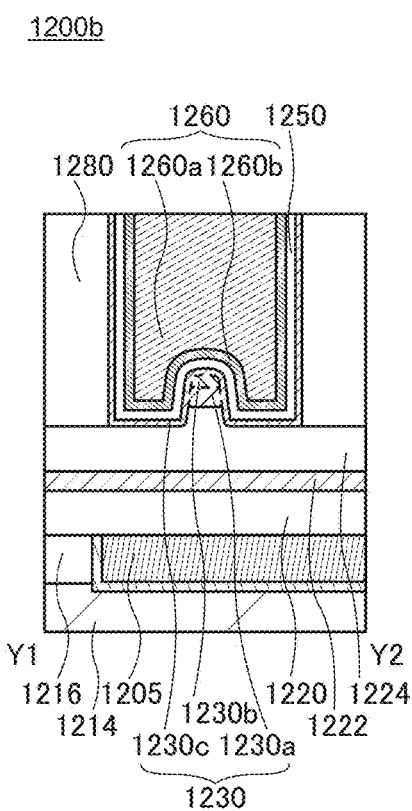

FIGS. 24A to 24C illustrate a structure example of a transistor different from the transistor 1200a. FIG. 24A illustrates a top surface of a transistor 1200b. FIG. 24B is a cross-sectional view taken along a dashed-dotted line X1-X2 in FIG. 24A, and FIG. 24C is a cross-sectional view taken along a dashed-dotted line Y1-Y2 in FIG. 24A.

Note that in the transistor 1200b in FIGS. 24A to 24C, components having the same function as the components in the transistor 1200a in FIGS. 23A to 23C are denoted by the same reference numerals.

In the structure illustrated in FIGS. 24A to 24C, the metal oxide 1230c, the insulator 1250, and the conductor 1260 are formed in an opening formed in the insulator 1280. Furthermore, an end portion of each of the conductor 1240a, the conductor 1240b, the conductor 1241a, and the conductor 1241b is aligned with an end portion of the opening formed in the insulator 1280. Furthermore, an end portion of each of the conductor 1240a, the conductor 1240b, the conductor 1241a, and the conductor 1241b is aligned with part of an end portion of the metal oxide 1230. Therefore, the conductor 1240a, the conductor 1240b, the conductor 1241a, and the conductor 1241b can be formed concurrently with the metal oxide 1230 or the opening in the insulator 1280. This leads to a reduction in the number of masks and steps and improvement in yield and productivity.

Since the transistor 1200b illustrated in FIGS. 24A to 24C has a structure in which the conductors 1240a, 1240b, 1241a, and 1241b hardly overlap with the conductor 1260, the parasitic capacitance added to the conductor 1260 can be reduced. Thus, the transistor 1200b with a high operation frequency can be provided.

<Structure Example 3 of Transistor>

Figure 25A:
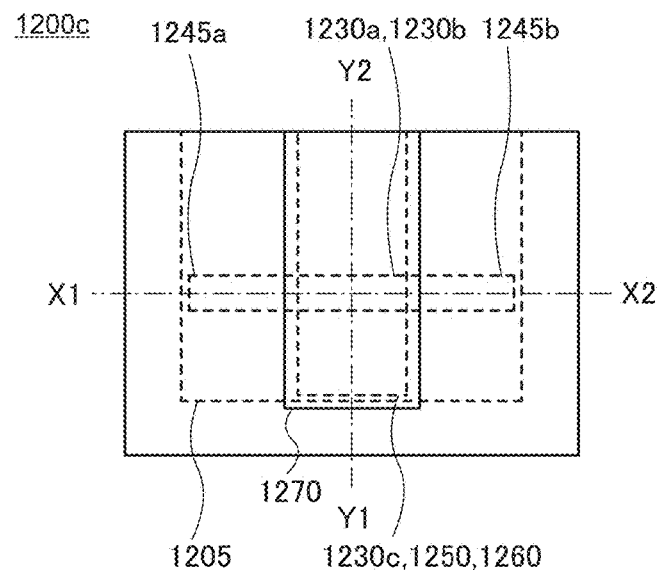
FIGS. 25A to 25C are a top view and cross-sectional views illustrating a structure example of a transistor.
Figure 25B:
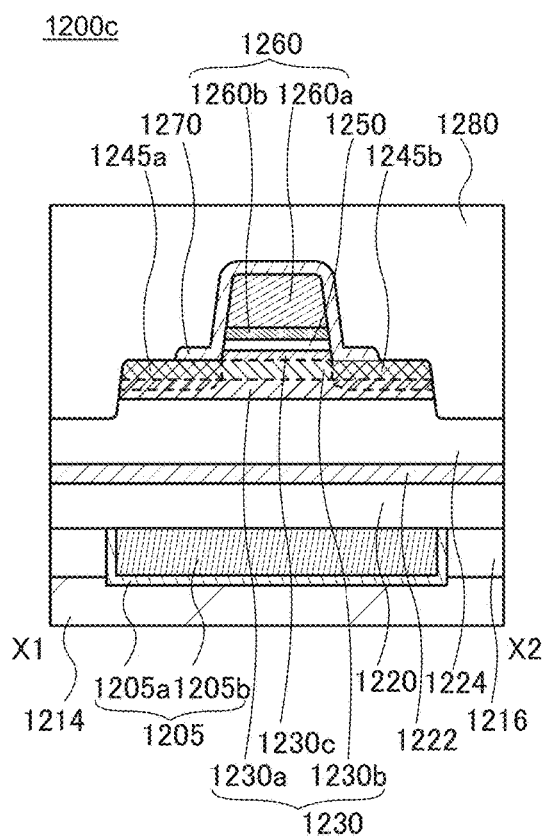
Figure 25C:
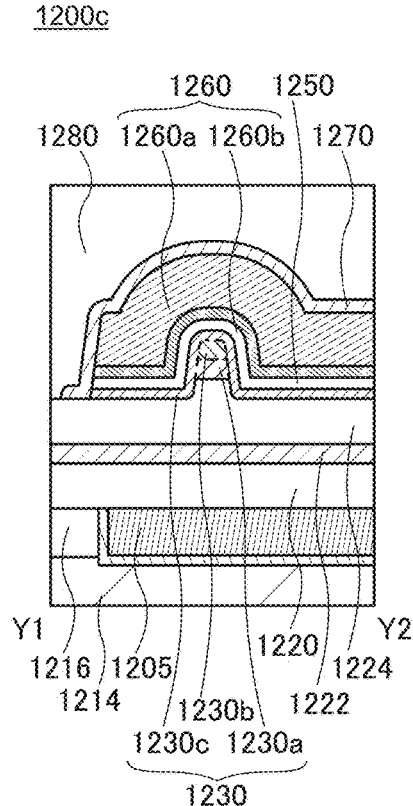

FIGS. 25A to 25C illustrate a structure example of a transistor different from the transistor 1200a and the transistor 1200b. FIG. 25A illustrates a top surface of a transistor 1200c. For simplification of the drawing, some films are not illustrated in FIG. 25A. FIG. 25B is a cross-sectional view taken along a dashed-dotted line X1-X2 in FIG. 25A, and FIG. 25C is a cross-sectional view taken along a dashed-dotted line Y1-Y2.

Note that in the transistor 1200c in FIGS. 25A to 25C, components having the same function as the components in the transistor 1200a in FIGS. 23A to 23C are denoted by the same reference numerals.

In the structure illustrated in FIGS. 25A to 25C, a region 1245a functioning as one of a source region and a drain region and a region 1245b functioning as the other of the source region and the drain region are provided in the metal oxide 1230. The regions can be formed in such a manner that an impurity such as boron, phosphorus, or argon is added to the metal oxide 1230 using the conductor 1260 as a mask. Alternatively, the regions can be formed in such a manner that the insulator 1280 is formed of an insulator containing hydrogen, such as a silicon nitride film and hydrogen is diffused to part of the metal oxide 1230. This leads to a reduction in the number of masks and steps and improvement in yield and productivity.

<Structure Example 4 of Transistor>

Figure 29A:
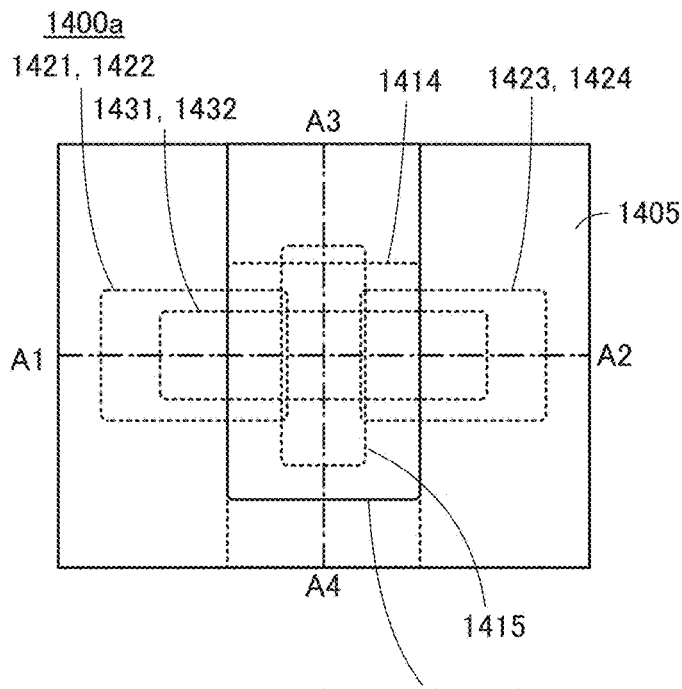
FIGS. 29A to 29C are a top view and cross-sectional views illustrating a structure example of a transistor.
Figure 29B:
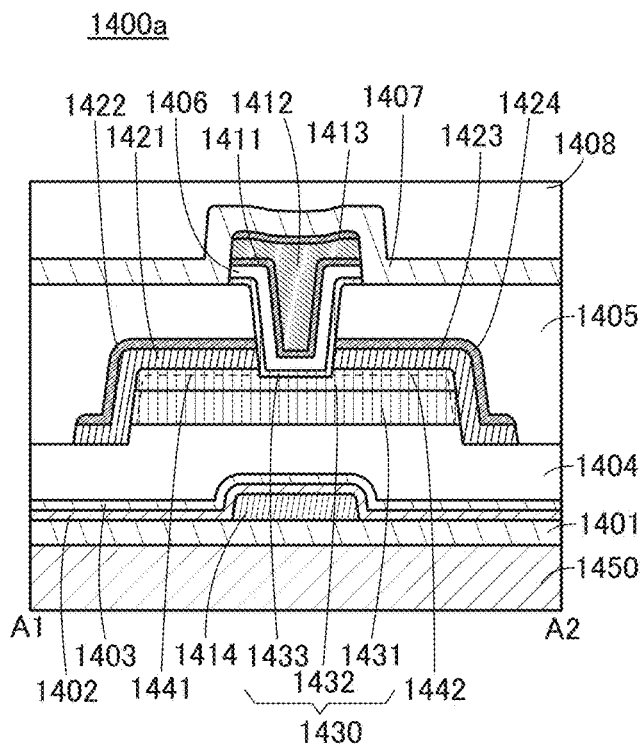
Figure 29C:
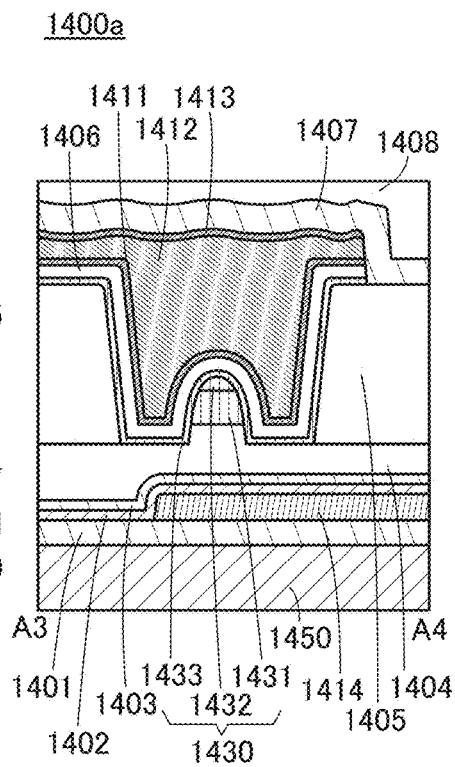

FIGS. 29A to 29C are a top view and cross-sectional views of a transistor 1400a. FIG. 29A is a top view. FIG. 29B is a cross-sectional view taken along a dashed-dotted line A1-A2 in FIG. 29A and FIG. 29C is a cross-sectional view taken along a dashed-dotted line A3-A4 in FIG. 29A. Note that for simplification of the drawing, some components are not illustrated in the top view in FIG. 29A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450; an insulator 1401 over the substrate 1450; a conductor 1414 over the insulator 1401; an insulator 1402 covering the conductor 1414; an insulator 1403 over the insulator 1402; an insulator 1404 over the insulator 1403; a metal oxide 1431 and a metal oxide 1432 which are stacked in this order over the insulator 1404; a conductor 1421 in contact with top and side surfaces of the metal oxide 1432; a conductor 1423 also in contact with the top and side surfaces of the metal oxide 1432; a conductor 1422 over the conductor 1421; a conductor 1424 over the conductor 1423; an insulator 1405 the conductors 1422 and 1424, a metal oxide 1433 in contact with the metal oxides 1431 and 1432, the conductors 1421 to 1424, and the insulator 1405; an insulator 1406 over the metal oxide 1433; a conductor 1411 over the insulator 1406; a conductor 1412 over the conductor 1411; a conductor 1413 over the conductor 1412; an insulator 1407 covering the conductor 1413; and an insulator 1408 over the insulator 1407. Note that the metal oxides 1431 to 1433 are collectively referred to as a metal oxide 1430.

The metal oxide 1432 is a semiconductor and functions as a channel of the transistor 1400a.

Furthermore, the metal oxides 1431 and 1432 include a region 1441 and a region 1442. The region 1441 is formed in the vicinity of a region where the conductor 1421 is in contact with the metal oxides 1431 and 1432. The region 1442 is formed in the vicinity of a region where the conductor 1423 is in contact with the metal oxides 1431 and 1432.

The regions 1441 and 1442 function as low-resistance regions. The region 1441 contributes to a decrease in the contact resistance between the conductor 1421 and the metal oxides 1431 and 1432. The region 1442 also contributes to a decrease in the contact resistance between the conductor 1423 and the metal oxides 1431 and 1432.

The conductors 1421 and 1422 function as one of source and drain electrodes of the transistor 1400a. The conductors 1423 and 1424 function as the other of the source and drain electrodes of the transistor 1400a.

The conductor 1422 is configured to allow less oxygen to pass therethrough than the conductor 1421. It is thus possible to prevent a decrease in the conductivity of the conductor 1421 due to oxidation.

The conductor 1424 is also configured to allow less oxygen to pass therethrough than the conductor 1423. It is thus possible to prevent a decrease in the conductivity of the conductor 1423 due to oxidation.

The conductors 1411 to 1413 function as a first gate electrode of the transistor 1400a.

The conductors 1411 and 1413 are configured to allow less oxygen to pass therethrough than the conductor 1412. It is thus possible to prevent a decrease in the conductivity of the conductor 1412 due to oxidation.

The insulator 1406 functions as a first gate insulator of the transistor 1400a.

The conductor 1414 functions as a second gate electrode of the transistor 1400a.

The potential applied to the conductors 1411 to 1413 may be the same as or different from that applied to the conductor 1414. The conductor 1414 may be omitted in some cases.

The insulators 1401 to 1404 function as a base insulator of the transistor 1400a. The insulators 1402 to 1404 also function as a second gate insulator of the transistor 1400a.

The insulators 1405 to 1408 function as a protective insulator or an interlayer insulator of the transistor 1400a.

As illustrated in FIG. 29C, the side surface of the metal oxide 1432 is surrounded by the conductor 1411. With this structure, the metal oxide 1432 can be electrically surrounded by an electric field of the conductor 1411. Such a structure of a transistor in which a semiconductor is electrically surrounded by an electric field of a gate electrode is referred to as a surrounded channel (s-channel) structure. With such a structure, a channel is formed in the entire metal oxide 1432 (bulk). In the s-channel structure, a large amount of current can flow between a source and a drain of a transistor, increasing the on-state current of the transistor.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400a, a region serving as a gate electrode is formed so as to fill an opening 1415 formed in the insulator 1405 or the like, that is, in a self-aligned manner.

As illustrated in FIG. 29B, the conductors 1411 and 1422 have a region where they overlap with each other with the insulator positioned therebetween. The conductors 1411 and 1423 also have a region where they overlap with each other with the insulator positioned therebetween. These regions function as the parasitic capacitance caused between the gate electrode and the source or drain electrode and might decrease the operation speed of the transistor 1400a. This parasitic capacitance can be reduced by providing the insulator 1405 in the transistor 1400a. The insulator 1405 preferably contains a material with a low relative dielectric constant.

Figure 30A:
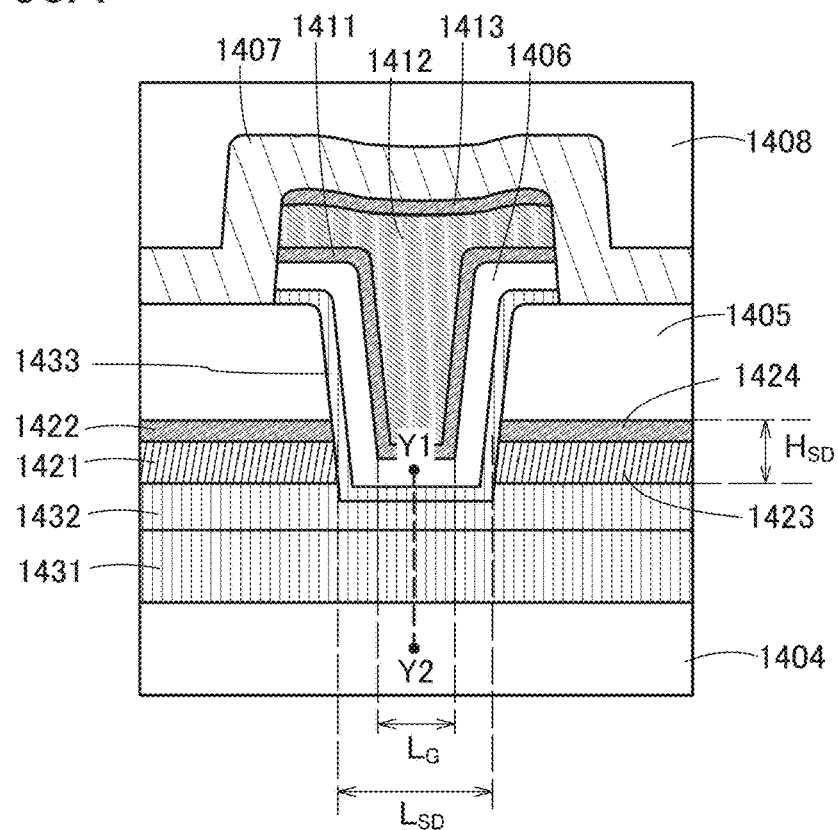
FIG. 30A is a cross-sectional view illustrating a structure example of a transistor and FIG. 30B is an energy band diagram of the transistor.

FIG. 30A is an enlarged view of the center of the transistor 1400a. In FIG. 30A, a width $L_G$ denotes the length of the bottom surface of the conductor 1411, which faces parallel to the top surface of the metal oxide 1432 with the insulator 1406 and the metal oxide 1433 positioned therebetween. The width $L_G$ is the line width of the gate electrode. In FIG. 30A, a width $L_{SD}$ denotes the length between the conductors 1421 and 1423, i.e., the length between the source electrode and the drain electrode.

The width $L_{SD}$ is generally determined by the minimum feature size. As illustrated in FIG. 30A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 30A, a height $H_{SD}$ denotes the total thickness of the conductors 1421 and 1422, or the total thickness of the conductors 1423 and 1424.

The thickness of the insulator 1406 is preferably less than or equal to the height $H_{SD}$, in which case the electric field of the gate electrode can be applied to the entire channel formation region. The thickness of the insulator 1406 is less than or equal to 30 nm, preferably less than or equal to 10 nm.

The parasitic capacitance between the conductors 1422 and 1411 and the parasitic capacitance between the conductors 1424 and 1411 are inversely proportional to the thickness of the insulator 1405. For example, the thickness of the insulator 1405 is preferably three times or more, and further preferably five times or more the thickness of the insulator 1406, in which case the parasitic capacitance is negligibly small. As a result, the transistor 1400a can operate at high frequencies.

Components of the transistor 1400a will be described below.

<<Metal Oxide Layer>>

First, a metal oxide that can be used as the metal oxides 1431 to 1433 will be described.

The transistor 1400a preferably has a low current (off-state current) flowing between a source and a drain when the transistor 1400a is in a non-conducting state. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The metal oxide 1432 is preferably a CAAC-OS film which is described later.

The metal oxides 1431 and 1433 include, for example, one or more elements other than oxygen included in the metal oxide 1432. Since the metal oxides 1431 and 1433 include one or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, further preferably lower than 25 atomic % and higher than 75 atomic %, respectively. When the metal oxide 1431 is formed by a sputtering method, a sputtering target containing In, M, and Zn at an atomic ratio of 1:3:2, 1:3:4, or the like can be used.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, further preferably higher than 34 atomic % and lower than 66 atomic %, respectively. When the metal oxide 1432 is formed by a sputtering method, a sputtering target containing In, M, and Zn at an atomic ratio of 1:1:1, 1:1:1.2, 2:1:3, 3:1:2, 4:2:4.1, or the like can be used. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, further preferably lower than 25 atomic % and higher than 75 atomic %, respectively. For example, In:M:Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 30B:
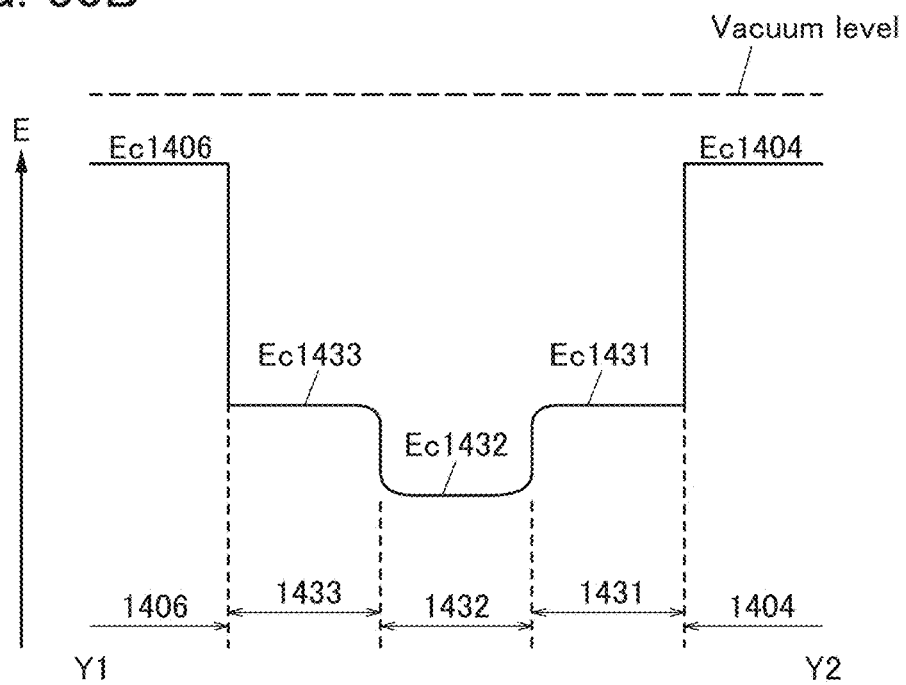

The function and effect of the metal oxide 1430, which includes a stack of the metal oxides 1431 to 1433, are described with reference to the energy band diagram of FIG. 30B. FIG. 30B shows an energy band structure of a portion taken along a dashed line Y1-Y2 in FIG. 30A, that is, FIG. 30B shows the energy band structure of a channel formation region of the transistor 1400a and the vicinity thereof.

In FIG. 30B, Ec1404, Ec1431, Ec1432, Ec1433, and Ec1406 indicate the conduction band minimum of the insulator 1404, the metal oxide 1431, the metal oxide 1432, the metal oxide 1433, and the insulator 1406, respectively.

Here, a difference in energy between the vacuum level and the conduction band minimum (the difference is also referred to as electron affinity) corresponds to a value obtained by subtracting an energy gap from a difference in energy between the vacuum level and the valence band maximum (the difference is also referred to as an ionization potential). Note that the energy gap can be measured using a spectroscopic ellipsometer. The difference in energy between the vacuum level and the valence band maximum can be measured using an ultraviolet photoelectron spectroscopy (UPS) device.

Since the insulators 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having higher electron affinity than those of the metal oxides 1431 and 1433. For example, as the metal oxide 1432, a metal oxide having an electron affinity higher than those of the metal oxides 1431 and 1433 by greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV is used. Note that the electron affinity is a difference in energy between the vacuum level and the conduction band minimum.

An indium gallium oxide has a low electron affinity and a high oxygen-blocking property. Therefore, the metal oxide 1433 preferably includes an indium gallium oxide. The gallium atomic ratio [Ga/(In+Ga)] is, for example, higher than or equal to 70%, preferably higher than or equal to 80%, and further preferably higher than or equal to 90%.

At this time, when a gate voltage is applied, a channel is formed in the metal oxide 1432 having the highest electron affinity among the metal oxides 1431 to 1433.

Thus, electrons move mainly in the metal oxide 1432, not in the metal oxides 1431 and 1433. Hence, the on-state current hardly varies even when the interface state density, which inhibits electron movement, is high at the interface between the metal oxide 1431 and the insulator 1404 or at the interface between the metal oxide 1433 and the insulator 1406. The metal oxides 1431 and 1433 function as an insulator.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, further preferably less than 0.5 nm, still further preferably less than 0.4 nm. The average surface roughness (Ra) with the measurement area of 1 μm×1 μm is less than 1 nm, preferably less than 0.6 nm, further preferably less than 0.5 nm, still further preferably less than 0.4 nm. The maximum difference (P-V) with the measurement area of 1 μm×1 μm is less than 10 nm, preferably less than 9 nm, further preferably less than 8 nm, still further preferably less than 7 nm. The RMS roughness, Ra, and P-V can be measured with, for example, a scanning probe microscope SPA-500 manufactured by SII Nano Technology Inc.

The electron movement is also inhibited in the case where the density of defect states is high in the channel formation region. For example, in the case where the metal oxide 1432 contains oxygen vacancies ($V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, still further preferably higher than or equal to $1\times10^{16}$ atoms/cm$^3$ and lower than or equal to $5\times10^{18}$ atoms/cm$^3$.

To decrease oxygen vacancies in the metal oxide 1432, for example, there is a method in which excess oxygen contained in the insulator 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, further preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness greater than or equal to 0.3 nm, preferably greater than or equal to 1 nm, further preferably greater than or equal to 2 nm. The metal oxide 1433 preferably has an oxygen blocking property to inhibit outward diffusion of oxygen released from the insulator 1404 and the like.

To improve reliability, preferably, the thickness of the metal oxide 1431 is large and the thickness of the metal oxide 1433 is small. For example, the metal oxide 1431 has a region with a thickness greater than or equal to 10 nm, preferably greater than or equal to 20 nm, further preferably greater than or equal to 40 nm, still further preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, further preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 1432 and 1431. The concentration of silicon is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/cm$^3$, further preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, and still further preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $1\times10^{18}$ atoms/cm$^3$, and still further preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without the metal oxide 1431 or 1433 may be employed. Alternatively, any one of the semiconductors shown as examples of the metal oxides 1431 to 1433 may be provided over or below the metal oxide 1431 or over or below the metal oxide 1433, i.e., a four-layer structure may be employed. Further alternatively, an n-layer structure (n is an integer of 5 or more) in which any one of the semiconductors shown as examples of the metal oxides 1431 to 1433 is provided at two or more of the following positions may be employed: over the metal oxide 1431, below the metal oxide 1431, over the metal oxide 1433, and below the metal oxide 1433.

<<Substrate>>

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. The semiconductor substrate may be a silicon on insulator (SOI) substrate in which an insulating region is provided in the above semiconductor substrate. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 µm and less than or equal to 700 µm, preferably greater than or equal to 10 µm and less than or equal to 500 µm, further preferably greater than or equal to 15 µm and less than or equal to 300 µm. When the substrate 1450 has small thickness, the weight of the semiconductor device can be reduced. When the substrate 1450 has small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulator>>

The insulator 1401 has a function of electrically isolating the substrate 1450 from the conductor 1414.

The insulator 1401 or 1402 is formed using an insulator having a single-layer structure or a stacked-layer structure. Examples of the material of an insulator include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulator 1402 may be formed using silicon oxide with high step coverage which is formed by reacting tetraethyl orthosilicate (TEOS), silane, or the like with oxygen, nitrous oxide, or the like.

After the insulator 1402 is formed, the insulator 1402 may be subjected to planarization treatment using a CMP method or the like to improve the planarity of the top surface thereof.

The insulator 1404 preferably contains an oxide. In particular, the insulator 1404 preferably contains an oxide material from which part of oxygen is released by heating. The insulator 1404 preferably contains an oxide containing oxygen more than that in the stoichiometric composition. Part of oxygen is released by heating from an oxide film containing oxygen more than that in the stoichiometric composition. Oxygen released from the insulator 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulator 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulator 1404.

To make the insulator 1404 contain excess oxygen, the insulator 1404 is formed in an oxygen atmosphere, for example. Alternatively, a region containing excess oxygen may be formed by introducing oxygen into the insulator 1404 that has been formed. Both the methods may be combined.

For example, oxygen (at least including any of oxygen radicals, oxygen atoms, and oxygen ions) may be introduced into the insulator 1404 that has been formed, so that a region containing excess oxygen is formed. Oxygen can be introduced by, for example, an ion implantation method, an ion doping method, a plasma immersion ion implantation method, plasma treatment, or the like.

A gas containing oxygen can be used in an oxygen introducing method. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulator 1404 is formed, the insulator 1404 may be subjected to planarization treatment using a CMP method or the like to improve the planarity of the top surface thereof.

The insulator 1403 has a passivation function of preventing oxygen contained in the insulator 1404 from decreasing by bonding to metal contained in the conductor 1414.

The insulator 1403 has a function of blocking oxygen, hydrogen, water, alkali metal, alkaline earth metal, and the like. Providing the insulator 1403 can prevent outward diffusion of oxygen from the metal oxide 1430 and entry of hydrogen, water, or the like into the metal oxide 1430 from the outside.

The insulator 1403 can be, for example, a nitride insulator. The nitride insulator is formed using silicon nitride, silicon nitride oxide, aluminum nitride, aluminum nitride oxide, or the like. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

The threshold voltage of the transistor 1400a can be controlled by injecting electrons into a charge trap layer. The charge trap layer is preferably provided in the insulator 1402 or the insulator 1403. For example, when the insulator 1403 is formed using hafnium oxide, aluminum oxide, tantalum oxide, aluminum silicate, or the like, the insulator 1403 can function as a charge trap layer.

<<Gate Electrode>>

The conductors 1411 to 1414 each preferably have a single-layer structure or a stacked-layer structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductor is preferably formed using a low-resistance conductive material such as aluminum or copper. It is further preferable to form the conductor using a Cu—Mn alloy, in which case manganese oxide formed at the interface with an insulator containing oxygen has a function of preventing Cu diffusion.

Alternatively, the conductors 1411 to 1414 may be formed using any one of the materials for the metal oxides 1431 to 1433 described above. Note that the metal oxides 1431 to 1433 formed under the aforementioned conditions function as a semiconductor; therefore, an additional process is necessary so that the metal oxides 1431 to 1433 can function as a conductor. Specifically, any one of the metal oxides 1431 to 1433 is formed as the conductors 1411 to 1414 and a silicon nitride film is formed as the insulator 1407 by a method using plasma containing hydrogen such as a CVD method, thereby reducing the resistance of the metal oxides 1431 to 1433. As a result, the metal oxides 1431 to 1433 function as a conductor and can be used for the conductors 1411 to 1414.

<<Source Electrode and Drain Electrode>>

The conductors 1421 to 1424 each preferably have a single-layer structure or a stacked-layer structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material which has both heat resistance and conductivity, such as tungsten or molybdenum. In addition, the conductor is preferably formed using a low-resistance conductive material such as aluminum or copper. It is further preferable to form the conductor using a Cu—Mn alloy, in which case manganese oxide formed at the interface with an insulator containing oxygen has a function of preventing Cu diffusion.

In particular, in the case of using tungsten for any of the conductors 1421 to 1424, it is preferable to use tungsten for the conductors 1422 and 1424 and to use tantalum nitride for the conductors 1421 and 1423. Since tungsten is a material that is easily oxidized, if tungsten is in contact with the oxide semiconductor, tungsten might capture oxygen from the oxide semiconductor and form oxygen vacancies in the oxide semiconductor. Thus, tantalum nitride formed between tungsten and the oxide semiconductor can prevent the transfer of oxygen between tungsten and the oxide semiconductor. In this manner, tungsten that has both heat resistance and conductivity can be used for the conductors.

The conductors 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-resistance Region>>

The regions 1441 and 1442 are formed when, for example, the conductors 1421 and 1423 take oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulator 1406 preferably contains an insulator with a high relative dielectric constant. For example, the insulator 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulator 1406 preferably has a stacked-layer structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the stacked-layer structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulator 1405 preferably contains an insulator with a low relative dielectric constant. For example, the insulator 1405 preferably contains silicon oxide, silicon oxynitride, silicon nitride oxide, silicon nitride, or a resin. Alternatively, the insulator 1405 preferably has a stacked-layer structure containing silicon oxide or silicon oxynitride and a resin. Because silicon oxide and silicon oxynitride have thermal stability, combination of silicon oxide or silicon oxynitride with a resin allows the stacked-layer structure to be thermally stable and have a low relative dielectric constant. Examples of the resin include polyester, polyolefin, polyamide (e.g., nylon or aramid), polyimide, polycarbonate, and acrylic.

The insulator 1407 has a function of blocking oxygen, hydrogen, water, alkali metal, alkaline earth metal, and the like. Providing the insulator 1407 can prevent outward diffusion of oxygen from the metal oxide 1430 and entry of hydrogen, water, or the like into the metal oxide 1430 from the outside.

The insulator 1407 can be, for example, a nitride insulator. The nitride insulator is formed using silicon nitride, silicon nitride oxide, aluminum nitride, aluminum nitride oxide, or the like. Note that instead of the nitride insulator, an oxide insulator having a blocking effect against oxygen, hydrogen, water, and the like may be provided. Examples of the oxide insulator include aluminum oxide, aluminum oxynitride, gallium oxide, gallium oxynitride, yttrium oxide, yttrium oxynitride, hafnium oxide, and hafnium oxynitride.

An aluminum oxide film is preferably used for the insulator 1407 because it is highly effective in preventing transmission of both oxygen and impurities such as hydrogen and moisture.

When the insulator 1407 is formed by a method using plasma containing oxygen, e.g., by a sputtering method or a CVD method, oxygen can be added to side and top surfaces of the insulators 1405 and 1406. It is preferable to perform second heat treatment at any time after the formation of the insulator 1407. Through the second heat treatment, oxygen added to the insulators 1405 and 1406 is diffused in the insulators to reach the metal oxide 1430, whereby oxygen vacancies in the metal oxide 1430 can be reduced.

Figure 31A:
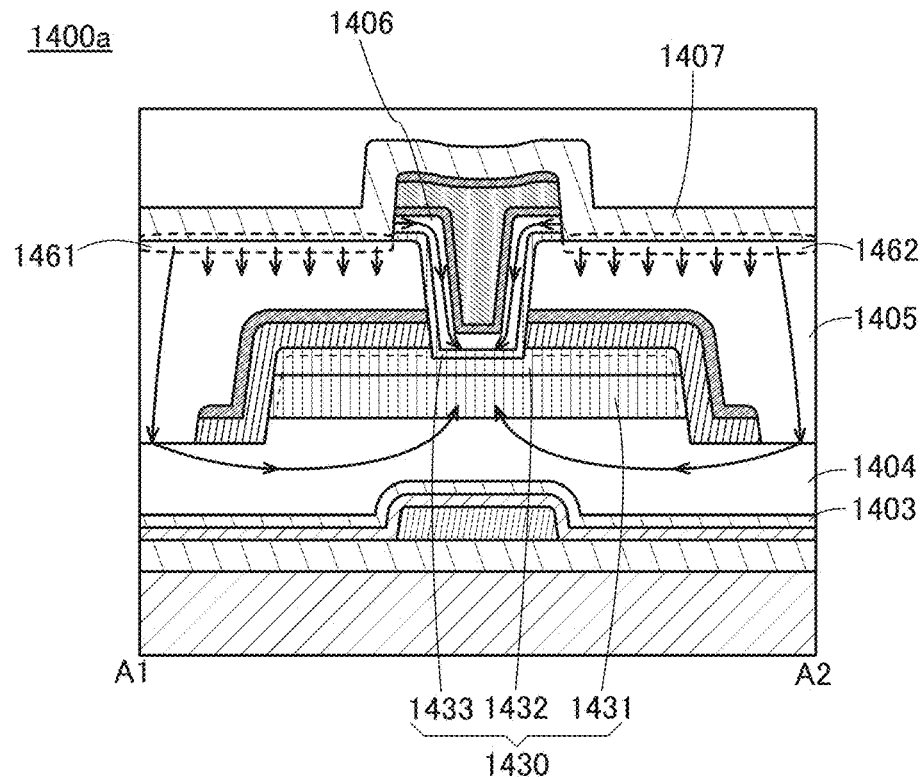
FIGS. 31A and 31B are cross-sectional views illustrating oxygen diffusion paths.
Figure 31B:
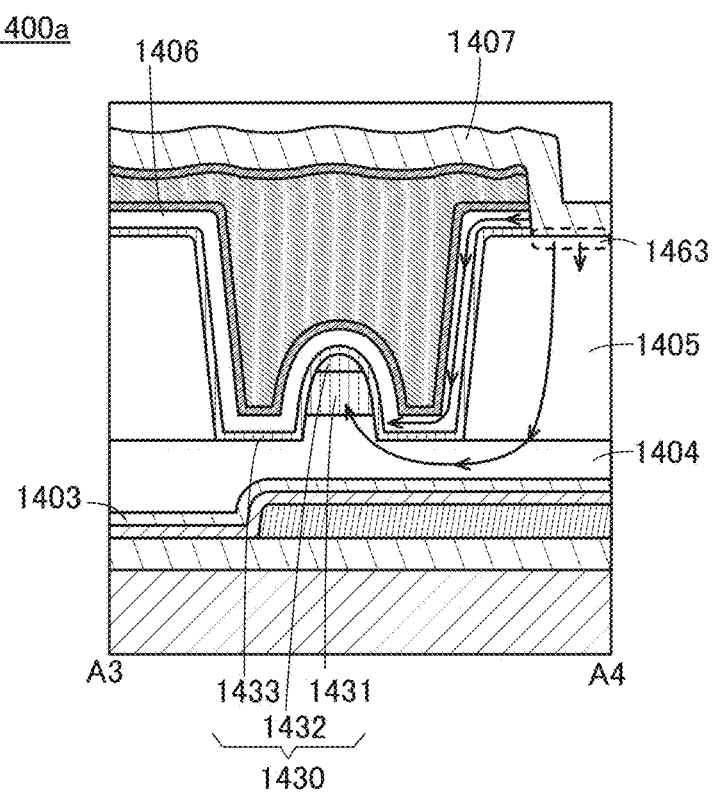

In schematic views of FIGS. 31A and 31B, oxygen added to the insulators 1405 and 1406 in the formation of the insulator 1407 is diffused in the insulators through the second heat treatment and reaches the metal oxide 1430. In FIG. 31A, oxygen diffused in the cross-sectional view of FIG. 29B is indicated by arrows. In FIG. 31B, oxygen diffused in the cross-sectional view of FIG. 29C is indicated by arrows.

As illustrated in FIGS. 31A and 31B, oxygen added to the side surface of the insulator 1406 is diffused in the insulator 1406 and reaches the metal oxide 1430. In addition, a region 1461, a region 1462, and a region 1463 each containing excess oxygen are sometimes formed in the vicinity of the interface between the insulators 1407 and 1405. Oxygen contained in the regions 1461 to 1463 reaches the metal oxide 1430 through the insulators 1405 and 1404. In the case where the insulator 1405 includes silicon oxide and the insulator 1407 includes aluminum oxide, a mixed layer of silicon, aluminum, and oxygen is formed in the regions 1461 to 1463 in some cases.

The insulator 1407 has a function of blocking oxygen and prevents oxygen from being diffused over the insulator 1407. The insulator 1403 also has a function of blocking oxygen and prevents oxygen from being diffused under the insulator 1403.

Note that the second heat treatment may be performed at a temperature that allows oxygen added to the insulators 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulator 1404 can be inhibited. Note that the second heat treatment is not necessarily performed when heating during formation of the films can work as heat treatment comparable to the second heat treatment.

As described above, oxygen can be supplied to the metal oxide 1430 from above and below through the formation of the insulator 1407 and the second heat treatment.

Alternatively, oxygen can be added to the insulators 1405 and 1406 by forming a film containing indium oxide, e.g., an In-M-Zn oxide, as the insulator 1407.

The insulator 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulator 1408, a resin such as a polyimide resin, a polyamide resin, an acrylic resin, a siloxane resin, an epoxy resin, or a phenol resin can be used. The insulator 1408 may be a stack including any of the above materials.

<Structure Example 5 of Transistor>

The conductor 1414 and the insulators 1402 and 1403 can be omitted in the transistor 1400a illustrated n in FIGS. 29A to 29C. An example of such a structure is illustrated in FIGS. 32A to 32C.

Figure 32A:
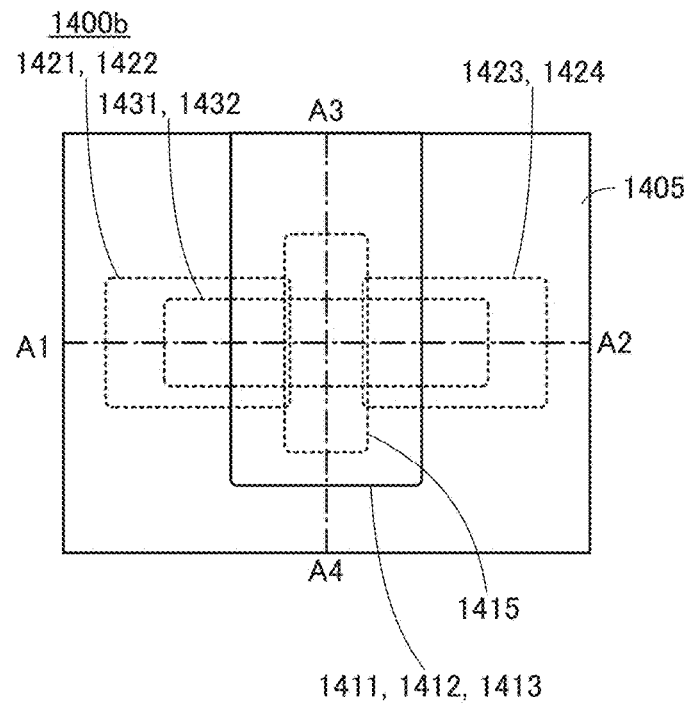
FIGS. 32A to 32C are a top view and cross-sectional views illustrating a structure example of a transistor.
Figure 32B:
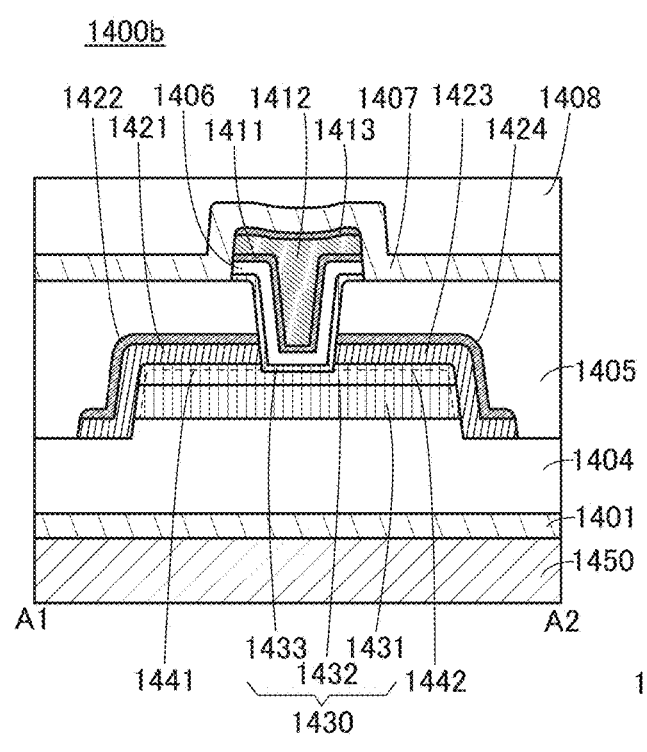
Figure 32C:
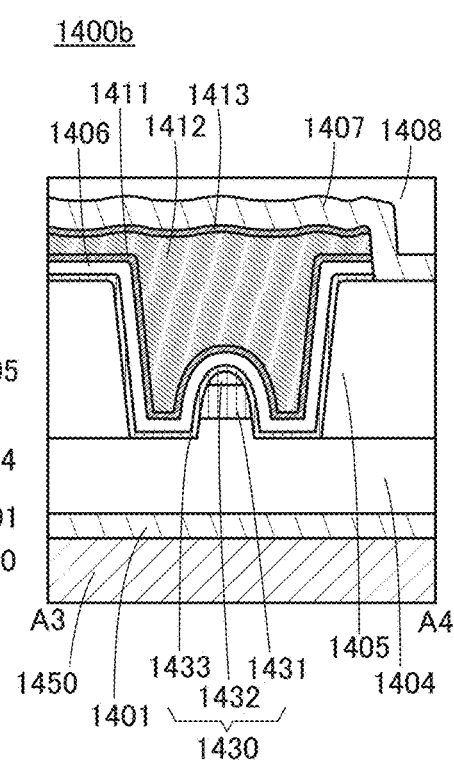

FIGS. 32A to 32C are a top view and cross-sectional views of a transistor 1400b. FIG. 32A is a top view. FIG. 32B is a cross-sectional view taken along a dashed-dotted line A1-A2 in FIG. 32A and FIG. 32C is a cross-sectional view taken along a dashed-dotted line A3-A4 in FIG. 32A. Note that for simplification of the drawing, some components are not illustrated in the top view in FIG. 32A. Note that the dashed-dotted line A1-A2 and the dashed-dotted line A3-A4 are sometimes referred to as a channel length direction of the transistor 1400b and a channel width direction of the transistor 1400b, respectively.

<Structure Example 6 of Transistor>

In the transistor 1400a illustrated in FIGS. 29A to 29C, parts of the conductors 1421 and 1423 that overlap with the gate electrode (the conductors 1411 to 1413) can be reduced in thickness. An example of such a structure is illustrated in FIGS. 33A to 33C.

Figure 33A:
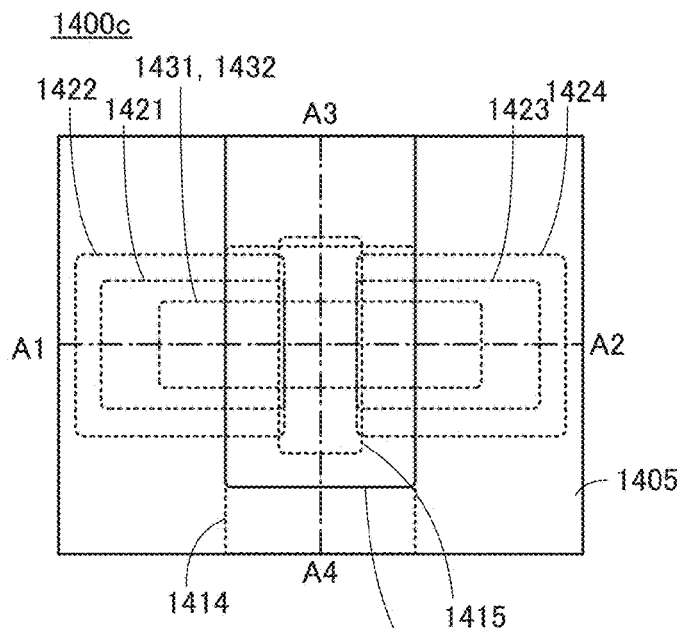
FIGS. 33A to 33C are a top view and cross-sectional views illustrating a structure example of a transistor.
Figure 33B:
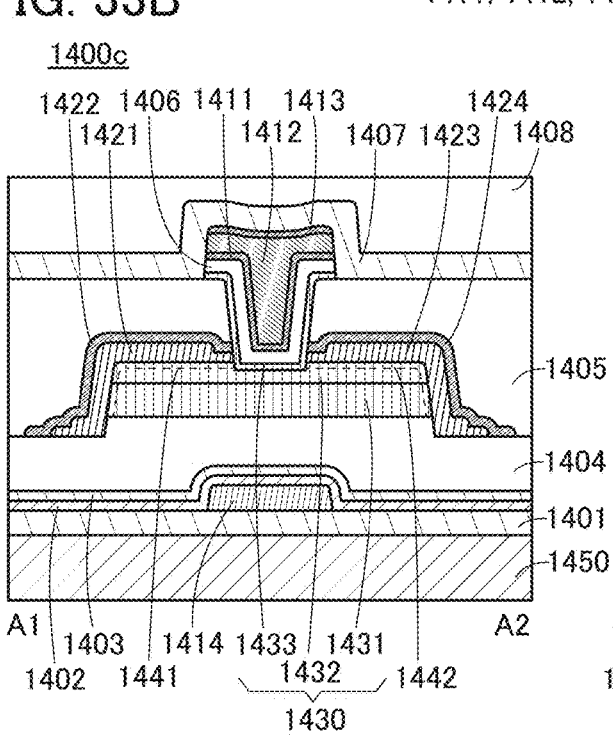
Figure 33C:
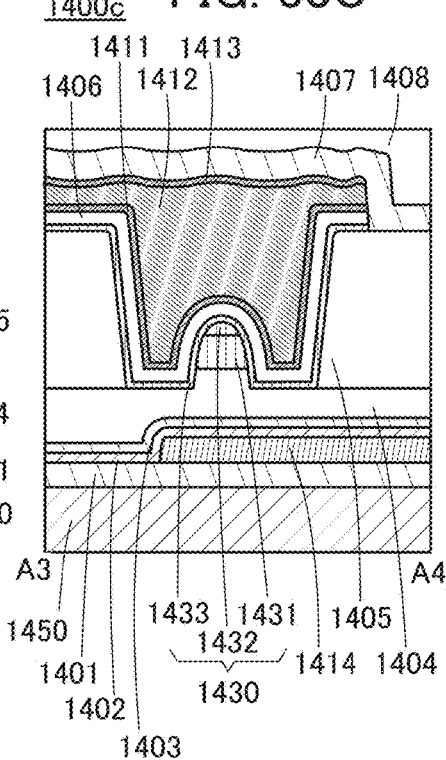

FIGS. 33A to 33C are a top view and cross-sectional views of a transistor 1400c. FIG. 33A is a top view. FIG. 33B is a cross-sectional view taken along a dashed-dotted line A1-A2 in FIG. 33A and FIG. 33C is a cross-sectional view taken along a dashed-dotted line A3-A4 in FIG. 33A. Note that for simplification of the drawing, some components are not illustrated in the top view in FIG. 33A. Note that the dashed-dotted line A1-A2 and the dashed-dotted line A3-A4 are sometimes referred to as a channel length direction of the transistor 1400c and a channel width direction of the transistor 1400c, respectively.

In the transistor 1400c illustrated in FIG. 33B, part of the conductor 1421 that overlaps with the gate electrode is reduced in thickness, and the conductor 1422 covers the conductor 1421. Part of the conductor 1423 that overlaps with the gate electrode is also reduced in thickness, and the conductor 1424 covers the conductor 1423.

The transistor 1400c, which has the structure illustrated in FIG. 33B, can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

<Structure Example 7 of Transistor>

In the transistor 1400c illustrated in FIGS. 33A to 33C, the width of the metal oxides 1431 and 1432 can be increased in the A3-A4 direction. An example of such a structure is illustrated in FIGS. 34A to 34C.

Figure 34A:
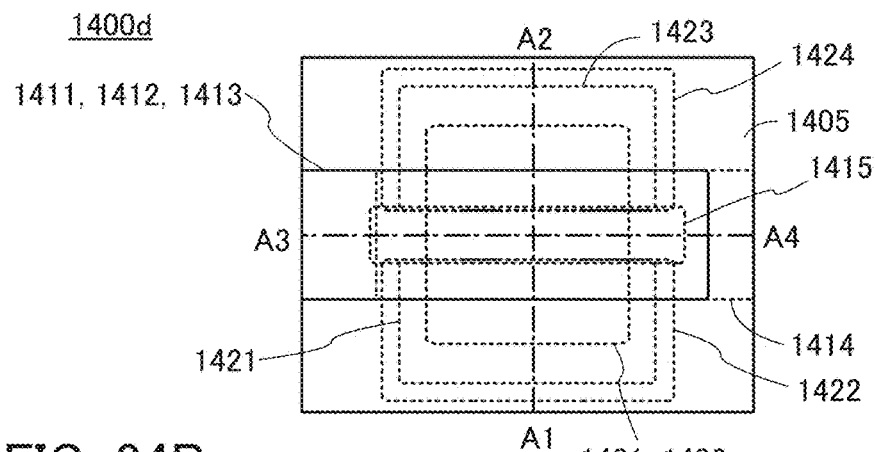
FIGS. 34A to 34C are a top view and cross-sectional views illustrating a structure example of a transistor.
Figure 34B:
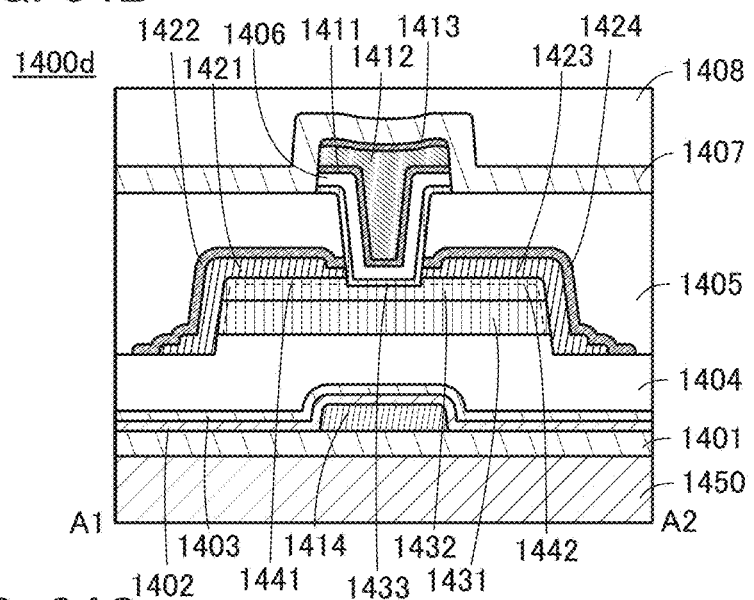
Figure 34C:
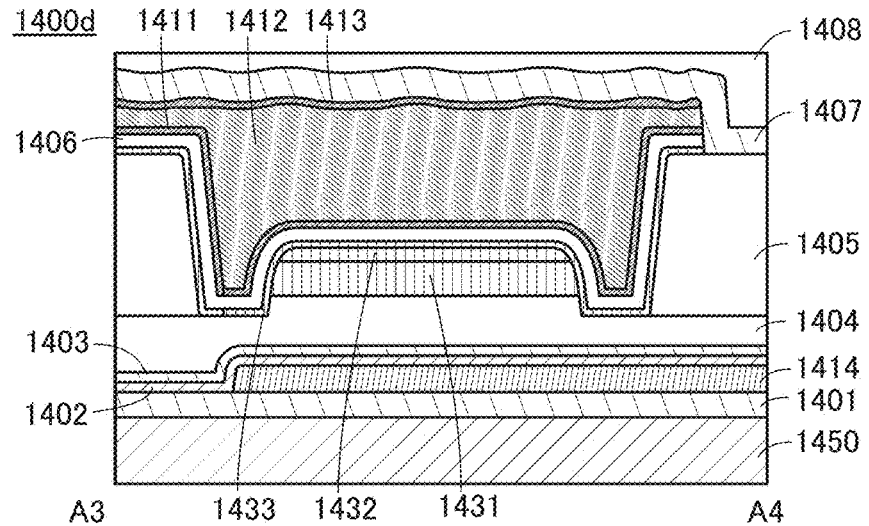

FIGS. 34A to 34C are a top view and cross-sectional views of a transistor 1400d. FIG. 34A is a top view. FIG. 34B is a cross-sectional view taken along a dashed-dotted line A1-A2 in FIG. 34A and FIG. 34C is a cross-sectional view taken along a dashed-dotted line A3-A4 in FIG. 34A. Note that for simplification of the drawing, some components are not illustrated in the top view in FIG. 34A. Note that the dashed-dotted line A1-A2 and the dashed-dotted line A3-A4 are sometimes referred to as a channel length direction of the transistor 1400d and a channel width direction of the transistor 1400d, respectively.

The transistor 1400d, which has the structure illustrated in FIGS. 34A to 34C, can have an increased on-state current.

<Structure Example 8 of Transistor>

In the transistor 1400c illustrated in FIGS. 33A to 33C, a plurality of regions (hereinafter referred to as fins) consisting of the metal oxides 1431 and 1432 may be provided in the A3-A4 direction. An example of such a structure is illustrated in FIGS. 35A to 35C.

Figure 35A:
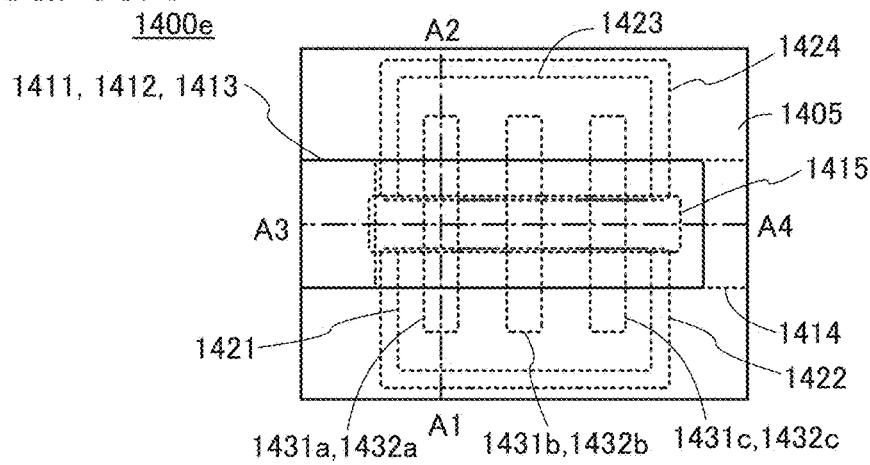
FIGS. 35A to 35C are a top view and cross-sectional views illustrating a structure example of a transistor.
Figure 35B:
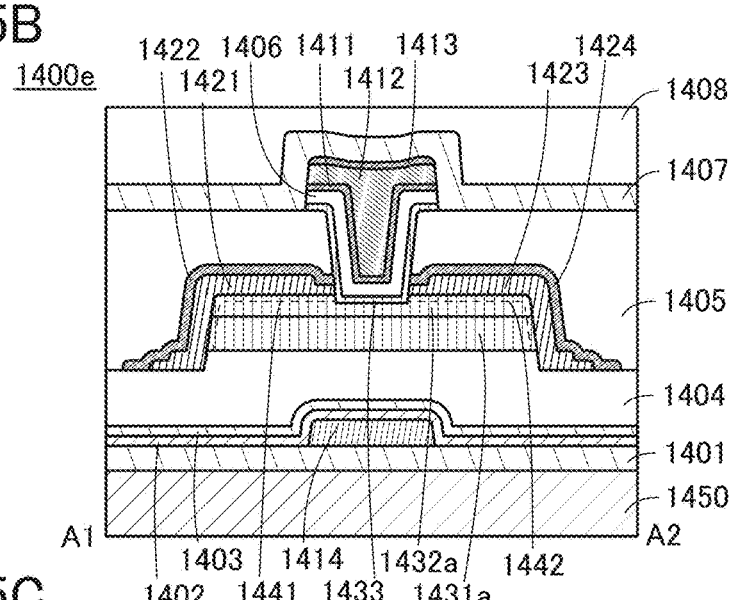
Figure 35C:
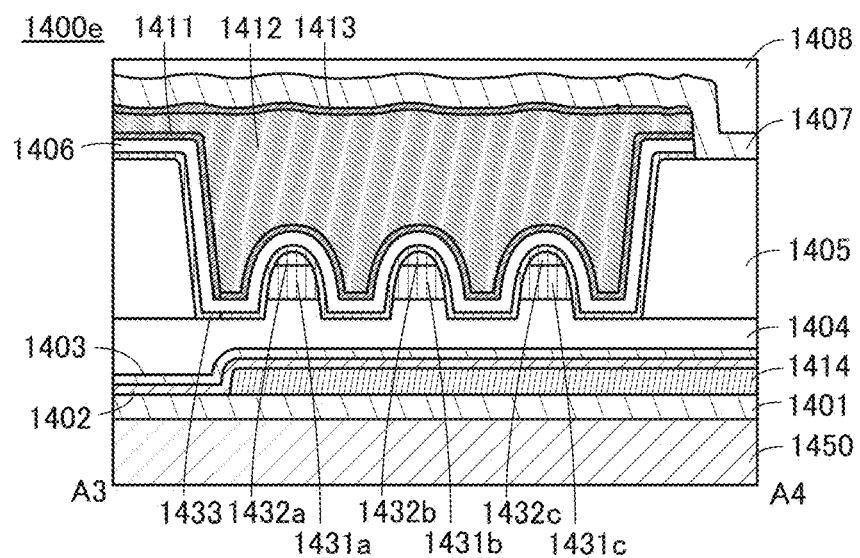

FIGS. 35A to 35C are a top view and cross-sectional views of a transistor 1400e. FIG. 35A is a top view. FIG. 35B is a cross-sectional view taken along a dashed-dotted line A1-A2 in FIG. 35A and FIG. 35C is a cross-sectional view taken along a dashed-dotted line A3-A4 in FIG. 35A. Note that for simplification of the drawing, some components are not illustrated in the top view in FIG. 35A. Note that the dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that a transistor with a high on-state current can be obtained.

<Structure Example 9 of Transistor>

Figure 36A:
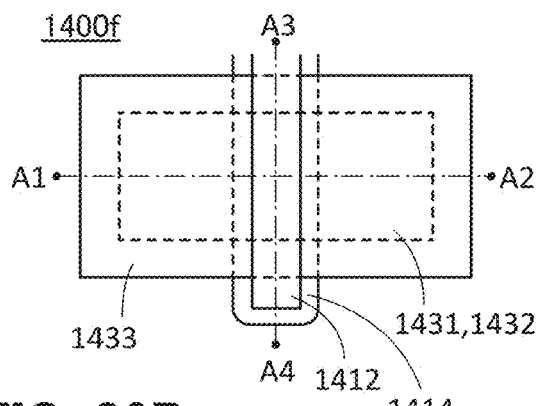
FIGS. 36A to 36D are a top view and cross-sectional views illustrating a structure example of a transistor.
Figure 36B:
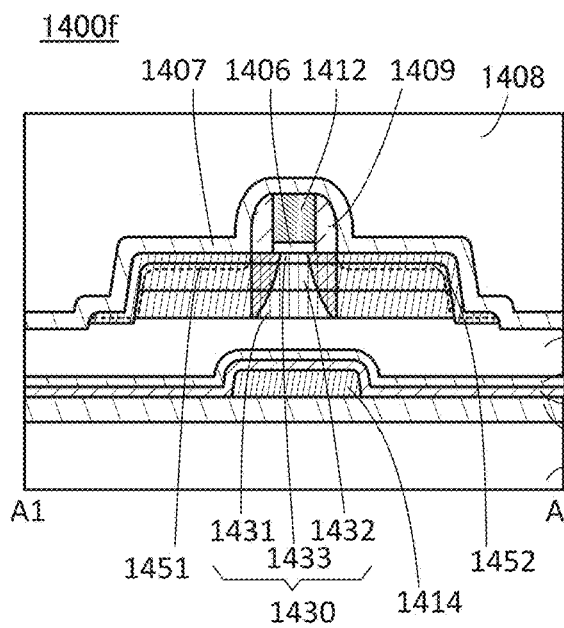
Figure 36C:
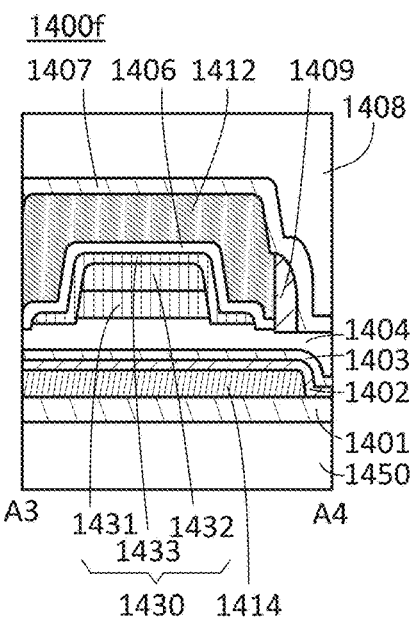

FIGS. 36A to 36D are a top view and cross-sectional views of a transistor 1400f. FIG. 36A is a top view of the transistor 1400f. FIG. 36B is a cross-sectional view taken along a dashed-dotted line A1-A2 in FIG. 36A and FIG. 36C is a cross-sectional view taken along a dashed-dotted line A3-A4 in FIG. 36A. Note that the dashed-dotted line A1-A2 and the dashed-dotted line A3-A4 are sometimes referred to as a channel length direction and a channel width direction, respectively. The transistor 1400f has the s-channel structure as the transistor 1400a and the like. In the transistor 1400f, an insulator 1409 is provided in contact with the side surface of the conductor 1412 used as a gate electrode. The insulator 1409 and the conductor 1412 are covered with an insulator 1407. The insulator 1407 is covered with the insulator 1408. The insulator 1409 functions as a sidewall insulator of the transistor 1400f. As in the transistor 1400a, the gate electrode may be a stack of the conductors 1411 to 1413. Alternatively, as described in Structure example 4 of transistor, any one of the metal oxides 1431 to 1433 may be used as the conductors 1411 to 1413 of the gate electrode. In that case, the treatment described in detail for the gate electrode of Structure example 4 of transistor needs to be performed so that the metal oxides 1431 to 1433 can function as a conductor.

The insulator 1406 and the conductor 1412 overlap with the conductor 1414 and the metal oxide 1432 at least partly. The side edge of the conductor 1412 in the channel length direction is preferably approximately aligned with the side edge of the insulator 1406 in the channel length direction. Here, the insulator 1406 functions as a gate insulator of the transistor 1400f, and the conductor 1412 functions as a gate electrode of the transistor 1400f.

The metal oxide 1432 has a region that overlaps with the conductor 1412 with the metal oxide 1433 and the insulator 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this embodiment is not limited to that where the outer edge of the metal oxide 1433 is outside of the outer edge of the metal oxide 1431. For example, the outer edge of the metal oxide 1431 may be outside of the outer edge of the metal oxide 1433, or the side edge of the metal oxide 1431 may be approximately aligned with the side edge of the metal oxide 1433.

Figure 36D:
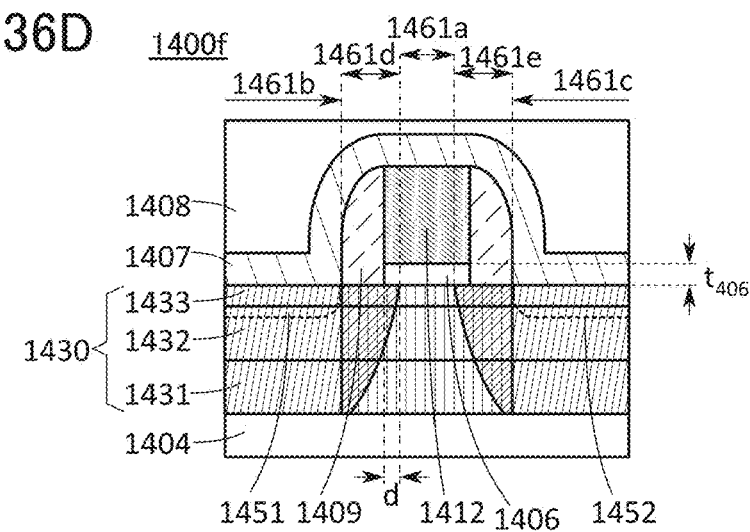

FIG. 36D is an enlarged view of part of FIG. 36B. As illustrated in FIG. 36D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As illustrated in FIG. 36D, in the metal oxide 1430, the region 1461a substantially overlaps with the conductor 1412, and the regions 1461b to 1461e are the regions other than the region 1461a. In the regions 1461b and 1461c, the top surface of the metal oxide 1433 is in contact with the insulator 1407. In the regions 1461d and 1461e, the top surface of the metal oxide 1433 is in contact with the insulator 1409 or 1406. That is, as illustrated in FIG. 36D, the border between the regions 1461b and 1461d overlaps with the border between the side edges of the insulators 1407 and 1409. The same applies to the border between the regions 1461c and 1461e. Here, part of the regions 1461d and 1461e preferably overlaps with part of a region (a channel formation region) where the metal oxide 1432 and the conductor 1412 overlap with each other. For example, preferably, the side edges of the regions 1461d and 1461e in the channel length direction are inside of the conductor 1412 and the distance between the side edge of the conductor 1412 and each of the side edges of the regions 1461d and 1461e is d. In that case, the thickness $t_{406}$ of the insulator 1406 and the distance d preferably satisfy $0.25t_{406}<d<t_{406}$.

In the above manner, the regions 1461d and 1461e are formed in part of the region where the metal oxide 1430 and the conductor 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed so as to satisfy the above range, the regions 1461d and 1461e can be prevented from being formed too deeply in the channel formation region and always conducted.

The regions 1461b to 1461e are formed by ion doping treatment such as an ion implantation method. Therefore, as illustrated in FIG. 36D, in some cases, the boundary between the regions 1461d and 1461a around the lower surface of the metal oxide 1431 is formed closer to the A1 side of the dashed-dotted line A1-A2 than the boundary between the regions 1461d and 1461a around the upper surface of the metal oxide 1433 is; in other words, the boundary is formed closer to the A1 side in the deeper region. The distance d in that case is the distance between the boundary between the regions 1461d and 1461a which is closest to the inner part of the conductor 1412 in the direction of the dashed-dotted line A1-A2 and the side edge of the conductor 1412 at the A1 side in the direction of the dashed-dotted line A1-A2. Similarly, in some cases, the boundary between the regions 1461e and 1461a around the lower surface of the metal oxide 1431 is formed closer to the A2 side of the dashed-dotted line A1-A2 than the boundary between the regions 1461e and 1461a around the upper surface of the metal oxide 1433 is; in other words, the boundary is formed closer to the A2 side in the deeper region. The distance d in that case is the distance between the boundary between the regions 1461e and 1461a which is closest to the inner part of the conductor 1412 in the direction of the dashed-dotted line A1-A2 and the side edge of the conductor 1412 at the A2 side in the direction of the dashed-dotted line A1-A2.

In some cases, for example, the regions 1461d and 1461e in the metal oxide 1431 do not overlap with the conductor 1412. In that case, at least part of the regions 1461d and 1461e in the metal oxide 1431 or 1432 is preferably formed in a region overlapping with the conductor 1412.

In addition, low-resistance regions 1451 and 1452 are preferably formed in metal oxide 1431, the metal oxide 1432, and the metal oxide 1433 in the vicinity of the interface with the insulator 1407. The low-resistance regions 1451 and 1452 contain at least one of elements included in the insulator 1407. Preferably, part of the low-resistance regions 1451 and 1452 is substantially in contact with or overlaps partly with the region (the channel formation region) where the metal oxide 1432 and the conductor 1412 overlap with each other.

Since a large part of the metal oxide 1433 is in contact with the insulator 1407, the low-resistance regions 1451 and 1452 are likely to be formed in the metal oxide 1433. The low-resistance regions 1451 and 1452 in the metal oxide 1433 contain a higher concentration of elements included in the insulator 1407 than the other regions of the metal oxide 1433 (e.g., the region of the metal oxide 1433 that overlaps with the conductor 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b to 1461e other than the low-resistance regions 1451 and 1452, and the lowest in the region 1461a. The added elements refer to a dopant for forming the regions 1461b and 1461c and an element added from the insulator 1407 to the low-resistance regions 1451 and 1452.

Although the low-resistance regions 1451 and 1452 are formed in the transistor 1400f, the semiconductor device described in this embodiment is not limited to this structure. For example, the low-resistance regions 1451 and 1452 are not necessarily formed in the case where the regions 1461b and 1461c have a sufficiently low resistance.

<Structure Example 10 of Transistor>

Figure 37A:
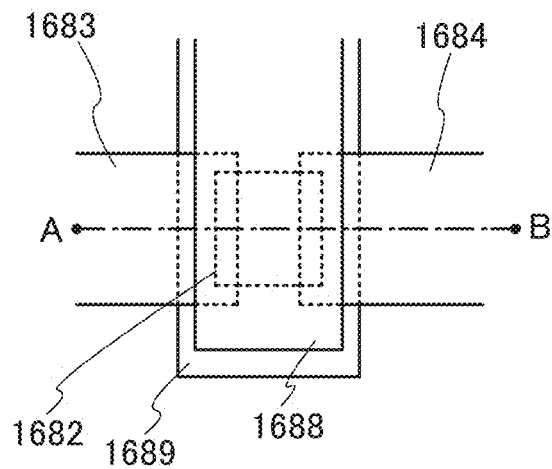
FIGS. 37A and 37B are a top view and a cross-sectional view illustrating a structure example of a transistor.
Figure 37B:
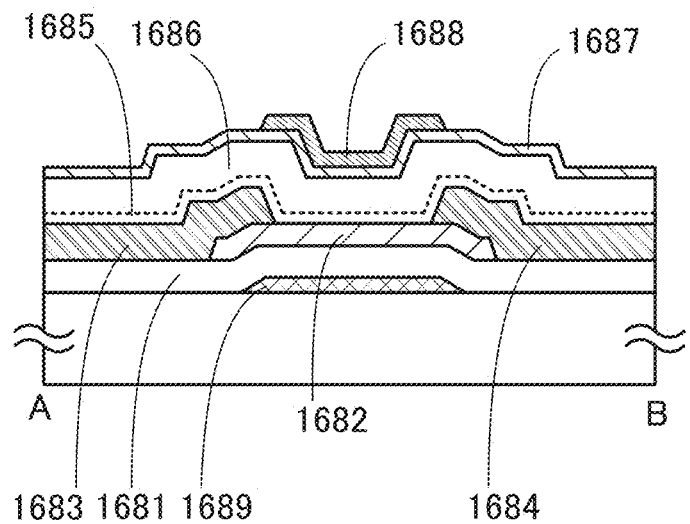

FIGS. 37A and 37B are a top view and a cross-sectional view of a transistor 1680. FIG. 37A is a top view, and FIG. 37B is a cross-sectional view taken along a dashed-dotted line A-B in FIG. 37A. Note that for simplification of the drawing, some components are increased or reduced in size, or omitted in FIGS. 37A and 37B. Note that the dashed-dotted line A-B is sometimes referred to as a channel length direction.

The transistor 1680 illustrated in FIG. 37B includes a conductor 1689 serving as a first gate, a conductor 1688 serving as a second gate, a semiconductor 1682, a conductor 1683 and a conductor 1684 serving as a source and a drain, an insulator 1681, an insulator 1685, an insulator 1686, and an insulator 1687.

The conductor 1689 is on an insulating surface. The conductor 1689 overlaps with the semiconductor 1682 with the insulator 1681 provided therebetween. The conductor 1688 overlaps with the semiconductor 1682 with the insulators 1685, 1686, and 1687 provided therebetween. The conductors 1683 and 1684 are connected to the semiconductor 1682.

The description of the conductors 1411 to 1414 in FIGS. 29A to 29C can be referred to for the details of the conductors 1689 and 1688.

The conductors 1689 and 1688 may be supplied with different potentials, or may be supplied with the same potential at the same time. The conductor 1688 serving as a second gate electrode in the transistor 1680 leads to stabilization of threshold voltage. Note that the conductor 1688 is unnecessary in some cases.

The description of the metal oxide 1432 in FIGS. 29A to 29C can be referred to for the details of the semiconductor 1682. The semiconductor 1682 may be a single layer or a stack including a plurality of semiconductor layers.

The description of the conductors 1421 to 1424 in FIGS. 29A to 29C can be referred to for the details of the conductors 1683 and 1684.

The description of the insulator 1406 in FIGS. 29A to 29C can be referred to for the details of the insulator 1681.

The insulators 1685 to 1687 are sequentially stacked over the semiconductor 1682 and the conductors 1683 and 1684 in FIG. 37B; however, an insulator provided over the semiconductor 1682 and the conductors 1683 and 1684 may be a single layer or a stack including a plurality of insulators.

In the case of using an oxide semiconductor as the semiconductor 1682, the insulator 1686 preferably contains oxygen at a proportion higher than or equal to that in the stoichiometric composition and has a function of supplying part of oxygen to the semiconductor 1682 by heating. Note that in the case where the provision of the insulator 1686 directly on the semiconductor 1682 causes damage to the semiconductor 1682 at the time of formation of the insulator 1686, the insulator 1685 is preferably provided between the semiconductor 1682 and the insulator 1686, as illustrated in FIG. 37B. The insulator 1685 preferably allows oxygen to pass therethrough, and causes little damage to the semiconductor 1682 when the insulator 1685 is formed compared with the case of the insulator 1686. If the insulator 1686 can be formed directly on the semiconductor 1682 while damage to the semiconductor 1682 is reduced, the insulator 1685 is not necessarily provided.

For the insulators 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulator 1687 preferably has an effect of blocking diffusion of oxygen, hydrogen, and water. Alternatively, the insulator 1687 preferably has an effect of blocking diffusion of hydrogen and water.

As an insulator has higher density and becomes denser or has a fewer dangling bonds and becomes more chemically stable, the insulator has a more excellent blocking effect. An insulator that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulator that has an effect of blocking diffusion of hydrogen and water can be formed using, for example, silicon nitride or silicon nitride oxide.

In the case where the insulator 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulator 1687 having the blocking effect can prevent a shift in the threshold voltage of the transistor 1680 due to generation of donors.

In addition, in the case where an oxide semiconductor is used as the semiconductor 1682, the insulator 1687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

Note that this embodiment can be combined with any of the other embodiments in this specification as appropriate.

(Embodiment 4)

In this embodiment, configuration examples of a device that can be applied to the memory cells 301 to 304 (hereinafter collectively referred to as the memory cell 300) described in the above embodiments will be described with reference to FIGS. 38A and 38B, FIGS. 39A and 39B, FIGS. 40A and 40B, and FIGS. 41A and 41B.

<Chip Configuration Example 1>

FIGS. 38A and 38B are cross-sectional views showing an example in which the memory cell 300 is formed in one chip. FIG. 38A illustrates a cross section in a channel length direction of transistors included in the memory cell 300, and FIG. 38B illustrates a cross section in a channel width direction of the transistors included in the memory cell 300.

The memory cell 300 illustrated in FIGS. 38A and 38B includes layers L0, L1, L2, L3, L4, L5, L6, L7, L8, and L9 in order from the bottom.

The layer L0 includes a substrate 1700.

The layer L1 includes an insulator 1706 over the substrate 1700, a transistor TrA, an insulator 1702, an insulator 1703, and a plurality of conductors such as a conductor 1714 and a conductor 1715.

The layer L2 includes a plurality of wirings such as a wiring 1732 and a wiring 1733.

The layer L3 includes a plurality of conductors such as a conductor 1716.

The layer L4 includes a transistor TrB, an insulator 1704, an insulator 1705, and a plurality of conductors such as a conductor 1717, The layer L5 includes a plurality of wirings such as a wiring 1734 and a wiring 1735.

The layer L6 includes a plurality of conductors such as a conductor 1718.

The layer L7 includes a plurality of wirings such as a wiring 1736.

The layer L8 includes a capacitor CA and a plurality of conductors such as a conductor 1719. The capacitor CA includes a first electrode 1751, a second electrode 1752, and an insulator 1753.

The layer L9 includes plurality of wirings such as a wiring 1737.

The OS transistor described in Embodiment 3 is preferably used as the transistors TrA and TrB. In FIGS. 38A and 38B, the transistor 1400c illustrated in FIGS. 33A to 33C is used as the transistors TrA and TrB.

For example, a glass substrate, a quartz substrate, a plastic substrate, a metal substrate, a flexible substrate, an attachment film, paper including a fibrous material, or a base film may be used as the substrate 1700. Alternatively, a semiconductor element may be formed using one substrate, and then transferred to another substrate.

In FIGS. 38A and 38B, the insulators 1702 to 1706 preferably have a blocking effect against hydrogen, water, and the like. Water, hydrogen, and the like are factors that generate carriers in an oxide semiconductor; thus, providing such a blocking layer against hydrogen, water, and the like can improve the reliability of the transistors TrA and TrB. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 1732 to 1737 and the conductors 1714 to 1719 each preferably have a single-layer structure or a layered structure of a conductor containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), and cobalt (Co), an alloy of such a low-resistance material, or a compound containing such a material as its main component. It is particularly preferable to use a high-melting-point material which has both heat resistance and conductivity, such as tungsten or molybdenum. It is also preferable to use a low-resistance conductive material such as aluminum or copper. The use of a Cu—Mn alloy is further preferable, in which case manganese oxide formed at the interface with an insulator containing oxygen has a function of preventing Cu diffusion.

In FIGS. 38A and 38B, regions without reference numerals and hatch patterns represent regions formed of an insulator. As the insulator, an insulator containing at least one of aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used. Alternatively, in the regions, an organic resin such as a polyimide resin, a polyamide resin, an acrylic resin, a siloxane resin, an epoxy resin, or a phenol resin can be used. Note that in this specification, an oxynitride refers to a compound that contains more oxygen than nitrogen, and a nitride oxide refers to a compound that contains more nitrogen than oxygen.

In the case where an OS transistor is used as the transistors Tr1 to Tr8 described in Embodiment 1, the transistors Tr1 to Tr8 are preferably formed in the layer L1 or the layer L4.

The capacitor C1 or C2 described in Embodiment 1 is preferably formed in the layer L8.

In the case where a driver circuit provided around the memory cell 300, for example, a driver circuit such as the decoder circuit or the row driver circuit described in Embodiment 1, is formed using an OS transistor, the transistors Tr9 to Tr24 may be formed in the layer L1 or the layer L4.

With the structure illustrated in FIGS. 38A and 38B, the area occupied by the memory cell 300 can be reduced, leading to higher integration of the memory cell.

<Chip Configuration Example 2>

All the OS transistors in the memory cell 300 may be formed in the same layer. An example of such a case is illustrated in FIGS. 39A and 39B. Similarly to FIGS. 38A and 38B, FIG. 39A illustrates a cross section in a channel length direction of transistors included in the memory cell 300, and FIG. 39B illustrates a cross section in a channel width direction of the transistors included in the memory cell 300.

The cross-sectional views of FIGS. 39A and 39B are different from those of FIGS. 38A and 38B in that the layers L3 to L5 are omitted and the layer L6 is formed on the layer L2. For the other details in FIGS. 39A and 39B, the description of FIGS. 38A and 38B is referred to.

In the case where an OS transistor is used as the transistors Tr1 to Tr8 described in Embodiment 1, the transistors Tr1 to Tr8 are preferably formed in the layer L1.

The capacitor C1 or C2 described in Embodiment 1 is preferably formed in the layer L8.

In the case where a driver circuit provided around the memory cell 300, for example, a driver circuit such as the decoder circuit or the row driver circuit described in Embodiment 1, is formed using an OS transistor, the transistors Tr9 to Tr24 may be formed in the layer L1.

With the structure illustrated in FIGS. 39A and 39B, the production process of the memory cell 300 can be simplified.

<Chip Configuration Example 3>

All OS transistors in the memory cell 300 illustrated in FIGS. 38A and 38B may be formed above the capacitor CA as illustrated in FIGS. 40A and 40B. Similarly to FIGS. 38A and 38B and FIGS. 39A and 39B, FIG. 40A is a cross-sectional view in a channel length direction of transistors included in the memory cell 300, and FIG. 40B is a cross-sectional view in a channel width direction of the transistors included in the memory cell 300.

The cross-sectional views in FIGS. 40A and 40B are different from those in FIGS. 38A and 38B in that the transistor TrA and the transistor TrB are provided above the capacitor CA. For the other details in FIGS. 40A and 40B, refer to the description for FIGS. 38A and 38B.

The memory cell 300 illustrated in FIGS. 40A and 40B includes the layers L0, L7, L8, L9, L10, L1, L2, L3, L4, and L5 in order from the bottom.

The layer L10 includes a plurality of conductors such as a conductor 1720 and a conductor 1721.

For materials used for the conductors 1720 and 1721, refer to the description of the wirings 1732 to 1737 and the conductors 1714 to 1719.

In the case where an OS transistor is used as the transistors Tr1 to Tr8 described in Embodiment 1, the transistors Tr1 to Tr8 are preferably formed in the layer L1 or the layer L4.

The capacitor C1 or C2 described in Embodiment 1 is preferably formed in the layer L8.

In the case where a driver circuit provided around the memory cell 300, for example, a driver circuit such as the decoder circuit or the row driver circuit described in Embodiment 1, is formed using an OS transistor, the transistors Tr9 to Tr24 may be formed in the layer L1 or the layer L4.

<Chip Configuration Example 4>

Similarly to the chip configuration example 3, all OS transistors in the memory cell 300 illustrated in FIGS. 39A and 39B may be formed above the capacitor CA as illustrated in FIGS. 41A and 41B. Similarly to FIGS. 39A and 39B, FIG. 41A is a cross-sectional view in a channel length direction of transistors included in the memory cell 300, and FIG. 41B is a cross-sectional view in a channel width direction of the transistors included in the memory cell 300.

The cross-sectional views in FIGS. 41A and 41B are different from those in FIGS. 39A and 39B in that the transistor TrA is provided above the capacitor CA. For the other details in FIGS. 41A and 41B, refer to the description for FIGS. 40A and 40B.

The memory cell 300 illustrated in FIGS. 41A and 41B includes the layers L0, L7, L8, L9, L10, L1, and L2 in order from the bottom.

In the case where an OS transistor is used as the transistors Tr1 to Tr8 described in Embodiment 1, the transistors Tr1 to Tr8 are preferably formed in the layer L1.

The capacitor C1 or C2 described in Embodiment 1 is preferably formed in the layer L8.

In the case where a driver circuit provided around the memory cell 300, for example, a driver circuit such as the decoder circuit or the row driver circuit described in Embodiment 1, is formed using an OS transistor, the transistors Tr9 to Tr24 may be formed in the layer L1.

Note that this embodiment can be combined with any of the other embodiments in this specification as appropriate.

(Embodiment 5)

Described in this embodiment are structures of an oxide semiconductor film capable of being used for the OS transistors described in the above embodiments.

<Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and have no fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 42A:
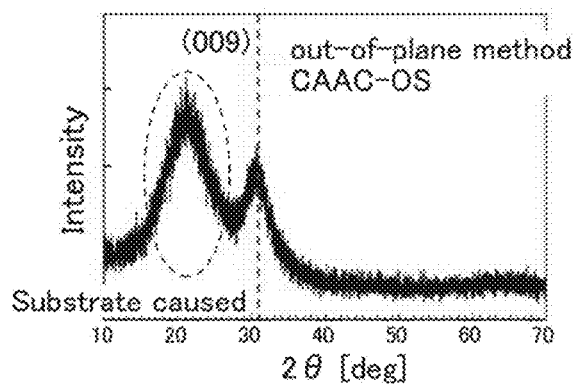
FIGS. 42A to 42E show structural analysis results of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an InGaZnO$_4$ crystal that is classified into the space group R-3m is analyzed by an out-of-plane method, a peak appears at a diffraction angle (2θ) of around 31° as shown in FIG. 42A. This peak is derived from the (009) plane of the InGaZnO$_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 42B:
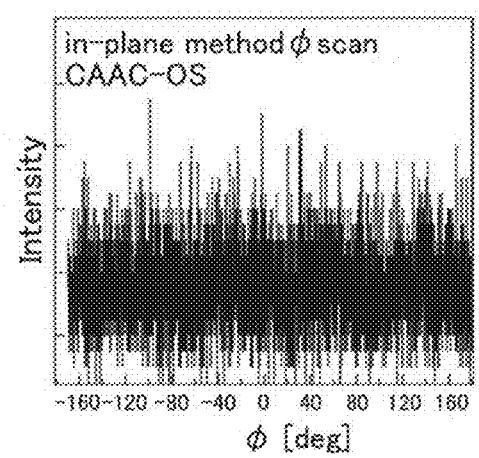
Figure 42C:
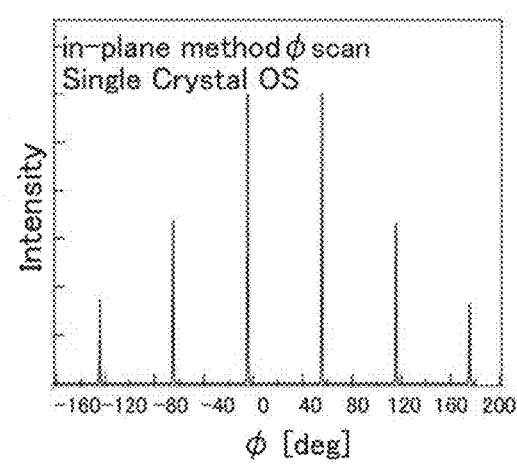

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the InGaZnO$_4$ crystal. When analysis (φ scan) is performed with 2θ fixed at around 56° and with the sample rotated using a normal vector to the sample surface as an axis (φ axis), as shown in FIG. 42B, a peak is not clearly observed. In contrast, in the case where single crystal InGaZnO$_4$ is subjected to φ scan with 2θ fixed at around 56°, as shown in FIG. 42C, six peaks which are derived from crystal planes equivalent to the (110) plane are observed. Accordingly, the structural analysis using XRD shows that the directions of a-axes and b-axes are irregularly oriented in the CAAC-OS.

Figure 42D:
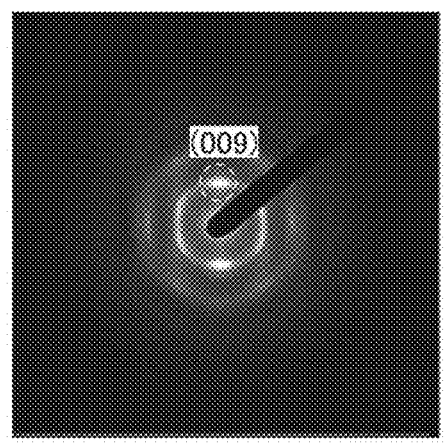
Figure 42E:
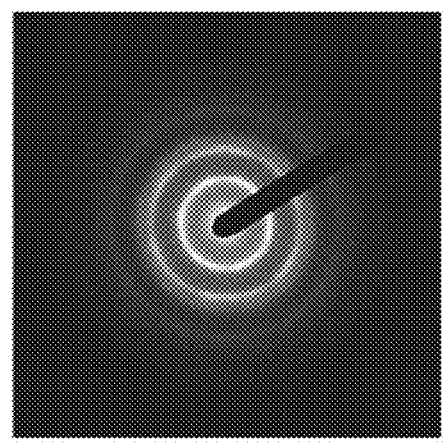

Next, a CAAC-OS analyzed by electron diffraction is described. For example, when an electron beam with a probe diameter of 300 nm is incident on a CAAC-OS including an InGaZnO$_4$ crystal in a direction parallel to the formation surface of the CAAC-OS, a diffraction pattern (also referred to as a selected-area electron diffraction pattern) shown in FIG. 42D can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 42E shows a diffraction pattern obtained in such a manner that an electron beam with a probe diameter of 300 nm is incident on the same sample in a direction perpendicular to the sample surface. As shown in FIG. 42E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 42E is considered to be derived from the (010) plane, the (100) plane, and the like of the InGaZnO$_4$ crystal. The second ring in FIG. 42E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed in some cases. Thus, in the CAAC-OS, a reduction in electron mobility due to the grain boundary is less likely to occur.

Figure 43A:
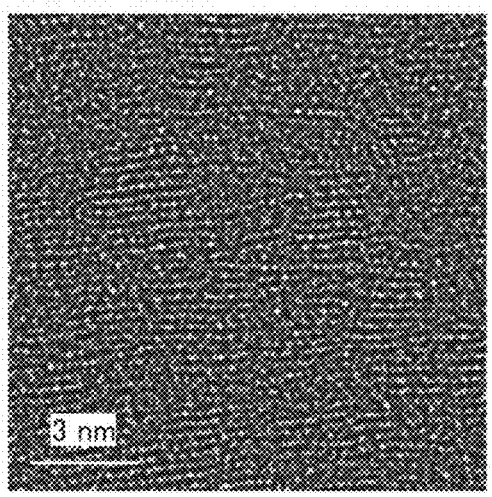
FIGS. 43A to 43E show a cross-sectional TEM image and plan-view TEM images of a CAAC-OS and images obtained through analysis thereof.

FIG. 43A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 43A shows pellets in which metal atoms are arranged in a layered manner. FIG. 43A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 43B:
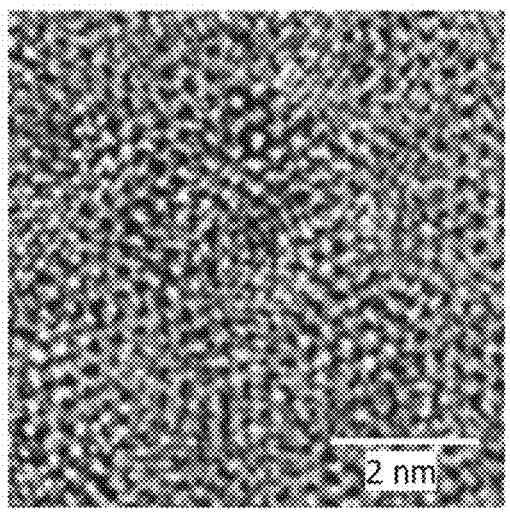
Figure 43C:
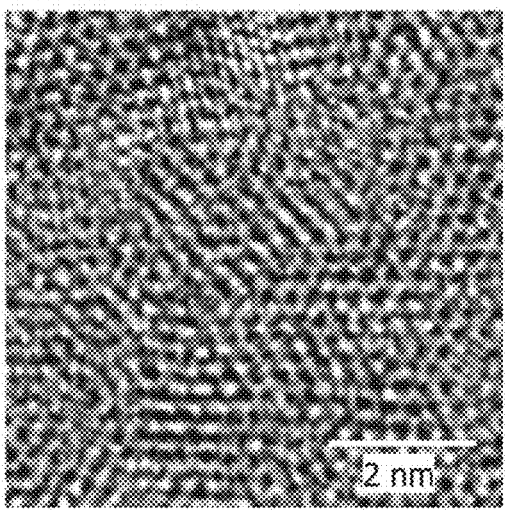
Figure 43D:
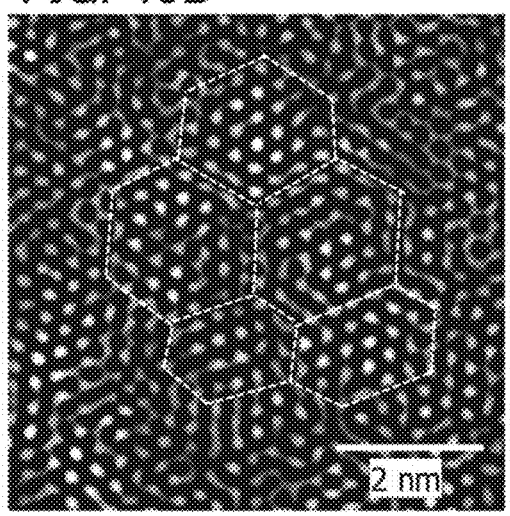
Figure 43E:
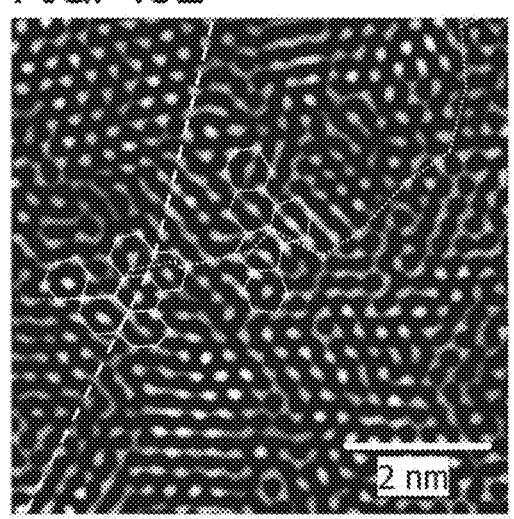

FIGS. 43B and 43C show Cs-corrected high-resolution TEM images of a plane of the CAAC-OS observed from a direction substantially perpendicular to the sample surface. FIGS. 43D and 43E are images obtained through image processing of FIGS. 43B and 43C. The method of image processing is as follows. The image in FIG. 43B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 43D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 43E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Oxygen vacancies in the oxide semiconductor might serve as carrier traps or serve as carrier generation sources when hydrogen is captured therein, for example.

The CAAC-OS having small amounts of impurities and oxygen vacancies is an oxide semiconductor with low carrier density. Specifically, an oxide semiconductor with a carrier density of lower than $8\times10^{11}$ cm$^{-3}$, preferably lower than $1\times10^{11}$ cm$^{-3}$, further preferably lower than $1\times10^{10}$ cm$^{-3}$, and higher than or equal to $1\times10^{-9}$ cm$^{-3}$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 44A:
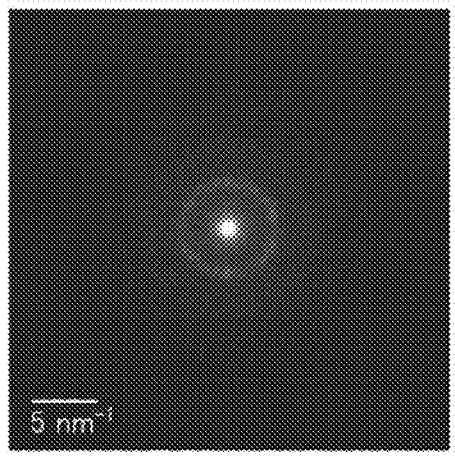
FIGS. 44A to 44D show electron diffraction patterns and a cross-sectional TEM image of an nc-OS.
Figure 44B:
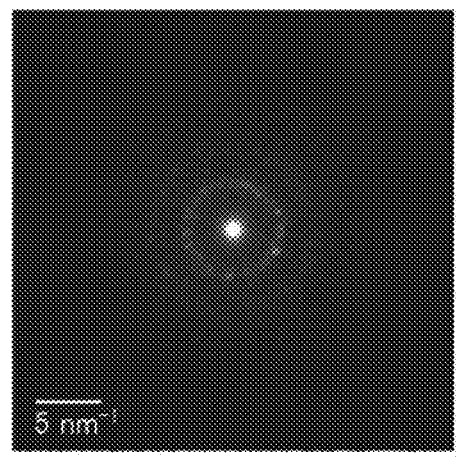

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 44A is observed. FIG. 44B shows a diffraction pattern obtained when an electron beam with a probe diameter of 1 nm is incident on the same sample. As shown in FIG. 44B, a plurality of spots are observed in a ring-like region. In other words, ordering in an nc-OS is not observed with an electron beam with a probe diameter of 50 nm but is observed with an electron beam with a probe diameter of 1 nm.

Figure 44C:
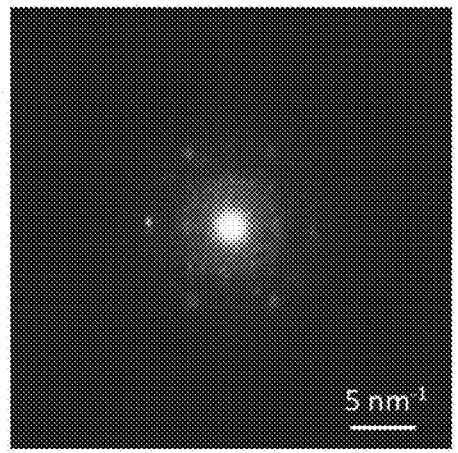

Furthermore, an electron diffraction pattern in which spots are arranged in an approximately regular hexagonal shape is observed in some cases as shown in FIG. 44C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 44D:
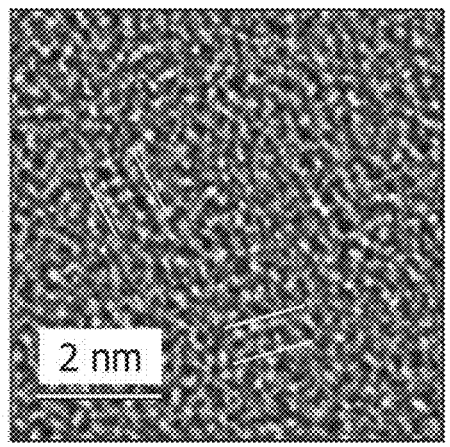

FIG. 44D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 44D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

Figure 45A:
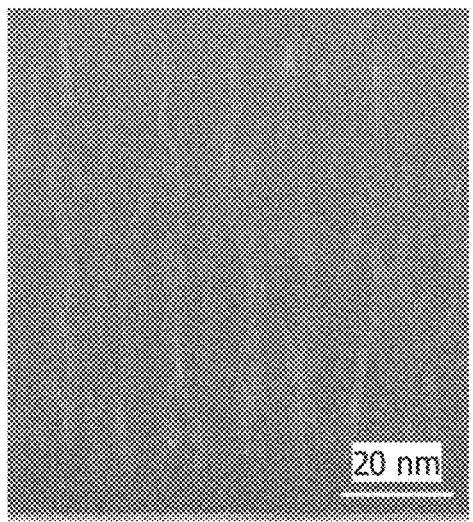
FIGS. 45A and 45B show cross-sectional TEM images of an a-like OS.
Figure 45B:
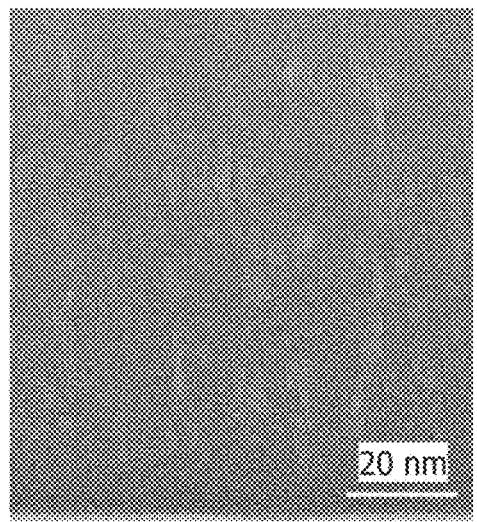

FIGS. 45A and 45B are high-resolution cross-sectional TEM images of an a-like OS. FIG. 45A is the high-resolution cross-sectional TEM image of the a-like OS at the start of the electron irradiation. FIG. 45B is the high-resolution cross-sectional TEM image of a-like OS after the electron (e⁻) irradiation at $4.3 \times 10^8$ e⁻/nm². FIGS. 45A and 45B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO₄ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO₄ in the following description. Each of lattice fringes corresponds to the a-b plane of the InGaZnO₄ crystal.

Figure 46:
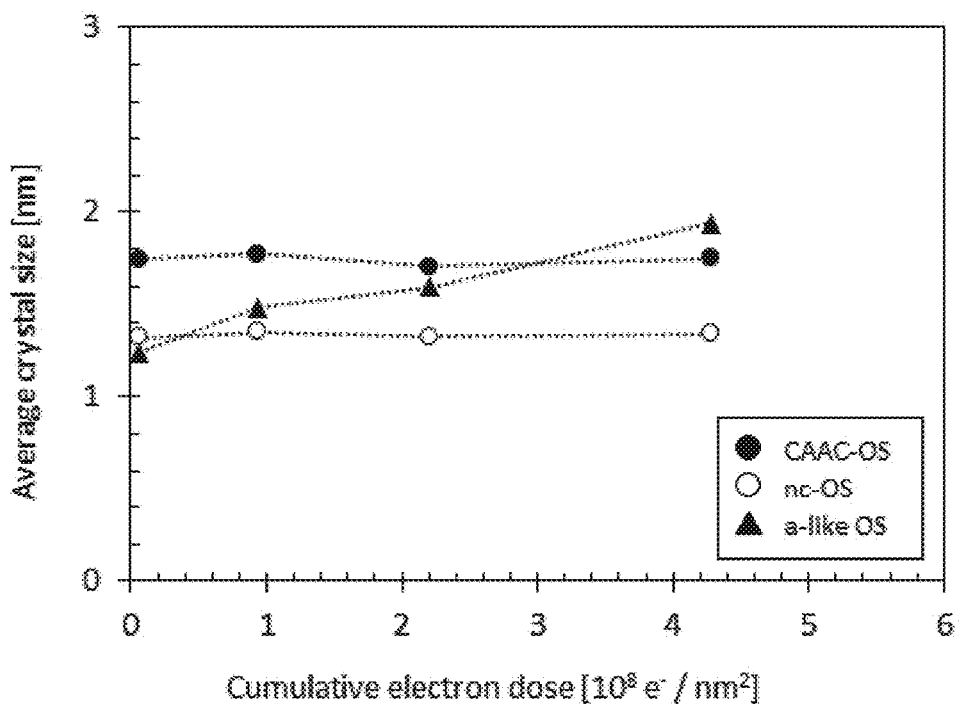
FIG. 46 shows a change in crystal part of an In—Ga—Zn oxide induced by electron irradiation.

FIG. 46 shows change in the average size of crystal parts (at 22 points to 30 points) in each sample. Note that the crystal part size corresponds to the length of a lattice fringe. FIG. 46 indicates that the crystal part size in the a-like OS increases with an increase in the cumulative electron dose in obtaining TEM images, for example. As shown in FIG. 46, a crystal part of approximately 1.2 nm (also referred to as an initial nucleus) at the start of TEM observation grows to a size of approximately 1.9 nm at a cumulative electron (e⁻) dose of $4.2 \times 10^8$ e⁻/nm². In contrast, the crystal part size in the nc-OS and the CAAC-OS shows little change from the start of electron irradiation to a cumulative electron dose of $4.2 \times 10^8$ e⁻/nm². As shown in FIG. 46, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ e⁻/(nm²·s); and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO₄ with a rhombohedral crystal structure is 6.357 g/cm³. Accordingly, in the case of the oxide semiconductor having an atomic ratio of In:Ga:Zn=1:1:1, the density of the a-like OS is higher than or equal to 5.0 g/cm³ and lower than 5.9 g/cm³. For example, in the case of the oxide semiconductor having an atomic ratio of In:Ga:Zn=1:1:1, the density of each of the nc-OS and the CAAC-OS is higher than or equal to 5.9 g/cm³ and lower than 6.3 g/cm³.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

Note that this embodiment can be combined with any of the other embodiments in this specification as appropriate.

(Embodiment 6)

In this embodiment, examples in which the semiconductor device described in any of the above embodiments is used as a memory device in an electronic component and in an electronic device including the electronic component are described with reference to FIGS. 47A and 47B and FIGS. 48A to 48H.

<Electronic Component>

Figure 47A:
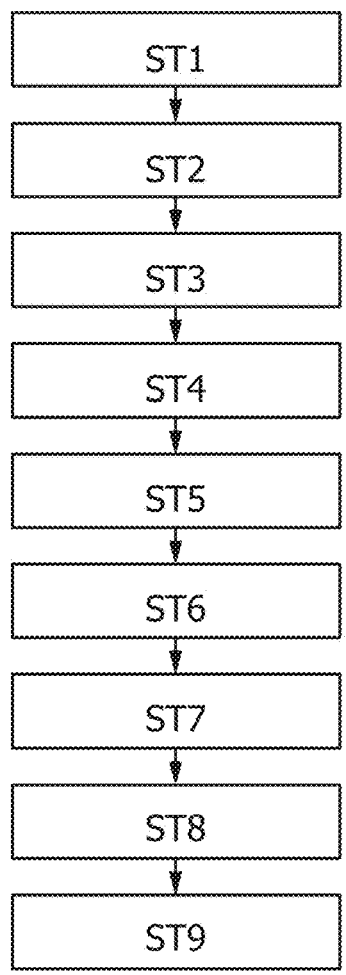
FIG. 47A is a flow chart illustrating manufacturing steps of an electronic component and FIG. 47B is a perspective view illustrating the electronic component.

FIG. 47A illustrates an example in which the semiconductor device described in any of the above embodiments is used for a memory device in an electronic component. Note that the electronic component is also referred to as a semiconductor package or an IC package. This electronic component has various standards and names depending on the direction and the shape of terminals. Therefore, an example of the electronic component is described in this embodiment.

A semiconductor device including the transistors described in Embodiments 1 and 2 is completed through an assembly process (post-process) of integrating detachable components on a printed board.

The post-process can be completed through the steps in FIG. 47A. Specifically, after an element substrate obtained in the preceding process is completed (Step ST1), a back surface of the substrate is ground (Step ST2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step ST3). In the die bonding step, the chip is bonded to the lead frame by an appropriate method depending on products, for example, bonding with a resin or a tape. Note that in the die bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step ST4). As the metal wire, a silver wire or a gold wire can be used. Ball bonding or wedge bonding can be used as the wire bonding.

The wire-bonded chip is subjected to a molding step of sealing the chip with an epoxy resin or the like (Step ST5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step ST6). This plating process prevents rust of the lead and facilitates soldering at the time of mounting the chip on a printed board in a later step.

Next, printing (marking) is performed on a surface of the package (Step ST7). After a final testing step (Step ST8), the electronic component is completed (Step ST9).

The above-described electronic component can include the semiconductor device described in any of the above embodiments. Thus, a highly reliable electronic component can be obtained.

Figure 47B:
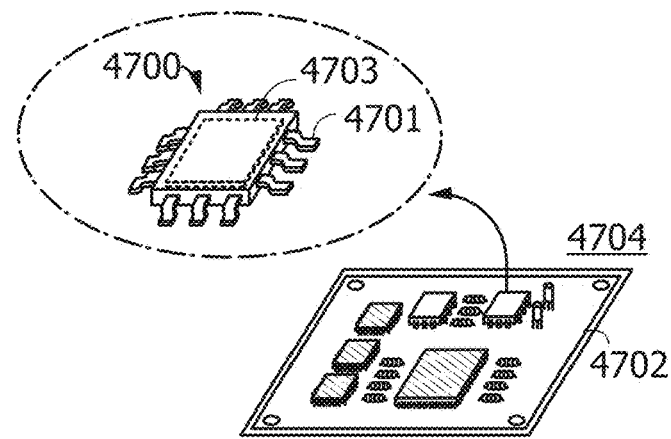

FIG. 47B is a perspective schematic diagram illustrating a quad flat package (QFP) as an example of the completed electronic component. An electronic component 4700 in FIG. 47B includes a lead 4701 and a circuit unit 4703. The electronic component 4700 in FIG. 47B is mounted on a printed board 4702, for example. A plurality of electronic components 4700 which are combined and electrically connected to each other over the printed board 4702 can be mounted on an electronic device. A completed circuit board 4704 is provided in an electronic device or the like.

<Electronic Device>

Next, electronic devices including the aforementioned electronic component are described.

A semiconductor device of one embodiment of the present invention can be used for display devices, personal computers, or image reproducing devices provided with recording media (typically, devices that reproduce the content of recording media such as digital versatile discs (DVD) and have displays for displaying the reproduced images). Other examples of electronic devices that can include the semiconductor device of one embodiment of the present invention include cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and medical devices. FIGS. 48A to 48H illustrate specific examples of these electronic devices.

Figure 48A:
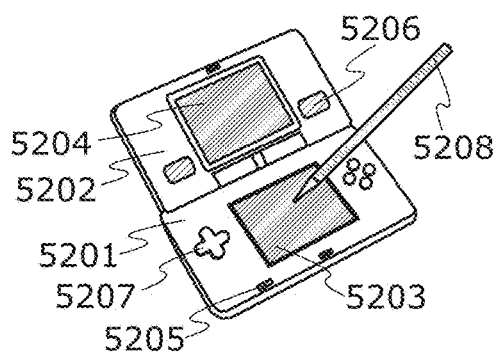
FIGS. 48A to 48H are perspective views illustrating electronic devices.

FIG. 48A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 48A has the two display portions 5203 and 5204, the number of display portions included in a portable game machine is not limited to this.

Figure 48B:
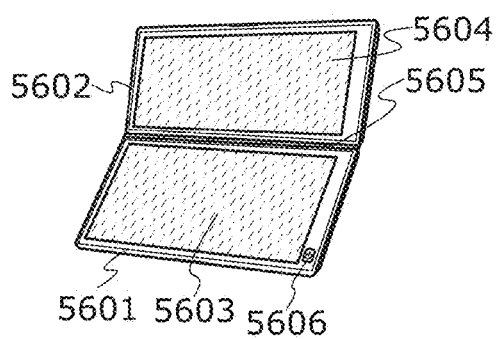

FIG. 48B illustrates a portable information terminal including a first housing 5601, a second housing 5602, a first display portion 5603, a second display portion 5604, a joint 5605, an operation key 5606, and the like. The semiconductor device of one embodiment of the present invention can be used for a variety of integrated circuits included in portable information terminals. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. Images displayed on the first display portion 5603 may be switched in accordance with the angle at the joint 5605 between the first housing 5601 and the second housing 5602. A display device with a position input function may be used as at least one of the first display portion 5603 and the second display portion 5604. Note that the position input function can be added by providing a touch panel in a display device. Alternatively, the position input function can be added by provision of a photoelectric conversion element called a photosensor in a pixel portion of a display device.

Figure 48C:
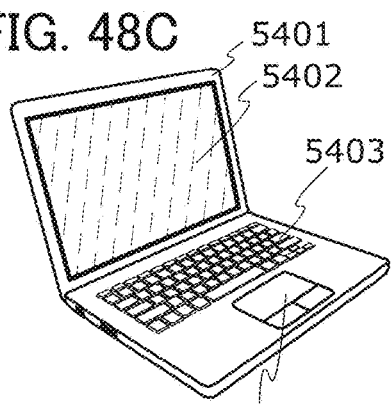

FIG. 48C illustrates a notebook computer including a housing 5401, a display portion 5402, a keyboard 5403, a pointing device 5404, and the like. The semiconductor device of one embodiment of the present invention can be used for a variety of integrated circuits included in notebook type personal computers.

Figure 48D:
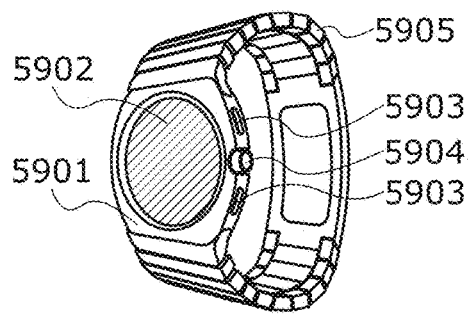

FIG. 48D is a smart watch which is one of wearable terminals. The smart watch includes a housing 5901, a display portion 5902, operation buttons 5903, an operator 5904, and a band 5905. The semiconductor device of one embodiment of the present invention can be used for a variety of integrated circuits included in the smart watch. A display device with a position input function may be used for a display portion 5902. Note that the position input function can be added by provision of a touch panel in a display device. Alternatively, the position input function can be added by providing a photoelectric conversion element called a photosensor in a pixel area of a display device. As operation buttons 5903, any one of a power switch for starting the smart watch, a button for operating an application of the smart watch, a volume control button, a switch for turning on or off the display portion 5902, and the like can be used. Although the smart watch in FIG. 48D includes two operation buttons 5903, the number of the operation buttons included in the smart watch is not limited to two. The operator 5904 functions as a crown performing time adjustment in the smart watch. The operator 5904 may be used as an input interface for operating an application of the smart watch as well as the crown for a time adjustment. Although the smart watch illustrated in FIG. 48D includes the operator 5904, one embodiment of the present invention is not limited thereto and the operator 5904 is not necessarily provided.

Figure 48E:
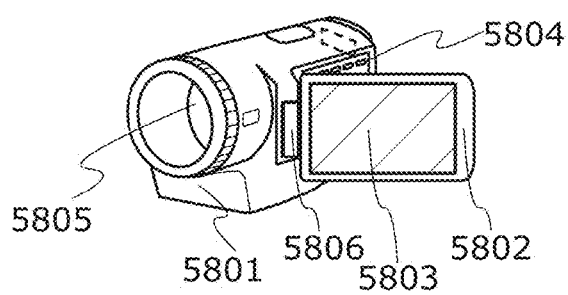

FIG. 48E illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

Figure 48F:
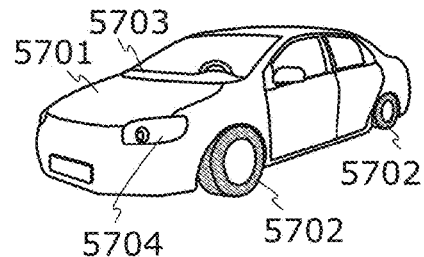

FIG. 48F illustrates a passenger car including a car body 5701, wheels 5702, a dashboard 5703, lights 5704, and the like. The semiconductor device of one embodiment of the present invention can be used for a variety of integrated circuits included in passenger cars.

Figure 48G:
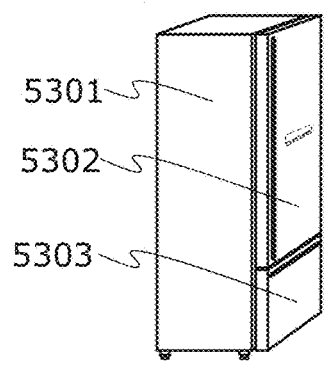

FIG. 48G illustrates an electric refrigerator-freezer including a housing 5301, a refrigerator door 5302, a freezer door 5303, and the like. The semiconductor device of one embodiment of the present invention can be used for a variety of integrated circuits included in the electric refrigerator-freezer.

Figure 48H:
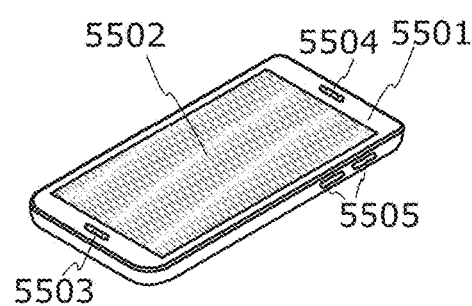

FIG. 48H is a mobile phone having a function of an information terminal. The mobile phone includes a housing 5501, a display portion 5502, a microphone 5503, a speaker 5504, and operation buttons 5505. A display device with a position input function may be used for the display portion 5502. Note that the position input function can be added by provision of a touch panel in a display device. Alternatively, the position input function can be added by providing a photoelectric conversion element called a photosensor in a pixel area of a display device. As operation buttons 5505, any one of a power switch for starting the mobile phone, a button for operating an application of the mobile phone, a volume control button, a switch for turning on or off the display portion 5502, and the like can be used. Although the mobile phone in FIG. 48H includes two operation buttons 5505, the number of the operation buttons included in the mobile phone is not limited to two. Although not illustrated, the mobile phone illustrated in FIG. 48H may be provided with a camera. Although not illustrated, the mobile phone illustrated in FIG. 48H may include a light-emitting device that is used as a flash or a lighting device. Although not illustrated, the mobile phone in FIG. 48H may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing 5501. In particular, the direction of the mobile phone (the direction of the mobile phone with respect to the vertical direction) illustrated in FIG. 48H is determined by providing a sensing device which includes a sensor for sensing inclinations, such as a gyroscope or an acceleration sensor, and display on the screen of the display portion 5502 can be automatically changed in accordance with the direction of the mobile phone. In particular, in the case where a sensing device including a sensor obtaining biological information of fingerprints, veins, iris, voice prints, or the like is provided, a mobile phone having a function of biometric authentication can be obtained.

Next, a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on a current), a plasma display panel (PDP), an electron emitter, a display element using a carbon nanotube, a liquid crystal element, electronic ink, an electrowetting element, an electrophoretic element, a display element using micro electro mechanical systems (MEMS), (e.g., a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), quantum dots, and the like. Other than the above, a display medium whose contrast, luminance, reflectance, transmittance, or the like is changed by an electric or magnetic effect may be included. Examples of a display device using an EL element include an EL display. Examples of a display device using electron emitters include a field emission display (FED), and an SED-type flat panel display (SED: surface-conduction electron-emitter display). Examples of a display device using a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink, Electronic Liquid Powder (registered trademark), or electrophoretic elements include electronic paper. Examples of a display device using a quantum dot in each pixel include a quantum dot display. Note that the quantum dots may be provided in part of a backlight, instead of being used for a display element. With the use of the quantum dots, an image with high color purity can be displayed. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. The provision of graphene or graphite enables a nitride semiconductor such as an n-type GaN semiconductor layer including crystals to be easily formed thereover. Furthermore, a p-type GaN semiconductor layer including crystals, or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In a display device using MEMS, a dry agent may be provided in a space where a display element is sealed (or between an element substrate over which the display element is placed and a counter substrate opposed to the element substrate, for example).

With the dry agent, malfunction or degradation of the MEMS or the like due to moisture can be prevented.

Note that this embodiment can be combined with any of the other embodiments in this specification as appropriate.

(Embodiment 7)

The memory device of one embodiment of the present invention can be used for removable memory devices such as memory cards (e.g., SD cards), universal serial bus (USB) memories, and solid state drives (SSD). In this embodiment, some structure examples of the removable storage device are described with reference to FIGS. 49A to 49E.

Figure 49A:
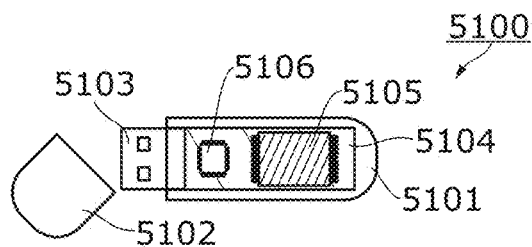
FIGS. 49A to 49E are perspective views illustrating electronic devices.

FIG. 49A is a schematic diagram of a USB memory. A USB memory 5100 includes a housing 5101, a cap 5102, a USB connector 5103, and a substrate 5104. The substrate 5104 is held in the housing 5101. The substrate 5104 is provided with a memory device and a circuit for driving the memory device. For example, the substrate 5104 is provided with a memory chip 5105 and a controller chip 5106. In the memory chip 5105, the memory cell array 110, the row driver 120, the row decoder 130, the row address latch circuit 140, the sense amplifier/precharge circuit 150, the data selector/column decoder 160, and the column address latch circuit 170 which are described in the above embodiment are incorporated, for example. Specifically, a processor, a work memory, an ECC circuit, and the like are incorporated in the controller chip 5106. Note that the circuit configurations of the memory chip 5105 and the controller chip 5106 are not limited to those described above, and can be changed depending on circumstances or conditions. For example, the row driver 120, the row decoder 130, the row address latch circuit 140, the sense amplifier/precharge circuit 150, the data selector/column decoder 160, and the column address latch circuit 170 may be incorporated in the controller chip 5106, not in the memory chip 5105. The USB connector 5103 functions as an interface for connection to an external device.

Figure 49B:
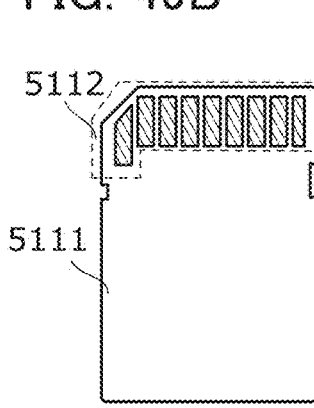
Figure 49C:
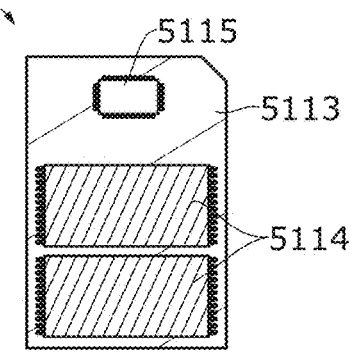

FIG. 49B is a schematic external diagram of an SD card, and FIG. 49C is a schematic diagram illustrating the internal structure of the SD card. An SD card 5110 includes a housing 5111, a connector 5112, and a substrate 5113. The connector 5112 functions as an interface for connection to an external device. The substrate 5113 is held in the housing 5111. The substrate 5113 is provided with a memory device and a circuit for driving the memory device. For example, the substrate 5113 is provided with a memory chip 5114 and a controller chip 5115. In the memory chip 5114, the memory cell array 110, the row driver 120, the row decoder 130, the row address latch circuit 140, the sense amplifier/precharge circuit 150, the data selector/column decoder 160, and the column address latch circuit 170 which are described in the above embodiment are incorporated, for example. A processor, a work memory, an ECC circuit, and the like are incorporated in the controller chip 5115. Note that the circuit configurations of the memory chip 5114 and the controller chip 5115 are not limited to those described above, and can be changed depending on circumstances or conditions. For example, the row driver 120, the row decoder 130, the row address latch circuit 140, the sense amplifier/precharge circuit 150, the data selector/column decoder 160, and the column address latch circuit 170 may be incorporated in the controller chip 5115, not in the memory chip 5114.

When the memory chip 5114 is also provided on a back side of the substrate 5113, the capacity of the SD card 5110 can be increased. In addition, a wireless chip with a radio communication function may be provided on the substrate 5113. This structure enables wireless communication between an external device and the SD card 5110, making it possible to write/read data to/from the memory chip 5114.

Figure 49D:
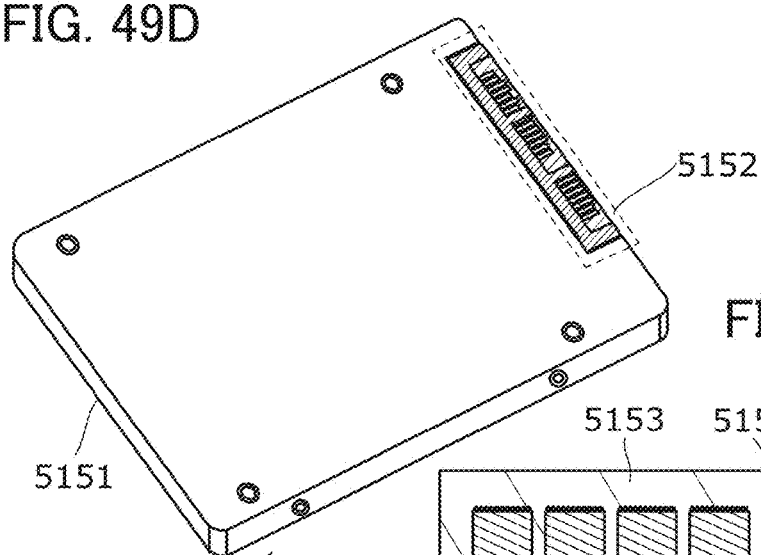
Figure 49E:
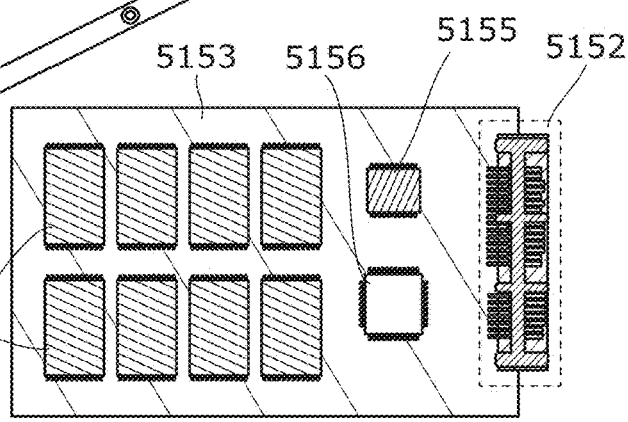
Figure 50A:
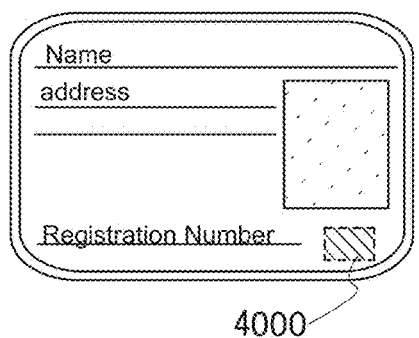
FIGS. 50A to 50F are perspective views illustrating application examples of an RF tag.
Figure 50B:
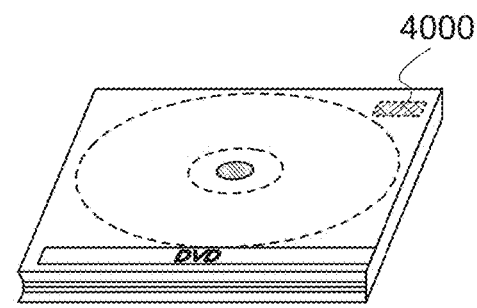
Figure 50C:
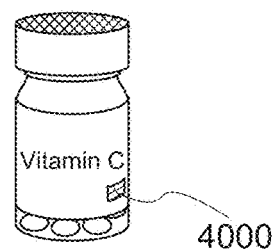
Figure 50D:
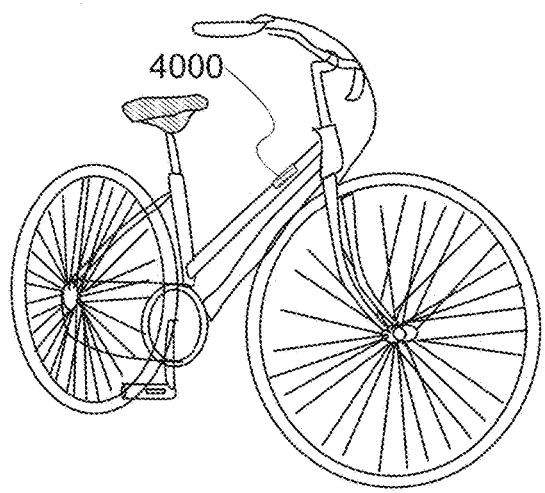
Figure 50E:
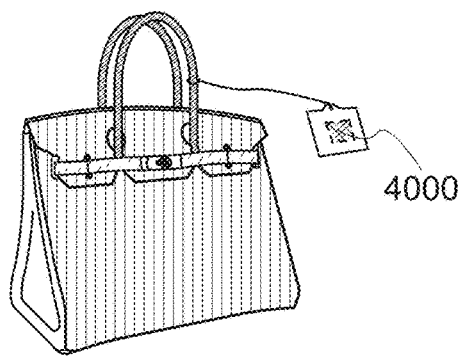
Figure 50F:
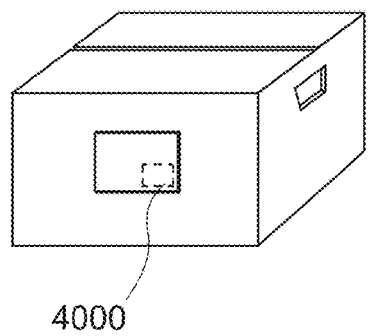

FIG. 49D is a schematic external diagram of an SSD, and FIG. 49E is a schematic diagram illustrating the internal structure of the SSD. An SSD 5150 includes a housing 5151, a connector 5152, and a substrate 5153. The connector 5152 functions as an interface for connection to an external device. The substrate 5153 is held in the housing 5151. The substrate 5153 is provided with a memory device and a circuit for driving the memory device. For example, the substrate 5153 is provided with a memory chip 5154, a memory chip 5155, and a controller chip 5156. In the memory chip 5154, the memory cell array 110, the row driver 120, the row decoder 130, the row address latch circuit 140, the sense amplifier/precharge circuit 150, the data selector/column decoder 160, and the column address latch circuit 170 which are described in the above embodiment are incorporated, for example. When the memory chip 5154 is also provided on a back side of the substrate 5153, the capacity of the SSD 5150 can be increased. A work memory is incorporated in the memory chip 5155. For example, a DRAM chip may be used as the memory chip 5155. A processor, an ECC circuit, and the like are incorporated in the controller chip 5156. Note that the circuit configurations of the memory chip 5154, the memory chip 5155, and the controller chip 5115 are not limited to those described above, and can be changed depending on circumstances or conditions. For example, a memory functioning as a work memory may also be provided in the controller chip 5156.

Note that this embodiment can be combined with any of the other embodiments in this specification as appropriate.

(Embodiment 8)

In this embodiment, application examples of an RF tag that can include the memory device of one embodiment of the present invention will be described with reference to FIGS. 50A to 50F. The RF tag is widely used and can be provided for, for example, products such as bills, coins, securities, bearer bonds, documents (e.g., driver's licenses or resident's cards, see FIG. 50A), recording media (e.g., DVD or video tapes, see FIG. 50B), packaging containers (e.g., wrapping paper or bottles, see FIG. 50C), vehicles (e.g., bicycles, see FIG. 50D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 50E and 50F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments in this specification as appropriate.

(Supplementary Notes on the Description in this Specification and the Like)

The following are notes on the descriptions of the structures in the above embodiments and structures in the embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structure examples is given in one embodiment, any of the structure examples can be combined as appropriate.

Note that what is described (or part thereof) in an embodiment can be applied to, combined with, or replaced with another content (or part thereof) in the same embodiment and/or what is described (or part thereof) in another embodiment or other embodiments.

Note that in each embodiment, a content described in the embodiment is a content described with reference to a variety of diagrams or a content described with a text described in this specification.

Note that by combining a diagram (or part thereof) illustrated in one embodiment with another part of the diagram, a different diagram (or part thereof) illustrated in the embodiment, and/or a diagram (or part thereof) illustrated in one or a plurality of different embodiments, much more diagrams can be formed.

<Notes on Ordinal Numbers>

In this specification and the like, ordinal numbers such as first, second, and third are used in order to avoid confusion among components. Thus, the terms do not limit the number or order of components. In the present specification and the like, a "first" component in one embodiment can be referred to as a "second" component in other embodiments or claims. Furthermore, in the present specification and the like, a "first" component in one embodiment can be referred to without the ordinal number in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, terms for explaining arrangement, such as over and under, are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.

In the drawings, the same components, components having similar functions, components formed of the same material, or components formed at the same time are denoted by the same reference numerals in some cases, and the description thereof is not repeated in some cases.

<Notes on Expressions that can be Rephrased>

In this specification and the like, in describing connections of a transistor, expressions "one of a source and a drain" (or a first electrode or a first terminal) and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal. In this specification and the like, in the case where a transistor has two or more gates (such a structure is referred to as a dual-gate structure in some cases), these gates are referred to as a first gate and a second gate or a front gate and a back gate in some cases. In particular, the term "front gate" can be replaced with a simple term "gate." Note that a "bottom gate" is a terminal that is formed before a channel formation region in manufacture of a transistor, and a "top gate" is a terminal that is formed after a channel formation region in manufacture of a transistor.

A transistor has three terminals: a gate, a source, and a drain. The gate is a terminal which functions as a control terminal for controlling the conducting/non-conducting state of the transistor. Functions of input/output terminals of the transistor depend on the type and the levels of potentials applied to the terminals, and one of the two terminals serves as a source and the other serves as a drain. Therefore, in this specification and the like, the terms "source" and "drain" can be used to denote the drain and the source, respectively. In this specification and the like, the two terminals other than the gate may also be referred to as a first terminal and a second terminal, a third terminal and a fourth terminal, or the like.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film," "layer," and the like can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer." For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring," "signal line," "power supply line," and the like can be interchanged with each other depending on circumstances or conditions. For example, the term "wiring" can be changed into the term such as "signal line" or "power supply line" in some cases. The term such as "signal line" or "power supply line" can be changed into the term "wiring" in some cases. The term such as "power supply line" can be changed into the term such as "signal line" in some cases. The term such as "signal line" can be changed into the term such as "power supply line" in some cases. The term "potential" that is applied to a wiring can be changed into the term "signal" or the like depending on circumstances or conditions. Inversely, the term "signal" or the like can be changed into the term "potential" in some cases.

<Notes on Definitions of Terms>

The following are definitions of the terms mentioned in the above embodiments.

<<Semiconductor>>

In this specification, a "semiconductor" may have the characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes the characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (included in water), lithium, sodium, silicon, boron, phosphorus, carbon, and nitrogen.

In the case of an oxide semiconductor, oxygen vacancies may be formed by entry of impurities such as hydrogen. Furthermore, when the semiconductor is a silicon layer, examples of an impurity which changes the characteristics of the semiconductor include oxygen, Group 1 elements except hydrogen, Group 2 elements, Group 13elements, and Group 15 elements.

<<Transistor>>

In this specification, a transistor is an element having at least three terminals of a gate, a drain, and a source. The transistor includes a channel formation region between the drain (a drain terminal, a drain region, or a drain electrode) and the source (a source terminal, a source region, or a source electrode) and current can flow through the drain, the channel formation region, and the source. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is in a conducting state (on state) or in a non-conducting state (off state) to determine whether current flows therethrough or not. Alternatively, a switch has a function of selecting and changing a current path.

For example, an electrical switch, a mechanical switch, or the like can be used as a switch. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, a "conducting state" of the transistor refers to a state in which a source electrode and a drain electrode of the transistor are electrically short-circuited. Furthermore, a "non-conducting state" of the transistor refers to a state in which the source electrode and the drain electrode of the transistor are electrically disconnected. In the case where a transistor operates just as a switch, the polarity (conductivity type) of the transistor is not particularly limited to a certain type.

An example of a mechanical switch is a switch formed using a technology of micro electro mechanical systems (MEMS), such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

In one transistor, channel widths in all regions do not necessarily have the same value. In other words, a channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that a semiconductor has a known shape. Therefore, in the case where the shape of a semiconductor is unclear, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

<<High-level Potential and Low-level Potential>>

In this specification, when there is a description saying that a high-level potential is applied to a wiring, the high-level potential sometimes means at least one of the following potentials: a potential high enough to turn on an n-channel transistor with a gate connected to the wiring; and a potential high enough to turn off a p-channel transistor with a gate connected to the wiring. Thus, when high-level potentials are applied to different two or more wirings, the high-level potentials applied to the wirings may be at different levels.

In this specification, when there is a description saying that a low-level potential is applied to a wiring, the low-level potential sometimes means at least one of the following potentials: a potential low enough to turn off an n-channel transistor with a gate connected to the wiring; and a potential low enough to turn on a p-channel transistor with a gate connected to the wiring. Thus, when low-level potentials are applied to different two or more wirings, the low-level potentials applied to the wirings may be at different levels.

<<Connection>>

In this specification and the like, when it is described that X and Y are connected, the case where X and Y are electrically connected, the case where X and Y are functionally connected, and the case where X and Y are directly connected are included therein. Accordingly, a connection relation other than the predetermined connection relation, for example, a connection relation other than that shown in drawings and texts, is also allowed.

Here, X, Y, and the like each denote an object (e.g., a device, an element, a circuit, a wiring, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. Note that, for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that "X and Y are electrically connected," the description is the same as the case where it is explicitly only described that "X and Y are connected."

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial no. 2015-233147 filed with Japan Patent Office on Nov. 30, 2015, the entire contents of which are hereby incorporated by reference.

What is claimed is:
1. A signal processing circuit comprising:
a first circuit;
a second circuit;
a first wiring;
a second wiring;
a third wiring;
a fourth wiring;
a fifth wiring; and
a sixth wiring,
wherein the first circuit comprises a first terminal, a second terminal, a third terminal, a first transistor, and a second transistor,
wherein the second circuit comprises a fourth terminal, a fifth terminal, a sixth terminal, a third transistor, and a fourth transistor,
wherein each of the first transistor, the second transistor, the third transistor, and the fourth transistor comprises a first gate and a second gate,
wherein one of a source and a drain of the first transistor is electrically connected to the first terminal,
wherein one of a source and a drain of the second transistor is electrically connected to the second terminal,
wherein the other of the source and the drain of the first transistor is electrically connected to the third terminal,
wherein the other of the source and the drain of the second transistor is electrically connected to the third terminal,
wherein the first gate of the first transistor is electrically connected to the first wiring,
wherein the first gate of the second transistor is electrically connected to the second wiring,
wherein the second gate of the first transistor is electrically connected to the third wiring,
wherein the second gate of the second transistor is electrically connected to the fourth wiring,
wherein one of a source and a drain of the third transistor is electrically connected to the fourth terminal,
wherein one of a source and a drain of the fourth transistor is electrically connected to the fifth terminal, wherein the other of the source and the drain of the third transistor is electrically connected to the sixth terminal, wherein the other of the source and the drain of the fourth transistor is electrically connected to the sixth terminal, wherein the first gate of the third transistor is electrically connected to the fifth wiring, wherein the first gate of the fourth transistor is electrically connected to the sixth wiring, wherein the second gate of the third transistor is electrically connected to the fifth wiring, wherein the second gate of the fourth transistor is electrically connected to the sixth wiring, wherein the sixth terminal is electrically connected to one of the first terminal and the second terminal, wherein an inverted signal of a signal input to the second wiring is input to the first wiring, and wherein an inverted signal of a signal input to the sixth wiring is input to the fifth wiring.

2. The signal processing circuit according to claim 1, wherein the first transistor, the second transistor, the third transistor, and the fourth transistor comprise an oxide containing at least one of indium, an element M, and zinc in channel formation regions, and wherein the element M is aluminum, gallium, yttrium, or tin.

3. The signal processing circuit according to claim 1, wherein each of the first transistor and the second transistor the third transistor, and the fourth transistor has a dual-gate structure.

4. The signal processing circuit according to claim 1, wherein a potential for changing a threshold voltage of the first transistor is applied to the third wiring, and wherein a potential for changing a threshold voltage of the second transistor is applied to the fourth wiring.

5. A display device comprising:

a driver circuit portion comprising the signal processing circuit according to claim 1; and a display element operationally connected to the driver circuit portion.

6. An image sensor comprising:

a pixel block comprising a photoelectric conversion element; and a driver circuit comprising the signal processing circuit according to claim 1, wherein the driver circuit is configured to drive the pixel block.

7. A memory device comprising:

a controller chip; and a memory chip comprising:

a memory cell array;

a driver circuit; and a decoder comprising the signal processing circuit according to claim 1.

8. The memory device according to claim 7, wherein a transistor included in the driver circuit comprises an oxide containing at least one of indium, an element M and zinc in channel formation regions, and wherein the element M is aluminum, gallium, yttrium, or tin.

9. A signal processing circuit comprising:

a circuit;

a first wiring;

a second wiring;

a third wiring; and a fourth wiring, wherein the circuit comprises a first terminal, a second terminal, a third terminal, a first transistor, and a second transistor, wherein each of the first transistor and the second transistor comprises a first gate and a second gate, wherein one of a source and a drain of the first transistor is electrically connected to the first terminal, wherein one of a source and a drain of the second transistor is electrically connected to the second terminal, wherein the other of the source and the drain of the first transistor is electrically connected to the third terminal, wherein the other of the source and the drain of the second transistor is electrically connected to the third terminal, wherein the first gate of the first transistor is electrically connected to the first wiring, wherein the first gate of the second transistor is electrically connected to the second wiring, wherein the second gate of the first transistor is electrically connected to the third wiring, wherein the second gate of the second transistor is electrically connected to the fourth wiring, wherein an inverted signal of a signal input to the second wiring is input to the first wiring, wherein a potential for changing a threshold voltage of the first transistor is applied to the third wiring, and wherein a potential for changing a threshold voltage of the second transistor is applied to the fourth wiring.

10. The signal processing circuit according to claim 9, wherein each of the first transistor and the second transistor has a dual-gate structure.

11. The signal processing circuit according to claim 9, wherein the first transistor and the second transistor comprise an oxide containing at least one of indium, an element M and zinc in channel formation regions, and wherein the element M is aluminum, gallium, yttrium, or tin.

12. A display device comprising:

a driver circuit portion comprising the signal processing circuit according to claim 9; and a display element operationally connected to the driver circuit portion.

13. An image sensor comprising:

a pixel block comprising a photoelectric conversion element; and a driver circuit comprising the signal processing circuit according to claim 9, wherein the driver circuit is configured to drive the pixel block.

14. A memory device comprising:

a controller chip; and a memory chip comprising:

a memory cell array;

a driver circuit; and a decoder comprising the signal processing circuit according to claim 9.

15. The memory device according to claim 14, wherein a transistor included in the driver circuit comprises an oxide containing at least one of indium, an element M and zinc in channel formation regions, and wherein the element M is aluminum, gallium, yttrium, or tin.

16. A signal processing circuit comprising:

a first circuit; and a second circuit;

wherein each of the first circuit and the second circuit comprises:

a first terminal;
a second terminal;
a third terminal;
a first transistor; and
a second transistor,
wherein one of a source and a drain of the first transistor is electrically connected to the first terminal,
wherein one of a source and a drain of the second transistor is electrically connected to the second terminal,
wherein the other of the source and the drain of the first transistor is electrically connected to the third terminal,
wherein the other of the source and the drain of the second transistor is electrically connected to the third terminal,
wherein each of the first transistor and the second transistor comprises:
a first gate; and
a second gate,
wherein the first gate of the first transistor is electrically connected to the second gate of the first transistor,
wherein the first gate of the second transistor is electrically connected to the second gate of the second transistor,
wherein the third terminal of the second circuit is electrically connected to the first terminal of the first circuit or the second terminal of the first circuit.

17. The signal processing circuit according to claim 16, wherein each of the first transistor and the second transistor has a dual-gate structure.

18. The signal processing circuit according to claim 16, wherein the first transistor and the second transistor comprise an oxide containing at least one of indium, an element M, and zinc in channel formation regions, and
wherein the element M is aluminum, gallium, yttrium, or tin.

19. A display device comprising:
a driver circuit portion comprising the signal processing circuit according to claim 16; and
a display element operationally connected to the driver circuit portion.

20. An image sensor comprising:
a pixel block comprising a photoelectric conversion element; and
a driver circuit comprising the signal processing circuit according to claim 16,
wherein the driver circuit is configured to drive the pixel block.

21. A memory device comprising:
a controller chip; and
a memory chip comprising:
a memory cell array;
a driver circuit; and
a decoder comprising the signal processing circuit according to claim 16.

22. The memory device according to claim 21,
wherein a transistor included in the driver circuit comprises an oxide containing at least one of indium, an element M, and zinc in channel formation regions, and
wherein the element M is aluminum, gallium, yttrium, or tin.

* * * * *